(12) United States Patent
Tischler et al.

(10) Patent No.: US 8,704,448 B2
(45) Date of Patent: Apr. 22, 2014

(54) WIRING BOARDS FOR ARRAY-BASED ELECTRONIC DEVICES

(71) Applicants: Michael A. Tischler, Vancouver (CA); Paul Palfreyman, Vancouver (CA); Philippe M. Schick, Vancouver (CA); Paul Jungwirth, Burnaby (CA)

(72) Inventors: Michael A. Tischler, Vancouver (CA); Paul Palfreyman, Vancouver (CA); Philippe M. Schick, Vancouver (CA); Paul Jungwirth, Burnaby (CA)

(73) Assignee: Cooledge Lighting Inc., Burnaby (CA)

( * ) Notice: Subject to any disclaimer, the term of this patent is extended or adjusted under 35 U.S.C. 154(b) by 0 days.

(21) Appl. No.: 13/970,027

(22) Filed: Aug. 19, 2013

(65) Prior Publication Data

US 2014/0062316 A1 Mar. 6, 2014

Related U.S. Application Data

(63) Continuation-in-part of application No. 13/799,807, filed on Mar. 13, 2013.

(60) Provisional application No. 61/697,411, filed on Sep. 6, 2012.

(51) Int. Cl.
*H05B 39/00* (2006.01)
*H05B 37/02* (2006.01)
*H01J 9/24* (2006.01)

(52) U.S. Cl.
USPC .................................. 315/185 R; 315/294

(58) Field of Classification Search
None
See application file for complete search history.

(56) References Cited

U.S. PATENT DOCUMENTS

| | | | | |
|---|---|---|---|---|
| 5,597,070 A * | 1/1997 | Wu | 206/419 |
| 6,591,530 B1 * | 7/2003 | Liao | 40/714 |
| 7,460,743 B2 * | 12/2008 | Lee | 385/14 |
| 7,777,166 B2 * | 8/2010 | Roberts | 250/205 |
| 8,294,075 B2 * | 10/2012 | Roberts | 250/205 |
| 2008/0107373 A1 * | 5/2008 | Lee | 385/14 |
| 2010/0031996 A1 * | 2/2010 | Basol | 136/244 |
| 2010/0147364 A1 * | 6/2010 | Gonzalez et al. | 136/251 |
| 2012/0057239 A1 * | 3/2012 | Shiojiri et al. | 359/599 |
| 2012/0060895 A1 * | 3/2012 | Rubin et al. | 136/246 |
| 2013/0140430 A1 * | 6/2013 | Roberts | 250/205 |

* cited by examiner

*Primary Examiner* — Crystal L Hammond
(74) *Attorney, Agent, or Firm* — Bingham McCutchen LLP

(57) ABSTRACT

In accordance with certain embodiments, lighting systems include one or more lightsheets each including a plurality of strings of light-emitting elements, control elements, and power conductors for supplying power to the light-emitting elements and control elements.

29 Claims, 28 Drawing Sheets

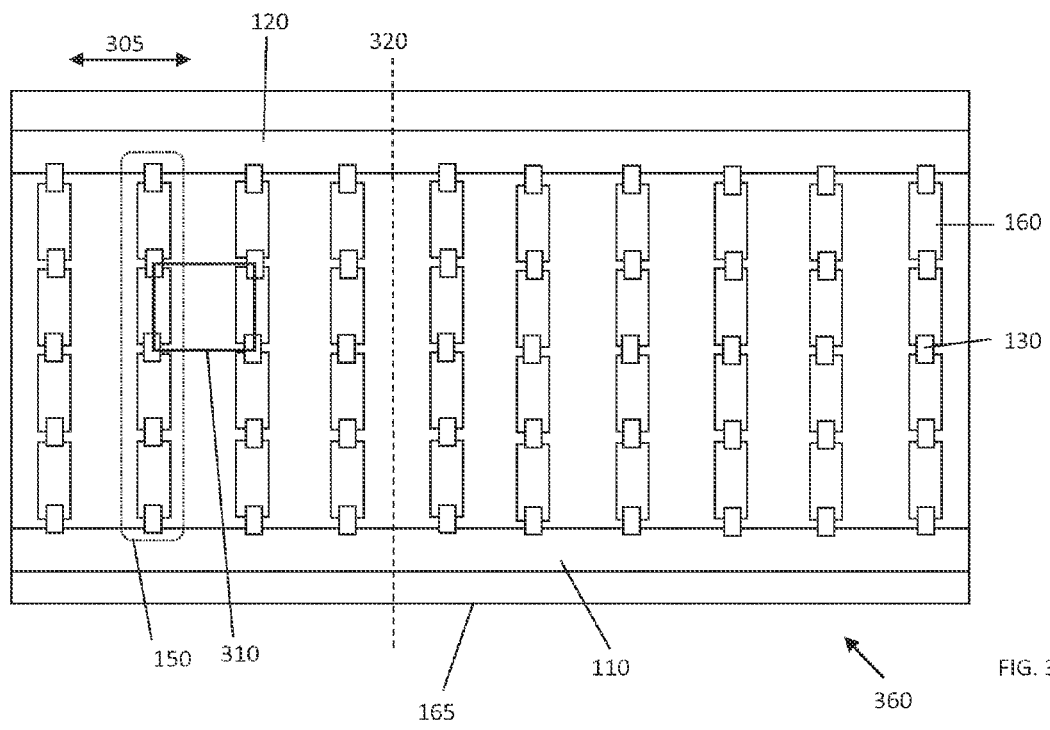
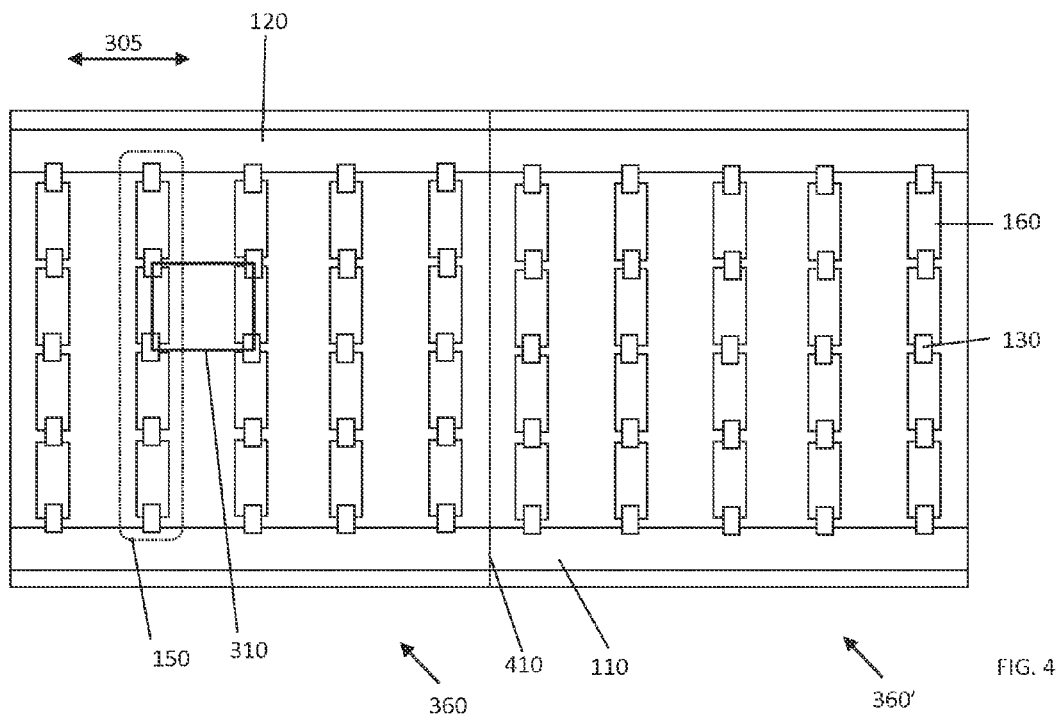

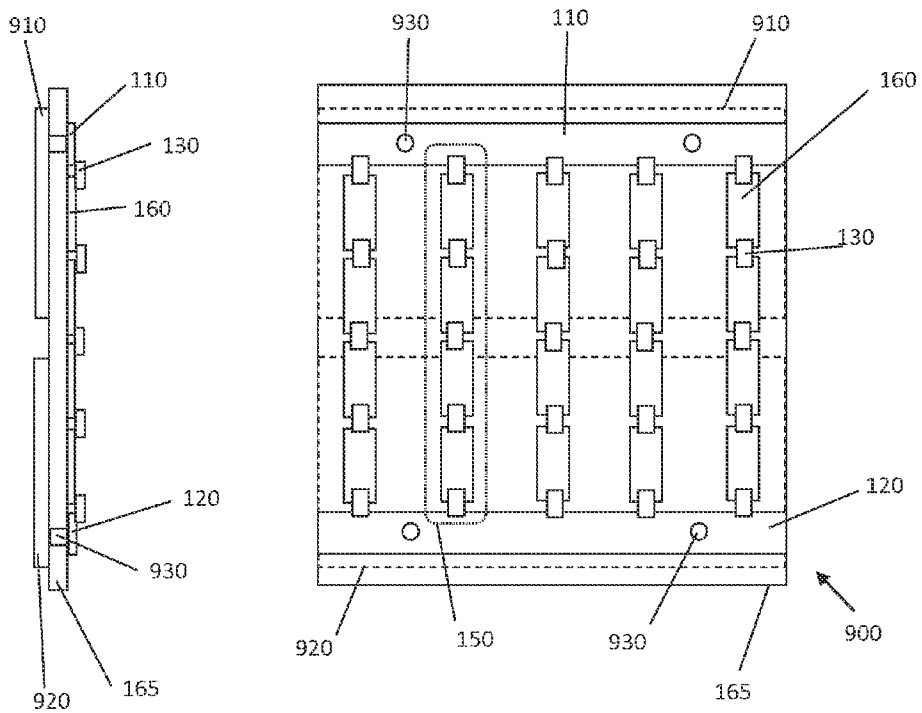
FIG. 9A
FIG. 9B
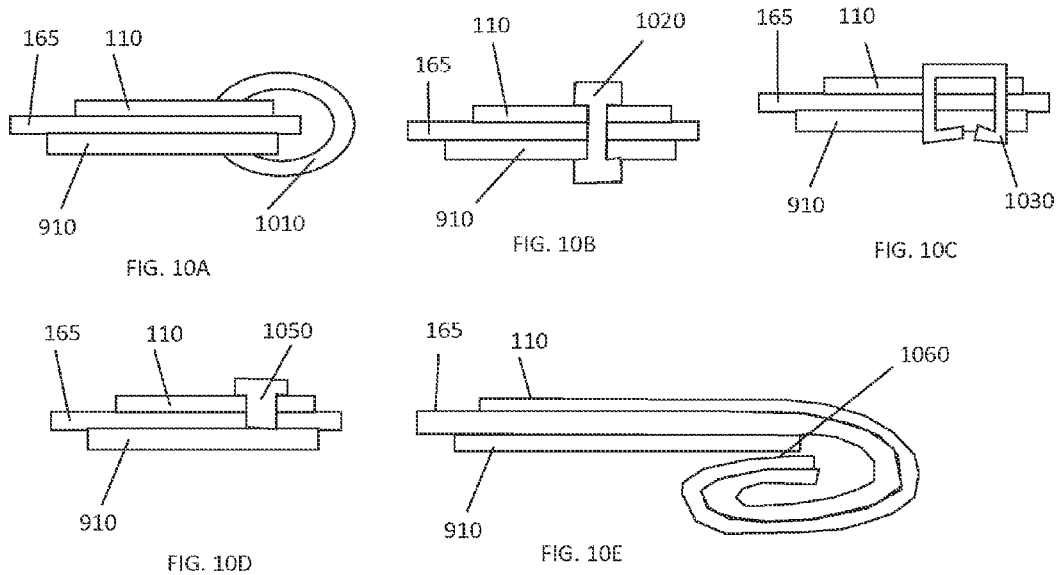
FIG. 10A
FIG. 10B
FIG. 10C
FIG. 10D
FIG. 10E

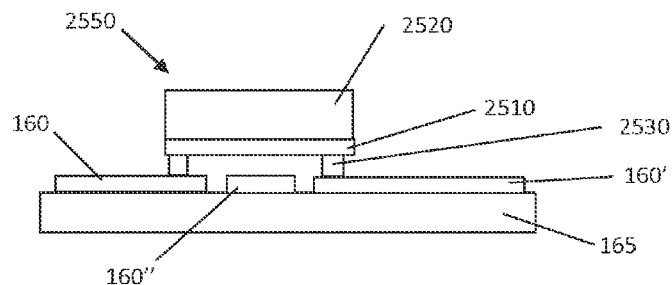
FIG. 25A
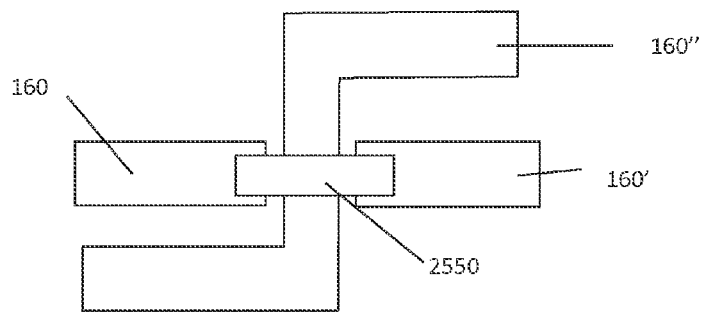
FIG. 25B
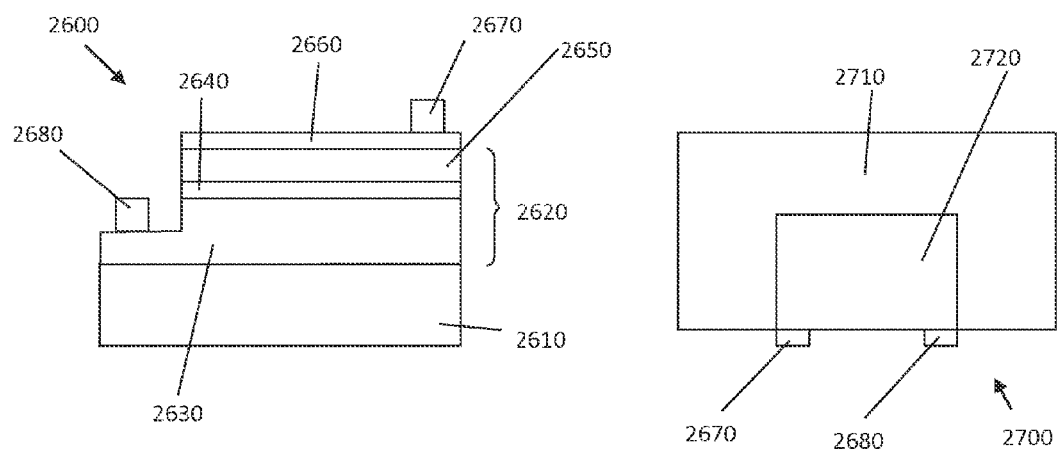
FIG. 26
FIG. 27

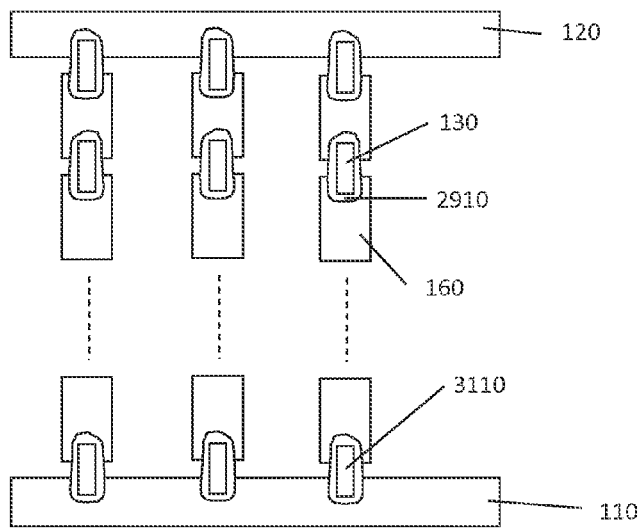
FIG.31
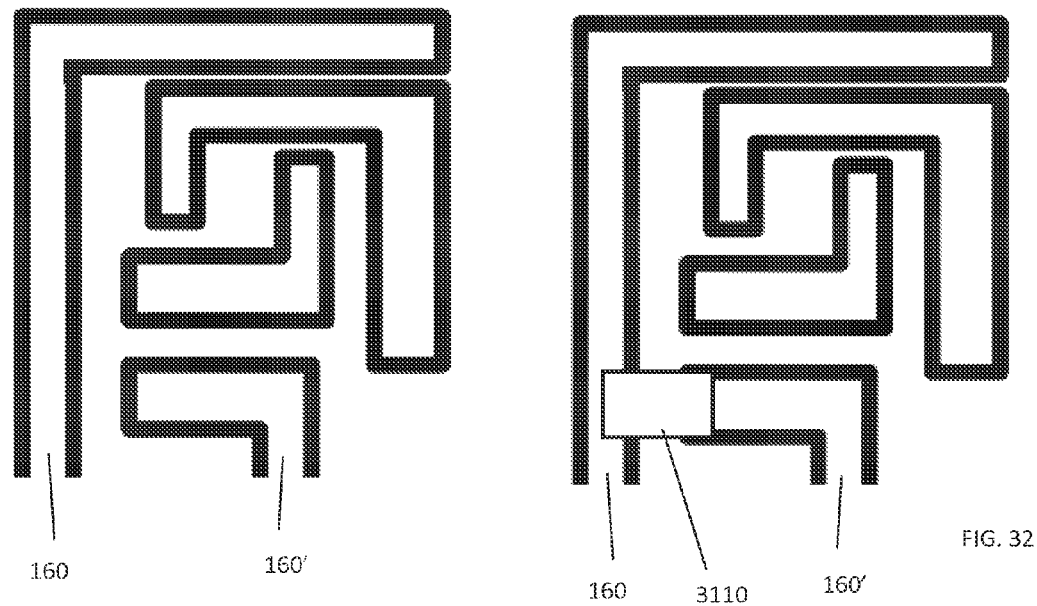
FIG. 32A
FIG. 32B

WIRING BOARDS FOR ARRAY-BASED ELECTRONIC DEVICES

RELATED APPLICATIONS

This application is a continuation-in-part of U.S. patent application Ser. No. 13/799,807, filed Mar. 13, 2013, which claims the benefit of and priority to U.S. Provisional Patent Application No. 61/697,411, filed Sep. 6, 2012, the entire disclosure of each of which is hereby incorporated herein by reference.

FIELD OF THE INVENTION

In various embodiments, the present invention generally relates to electronic devices, and more specifically to array-based electronic devices.

BACKGROUND

Light sources such as light-emitting diodes (LEDs) are an attractive alternative to incandescent and fluorescent light bulbs in illumination devices due to their higher efficiency, smaller form factor, longer lifetime, and enhanced mechanical robustness. Broad-area lighting systems such as those designed to replace fluorescent tubes must uniformly distribute the light over the emitting aperture of the lighting system. In some cases, relatively high-power LEDs are utilized in such lighting systems, but use of such LEDs typically requires additional optics or mixing chambers to spread out and/or diffuse the light, which add cost and bulk and reduce efficiency.

LED-based lighting systems based on relatively large arrays of relatively low-power LEDs may be used as an alternative to the use of smaller numbers of high-power LEDs. Such systems may use packaged or unpackaged LEDs. Some systems may be formed using a low cost plastic substrate, while others may utilize more conventional printed circuit or wiring boards, such as FR4 or metal core printed circuit board (MCPCB). These systems may feature conductive traces formed over a low-cost plastic substrate (e.g., a plastic wiring board) interconnecting a large array of packaged or unpackaged LEDs. Such systems have been described in U.S. patent application Ser. No. 13/171,973, the entire disclosure of which is incorporated herein by reference.

One potential limitation of such systems is that once the pattern is formed on the circuit board or substrate, the size of the printed area and the pitch and layout of LEDs generally cannot be changed. This is a particular limitation when utilizing high-volume manufacturing, such as roll-to-roll processing, where very large amounts of a single design or layout of a printed sheet must be processed to achieve sufficiently low cost. Thus, supporting a large number of different products having different printed sheet configurations typically requires a large number of printed sheets in inventory and a correspondingly higher manufacturing cost.

A second limitation arises from the electrical topography used in such systems, which typically features large numbers of strings of series-connected LEDs. Because of inherent variations in the forward voltage of the LEDs, as well as potential variations in the resistance of the conductive traces, one generally cannot simply connect all of the strings in parallel and expect that the current will divide equally or substantially equally among the strings. In such a system, one string may have a relatively lower string voltage, and thus a higher current will flow through the string. As more current flows through the string, the LEDs in that string will heat up, causing the LED forward voltage to decrease, resulting in a further increase in current. This results in "current-hogging" in the relatively lower-voltage strings and may result in failure of one or more LEDs in a string, which may cascade into failure of the lighting system.

Conventional LED systems utilize a constant-current driver that provides a constant current to a series-connected string of LEDs, independent of the string voltage. While such an approach works for conventional LED systems, array-based lighting systems may have tens or hundreds of strings of LEDs. Using a separate constant current driver for each string in this situation may be prohibitively expensive. Furthermore, the number of connection points to each sheet in such a scenario is generally roughly equal to the number of strings. Again, this is very costly and potentially is a source of failures that may decrease reliability. Furthermore, providing for such a large number of connections requires a relatively large amount of space or volume, making such systems difficult to install and manage.

A third limitation is related to the fabrication of larger lighting systems by tiling multiple discrete lighting units together. In addition to the cost of assembling such a system, there is often an undesirable lower light intensity, a dark space, or a different color light in the region surrounding the joints between different lighting units. Such an undesirable characteristic at the joint may, for example, be a result of the need to provide additional space between different lighting units to accommodate means for mechanically supporting the lighting units, physically connecting the lighting units, electrically connecting the lighting units, and/or connecting the lighting units to the power source.

In view of the foregoing, a need exists for systems and techniques enabling the low-cost design and manufacture of reliable array-based lighting systems capable of supporting a large number of different products and having a cost-effective drive and interconnect system, as well as the ability to make uniform and reliable large-area lighting systems at low cost.

SUMMARY

In accordance with certain embodiments, lighting systems are fabricated utilizing discrete lightsheets that may be tiled (i.e., joined along facing edges) in one or more directions. Such lightsheets typically include multiple strings of series-connected light-emitting elements (LEEs) and a control element electrically connected to each string. Advantageously, the pitch between strings and/or LEEs may be constant across single lightsheets or even across multiple joined (i.e., tiled) lightsheets, notwithstanding the joints between the lightsheets. Thus, lighting systems in accordance with embodiments of the present invention may have substantially arbitrary sizes but have a consistent appearance (e.g., luminance of emitted light) across their entire areas. The control elements may thus be present on the lightsheets within or between strings of LEEs so as not to interrupt the LEE pitch. Similarly, larger lightsheets may be segmented into smaller lightsheets (e.g., by separation between two strings of LEEs) while still maintaining full functionality of each smaller segment. Power may be supplied to the LEEs via power conductors located on, e.g., one or more edges or sides of the lightsheets, and the resistance of such conductors may be advantageously decreased via connection to larger conductive areas located on the back (i.e., the non-light-emitting side) of the lightsheets.

In some embodiments, various elements such as substrates or lightsheets are "flexible" in the sense of being pliant in response to a force and resilient, i.e., tending to elastically resume an original configuration upon removal of the force. Such elements may have a radius of curvature of about 50 cm or less, or about 20 cm or less, or about 5 cm or less, or even about 1 cm or less. In some embodiments, flexible elements have a Young's Modulus less than about $50 \times 10^9$ N/m$^2$, less than about $10 \times 10^9$ N/m$^2$, or even less than about $5 \times 10^9$ N/m$^2$. In some embodiments, flexible elements have a Shore A hardness value less than about 100; a Shore D hardness less than about 100; and/or a Rockwell hardness less than about 150.

In an aspect, embodiments of the invention feature a lighting system including or consisting essentially of a substantially planar lightsheet, first and second spaced-apart power conductors each extending in a first direction and disposed on the lightsheet, a plurality of light-emitting strings, and a plurality of control elements. Each light-emitting string (i) includes or consists essentially of a plurality of interconnected light-emitting elements spaced along the light-emitting string, (ii) has a first end electrically coupled to the first power conductor, (iii) has a second end electrically coupled to the second power conductor, and (iv) is oriented in a second direction not parallel to the first direction. The power conductors supply power to each of the light-emitting strings. Each control element is (i) electrically connected to at least one light-emitting string and (ii) configured to utilize power supplied from the power conductors to control power (e.g., supply a substantially constant current) to the light-emitting string(s) to which it is electrically connected. The lightsheet is separable, via a cut (i.e., any physical break or separation, not necessarily made by cutting) spanning the first and second power conductors and not crossing a light-emitting string, into two partial lightsheets each including or consisting essentially of (i) one or more light-emitting strings, (ii) one or more control elements, and (iii) portions of the first and second power conductors configured to supply power to and thereby illuminate the one or more light-emitting strings of the partial lightsheet.

Embodiments of the invention may include one or more of the following in any of a variety of different combinations. A power supply may be electrically connected to the power conductors and configured to provide a substantially constant voltage to the power conductors. A second lightsheet may be coupled to the lightsheet. The second lightsheet may include third and fourth spaced-apart power conductors disposed thereon, and the power supply may be configured to supply a substantially constant voltage to the third and fourth power conductors. Each light-emitting string may include or consist essentially of only 12, 16, 18, or 20 light-emitting elements. The constant voltage provided to the power conductors does not exceed approximately 60 volts. None of the light-emitting strings may extend beyond an area spanned by the first and second power conductors. None of the light-emitting strings may intersect another light-emitting string. The second direction may be substantially perpendicular to the first direction. For each light-emitting string, the light-emitting elements thereof may be spaced apart along the light-emitting string at a substantially constant light-emitting-element pitch. The light-emitting strings may be spaced apart on the lightsheet at a substantially constant string pitch. The string pitch may be an integer multiple of the light-emitting-element pitch, where the integer is greater than 1. The string pitch may be approximately equal to the light-emitting-element pitch. The lightsheet may be separable into the two partial lightsheets via a cut between any two light-emitting strings on the lightsheet. The lightsheet may be separable into more than two partial lightsheets.

Over the lightsheet, light-emitting elements may be spaced apart at a substantially constant light-emitting-element pitch maintained between light-emitting elements of different light-emitting strings. Each control element may be electrically connected to a different light-emitting string. For each light-emitting string, light-emitting elements thereof may be spaced apart at a substantially constant light-emitting-element pitch independent of a position of the control element electrically connected to the light-emitting string. Each light-emitting string may include or consist essentially of only 12, 16, 18, or 20 light-emitting elements. Each light-emitting string may include or consist essentially of only 60, 72, 84, 90, 96, 108, 126, 140, 150, 156, 160, 198, 200, 204, or 211 light-emitting elements. Each light-emitting string may include or consist essentially of only 120, 144, 168, 180, 210, or 216 light-emitting elements. Light-emitting elements of each light-emitting string may be connected in series. At least one control element may be configured to provide a substantially constant current to the at least one light-emitting string to which the control element is connected. At least one light-emitting element may emit substantially white light. At least one light-emitting element may include or consist essentially of a bare-die light-emitting diode or a packaged light-emitting diode. At least one light-emitting string may be a folded string having a straight-line length (i.e., the length of the string if all of the light-emitting elements were connected along a single straight line) longer than a dimension of the lightsheet spanned by the power conductors. The lightsheet may include a substrate on which the plurality of light-emitting strings is disposed. Each light-emitting string may include a plurality of conductive elements, disposed over the substrate, electrically connecting the plurality of light-emitting elements and the control element. A conductive adhesive, an anisotropic conductive adhesive, a wire bond, and/or solder may electrically connect the light-emitting elements to the conductive elements. The lightsheet may be flexible.

In another aspect, embodiments of the invention feature a lighting system including or consisting essentially of a substantially planar lightsheet, disposed on the lightsheet, first and second spaced-apart power conductors each extending in a first direction, a plurality of light-emitting strings, and a plurality of control elements. Each light emitting string (i) comprises a plurality of interconnected light-emitting elements spaced along the light-emitting string, (ii) has a first end electrically coupled to the first power conductor, (iii) has a second end electrically coupled to the second power conductor, and (iv) is oriented in a second direction not parallel to the first direction. The power conductors supply power to each of the light-emitting strings. Each control element is (i) electrically connected to at least one light-emitting string and (ii) configured to utilize power supplied from the power conductors to control the current to the at least one light-emitting string to which it is electrically connected. For each light-emitting string, a pitch at which the light-emitting elements are spaced is independent of a position of the control element electrically connected to the light-emitting string.

Embodiments of the invention may include one or more of the following in any of a variety of different combinations. The lightsheet may be separable, via a cut spanning the first and second power conductors and not crossing a light-emitting string, into two partial lightsheets each including or consisting essentially of (i) one or more light-emitting strings, (ii) one or more control elements, and (iii) portions of the first and second power conductors configured to supply power to and thereby illuminate the one or more light-emitting strings of the partial lightsheet. A power supply configured to provide a substantially constant voltage to the power conductors may be electrically connected to the power conductors. A second lightsheet may be coupled to the lightsheet and include third and fourth spaced-apart power conductors disposed thereon. The power supply may be configured to supply the substantially constant voltage to the third and fourth power conductors. Each light-emitting string may include or consist essentially of only 12, 16, 18, or 20 light-emitting elements. The substantially constant voltage provided to the first and second (and even the third and fourth) power conductors may not exceed approximately 60 volts. The power supply may be configured to adjust a light output of the lightsheet by pulse-width-modulating the substantially constant voltage. None of the light-emitting strings may extend beyond an area spanned by the first and second power conductors. None of the light-emitting strings may intersect another light-emitting string. The second direction may be substantially perpendicular to the first direction. For each light-emitting string, the light-emitting elements thereof may be spaced apart along the light-emitting string at a substantially constant light-emitting-element pitch. The light-emitting strings may be spaced apart on the lightsheet at a substantially constant string pitch. The string pitch may be an integer multiple of the light-emitting-element pitch, where the integer is greater than 1. The string pitch may be approximately equal to the light-emitting-element pitch. Over the lightsheet, light-emitting elements may be spaced apart at a substantially constant light-emitting-element pitch maintained between light-emitting elements of different light-emitting strings. Each control element may be electrically connected to a different light-emitting string. For each light-emitting string, light-emitting elements thereof may be spaced apart at a substantially constant light-emitting-element pitch independent of a position of the control element electrically connected to the light-emitting string.

Each light-emitting string may include or consist essentially of only 12, 16, 18, or light-emitting elements. Each light-emitting string may include or consist essentially of only 60, 72, 84, 90, 96, 108, 126, 140, 150, 156, 160, 198, 200, 204, or 211 light-emitting elements. Each light-emitting string may include or consist essentially of only 120, 144, 168, 180, 210, or 216 light-emitting elements. Light-emitting elements of each light-emitting string may be connected in series. At least one control element may be configured to provide a substantially constant current to the at least one light-emitting string to which the control element is connected. At least one light-emitting element may emit substantially white light. At least one light-emitting element may include or consist essentially of a bare-die light-emitting diode or a packaged light-emitting diode. At least one light-emitting string may be a folded string having a straight-line length longer than a dimension of the lightsheet spanned by the power conductors. The light-emitting elements of the folded string may have a positive terminal and a negative terminal, and all of the positive terminals may be oriented toward a single edge of the lightsheet notwithstanding folds in the folded string. The lightsheet may include a substrate on which the plurality of light-emitting strings is disposed and each light-emitting string may include a plurality of conductive elements, disposed over the substrate, electrically connecting the plurality of light-emitting elements and at least one the control element. A conductive adhesive, an anisotropic conductive adhesive, a wire bond, and/or solder may electrically connect the light-emitting elements to the conductive elements. The substrate may include or consist essentially of polyethylene terephthalate, polyethylene naphthalate, polycarbonate, polyethersulfone, polyester, polyimide, polyethylene, fiberglass, metal core printed circuit board, and/or paper. The conductive elements may include or consist essentially of aluminum, chromium, copper, gold, carbon, silver, carbon ink, and/or silver ink. An insulating layer may be disposed over at least portions of some of the conductive elements. The insulating layer may include or consist essentially of an insulating ink.

The lightsheet may be flexible. At least one control element may include or consist essentially of a plurality of active and/or passive circuit elements. At least one control element may include or consist essentially of (i) one or more resistors and/or (ii) one or more transistors. At least one control element may include or consist essentially of an integrated circuit, e.g., a packaged integrated circuit or a bare-die integrated circuit. Each control element may be electrically connected to only one light-emitting string. The system may include one or more additional lightsheets each having a tiling direction, and the lightsheet and the one or more additional lightsheets may be connected to each other in the tiling direction at interfaces therebetween. A pitch of light-emitting elements may be substantially constant across the lightsheet and the one or more additional lightsheets notwithstanding the interfaces. The lightsheet and the one or more additional lightsheets may be electrically connected in series or in parallel. Each control element may be electrically connected to a different light-emitting string, and a voltage across each of the plurality of light-emitting strings may be at least equal to a sum of a voltage drop across the plurality of light-emitting elements in one string and a voltage drop across the control element electrically connected to the one string. At least one control element may be configured to control an optical characteristic of the light-emitting elements of the at least one string to which it is electrically connected. The optical characteristic may include or consist essentially of chromaticity, color temperature, intensity, color rendering index, spectral power distribution, and/or spatial light distribution pattern. At least one control element may be configured to control the optical characteristic by selectively de-energizing various ones of the light-emitting strings, thereby dimming a light output from the lightsheet, without altering a drive current supplied to the remaining light-emitting strings. At least one first light-emitting string may emit light having a chromaticity, color temperature, intensity, efficiency, color rendering index, or spectral light distribution different from a chromaticity, color temperature, intensity, efficiency, color rendering index, spectral power distribution, or spatial light distribution of at least one second light-emitting string.

The plurality of light-emitting strings may include or consist essentially of (i) a first group of one or more light-emitting strings and (ii) a second group of one or more light-emitting strings different from the first group. The at least one control element may be configured to control the optical characteristic by activating the first group and deactivating the second group to produce light having a first chromaticity, color temperature, intensity, efficiency, color rendering index, spectral power distribution, or spatial light distribution, and activating the second group and deactivating the first group to produce light having a second chromaticity, color temperature, intensity, efficiency, color rendering index, spectral power distribution, or spatial light distribution different from the first chromaticity, color temperature, intensity, efficiency, color rendering index, spectral power distribution, or spatial light distribution. The plurality of light-emitting strings may include or consist essentially of a first group of one or more light-emitting strings and, associated with at least one of the light-emitting elements of the first group, a first optical element of a first type. The plurality of light-emitting strings may include or consist essentially of a second group, different from the first group, of one or more light-emitting strings and, associated with at least one of the light-emitting elements of the second group, a second optical element of a second type different from the first type. The at least one control element may be configured to control the optical characteristic by activating the first group and deactivating the second group to produce light having a first chromaticity, color temperature, intensity, efficiency, color rendering index, spectral power distribution, or spatial light distribution, and activating the second group and deactivating the first group to produce light having a second chromaticity, color temperature, intensity, efficiency, color rendering index, spectral power distribution, or spatial light distribution different from the first chromaticity, color temperature, intensity, efficiency, color rendering index, spectral power distribution, or spatial light distribution.

The plurality of light-emitting strings may include or consist essentially of a first group of one or more light-emitting strings and, associated with at least one of the light-emitting elements of the first group, a first light-conversion material having a first optical characteristic. The plurality of light-emitting strings may include or consist essentially of a second group, different from the first group, of one or more light-emitting strings and, associated with at least one of the light-emitting elements of the second group, a second light-conversion material having a second optical characteristic different from the first optical characteristic. The at least one control element may be configured to control the optical characteristic by activating the first group and deactivating the second group to produce light having a first chromaticity, color temperature, intensity, efficiency, color rendering index, spectral power distribution, or spatial light distribution, and activating the second group and deactivating the first group to produce light having a second chromaticity, color temperature, intensity, efficiency, color rendering index, spectral power distribution, or spatial light distribution different from the first chromaticity, color temperature, intensity, efficiency, color rendering index, spectral power distribution, or spatial light distribution. The plurality of light-emitting strings may include or consist essentially of (i) a first group of one or more light-emitting strings, and (ii) a second group of one or more light-emitting strings different from the first group. The at least one control element may be configured to control the optical characteristic by selectively controlling the first and second groups to produce a first light having a chromaticity, color temperature, intensity, efficiency, color rendering index, spectral power distribution, or spatial light distribution. The at least one control element may be configured to control the optical characteristic by selectively controlling the first and second groups to produce a second light having a chromaticity, color temperature, intensity, efficiency, color rendering index, spectral power distribution, or spatial light distribution, different from the first light. The plurality of light-emitting strings may include or consist essentially of a first group of one or more light-emitting strings and, associated with at least one of the light-emitting elements of the first group, a first optical element of a first type. The plurality of light-emitting strings may include or consist essentially of a second group, different from the first group, of one or more light-emitting strings and, associated with at least one of the light-emitting elements of the second group, a second optical element of a second type different from the first type. The at least one control element may be configured to control the optical characteristic by selectively controlling the first and second groups to produce a first light having a first chromaticity, color temperature, intensity, efficiency, color rendering index, spectral power distribution, or spatial light distribution. The at least one control element may be configured to control the optical characteristic by selectively controlling the first and second groups to produce a second light having a chromaticity, color temperature, intensity, efficiency, color rendering index, spectral light distribution, or spatial light distribution, different from the first light.

The plurality of light-emitting strings may include or consist essentially of a first group of one or more light-emitting strings and, associated with at least one of the light-emitting elements of the first group, a first light-conversion material having a first optical characteristic. The plurality of light-emitting strings may include or consist essentially of a second group, different from the first group, of one or more light-emitting strings and, associated with at least one of the light-emitting elements of the second group, a second light-conversion material having a second optical characteristic different from the first optical characteristic. The at least one control element may be configured to control the optical characteristic by selectively controlling the first and second groups to produce a first light having a first chromaticity, color temperature, intensity, efficiency, color rendering index, spectral power distribution, or spatial light distribution. The at least one control element may be configured to control the optical characteristic by selectively controlling the first and second groups to produce a second light having a chromaticity, color temperature, intensity, efficiency, color rendering index, spectral power distribution, or spatial light distribution, different from the first light.

An array of optical elements may each be associated with at least one light-emitting element, and the array of optical elements may focus and/or shape light from the light-emitting elements to a desired illumination pattern. At least one optical element may be optically coupled to the at least one light-emitting element with no interface to air therebetween. Within one of the light-emitting strings, at least a first light-emitting element may be associated with an optical element of a first type, and at least a second light-emitting element may be associated with an optical element of a second type different from the first type. At least one light-emitting element within a first light-emitting string may be associated with an optical element of a first type, and at least one light-emitting element within a second light-emitting string, different from the first light-emitting string, may be associated with an optical element of a second type different from the first type. At least one light-emitting element may include or consist essentially of an LED and a light-conversion material disposed thereon. A conductive layer electrically connected to the first and second power conductors may be disposed on a back side of the lightsheet opposite a front side of the lightsheet on which the strings are disposed. The conductive layer disposed on the back side of a lightsheet may be electrically connected to the first and second power conductors by one or more vias (i.e., that extend through a thickness of the lightsheet). An insulating layer may be disposed over at least a portion of the conductive layer disposed on the back side of the lightsheet. The lightsheet may include at least 200 light-emitting elements. At least one light-emitting element may include or consist essentially of one or more semiconductor materials. The one or more semiconductor materials may include or consist essentially of silicon, InAs, AlAs, GaAs, InP, AlP, GaP, InSb, GaSb, AlSb, GaN, AlN, InN, and/or mixtures or alloys thereof. The at least one light-emitting element may be a III-nitride-based LED. At least one light-emitting element may be associated with a light-conversion material. All or a portion of the lightsheet may be reflective to a range of wavelengths of light emitted by the at least one light-emitting element and/or a range of wavelengths of light emitted by the light-conversion material. The at least one light-emitting element may include or consist essentially of a light-emitting diode. The light-conversion material may include or consist essentially of at least one phosphor. The light-conversion material may include or consist essentially of a binder and a phosphor. The binder may have an index of refraction between about 1.3 and about 1.7.

At least a first light-emitting element may be associated with a first light-conversion material and (ii) at least a second light-emitting element, different from the first light-emitting element, may be associated with a second light-conversion material different from the first light-conversion material. Within one of the light-emitting strings, (i) at least a first light-emitting element may be associated with a first light-conversion material and (ii) at least a second light-emitting element, different from the first light-emitting element, may be associated with a second light-conversion material different from the first light-conversion material. At least one light-emitting element within a first light-emitting string may be associated with a first light-conversion material, and at least one light-emitting element within a second light-emitting string, different from the first light-emitting string, may be associated with a second light-conversion material different from the first light-conversion material. One of the plurality of light-emitting strings may emit radiation with a first chromaticity and another one of the plurality of light-emitting strings may emit radiation with a second chromaticity different from the first chromaticity. Within one of the light-emitting strings, one of the light-emitting elements may emit radiation with a first chromaticity and another one of the light-emitting elements may emit radiation with a second chromaticity different from the first chromaticity. The lightsheet may have a length of at least 0.1 meter, at least 0.5 meters, or at least 3 meters. The lightsheet may include at least 200, or at least 500, light-emitting elements. The lightsheet may include at least 10, or at least 50, light-emitting strings.

The system may include a power connector for connecting a lightsheet to another lightsheet or to a source of electrical power. The power connector may include or consist essentially of at least one crimp connector. Each light-emitting element may include a substrate that is substantially transparent to a range of wavelengths of light emitted by the light-emitting element. The light-emitting elements of at least one first light-emitting string may be substantially identical to the light-emitting elements of at least one second light-emitting string different from the at least one first light-emitting string. At least one light-emitting string may emit substantially white light and at least one light-emitting string emits red light. A carrier may at least partially support the lightsheet and include or consist essentially of glass, polymer, and/or metal.

At least one control element, or even all of the control elements, may be configured to transmit or receive a control signal. All of the control elements may be configured to transmit or receive the same control signal. At least one of the control elements, or even each of the control elements, may be configured to individually transmit or receive a control signal. At least one control conductor may be configured provide a control signal to at least one control element. At least one control element may be configured to accept a control signal comprising at least one of radio waves, microwaves, sound waves, infrared light, visible light and ultraviolet light, or ultrasound. At least one control element may be configured to accept a control signal including or consisting essentially of an electromagnetic carrier. At least one power conductor may be configured to provide a control signal to at least one control element.

In a further aspect, embodiments of the invention feature a lighting system that includes or consists essentially of a substantially planar lightsheet, disposed on the lightsheet, first and second spaced-apart power conductors each extending in a first direction, a plurality of light-emitting strings, and a plurality of control elements. Each light-emitting string (i) includes a plurality of interconnected light-emitting diodes (LEDs) spaced along the light-emitting string, (ii) has a first end electrically coupled to the first power conductor, (iii) has a second end electrically coupled to the second power conductor, and (iv) is oriented in a second direction not parallel to the first direction. The power conductors supply power to each of the light-emitting strings and at least one light-emitting string emits white light. Each control element (i) is electrically connected to at least one light-emitting string, (ii) is configured to utilize power supplied from the power conductors to supply a substantially constant current to the at least one light-emitting string to which it is electrically connected, and (iii) includes or consists essentially of one or more resistors and one or more transistors. The lightsheet is separable, via a cut spanning the first and second power conductors and not crossing a light-emitting string, into two partial lightsheets each including or consisting essentially of (i) one or more light-emitting strings, (ii) one or more control elements, and (iii) portions of the first and second power conductors configured to supply power to and thereby illuminate the one or more light-emitting strings of the partial lightsheet. For each light-emitting string, a pitch at which the LEDs are spaced is (i) substantially constant and (ii) independent of a position of the control element electrically connected to the light-emitting string.

Embodiments of the invention may include one or more of the following in any of a variety of different combinations. At least one of the LEDs may be a packaged LED. The lightsheet may include a substrate on which the plurality of light-emitting strings is disposed. Each light-emitting string may include a plurality of conductive elements, disposed over the substrate, electrically connecting the plurality of light-emitting elements. An insulating layer may be disposed over at least portions of some of the conductive elements. At least one control element may include or consist essentially of an integrated circuit. At least one control element may be configured to control an optical characteristic of the LEDs of the at least one string to which it is electrically connected. The optical characteristic may include or consist essentially of chromaticity, color temperature, intensity, color rendering index, spectral power distribution, and/or spatial light distribution pattern. At least one light-emitting string may be a folded string having a straight-line length longer than a dimension of the lightsheet spanned by the power conductors. The system may include one or more additional lightsheets each having a tiling direction, and the lightsheet and the one or more additional lightsheets may be connected to each other in the tiling direction at interfaces therebetween. One of the plurality of light-emitting strings may emit radiation with a first chromaticity and another one of the plurality of light-emitting strings may emit radiation with a second chromaticity different from the first chromaticity.

In a further aspect, embodiments of the invention feature a lighting system including or consisting essentially of a lightsheet. The lightsheet includes or consists essentially of a substantially planar flexible substrate, and disposed on the substrate, (i) first and second spaced-apart power conductors each extending in a first direction and (ii) a plurality of conductive traces. The lighting system includes a plurality of light-emitting strings, each light-emitting string (i) comprising a plurality of interconnected light-emitting elements spaced along the light-emitting string, (ii) having a first end electrically coupled to the first power conductor, (iii) having a second end electrically coupled to the second power conductor, and (iv) being oriented in a second direction not parallel to the first direction, where the power conductors supply power to each of the light-emitting strings. The lighting system includes a plurality of control elements each (i) electrically connected to at least one light-emitting string and (ii) configured to utilize power supplied from the power conductors to control the current to the at least one light-emitting string to which it is electrically connected. The lightsheet has a thickness less than 2 mm and has a weight per area of less than 1000 gm/m$^2$. The lightsheet is separable, via a cut (which may be substantially perpendicular to the first and second power conductors) spanning the first and second power conductors and not crossing a light-emitting string, into two partial lightsheets each comprising (i) one or more light-emitting strings, (ii) one or more control elements, and (iii) portions of the first and second power conductors configured to supply power to and thereby illuminate the one or more light-emitting strings of the partial lightsheet.

Embodiments of the invention may include one or more of the following in any of a variety of different combinations. The weight per area of the lightsheet may be less than 500 gm/m$^2$, less than 200 gm/m$^2$, less than 100 gm/m$^2$, or less than 50 gm/m$^2$. The thickness of the lightsheet may be less than 1 mm. The lighting system may include an optical element disposed above (and/or connected or fastened to) and spaced apart from the lightsheet. The collective thickness of the optical element and the lightsheet may be less than 40 mm, less than 20 mm, or less than 10 mm. The light-emitting elements in each of the light-emitting strings may be separated by a substantially constant pitch. The light-emitting elements may be separated by a substantially constant pitch between different strings, and this pitch may be substantially equal to the pitch separating light-emitting elements within the light-emitting strings. At least one light-emitting element may emit substantially white light. At least one light-emitting element may include or consist essentially of a bare-die light-emitting diode. At least one light-emitting element may include or consist essentially of a packaged light-emitting diode. A power supply configured to provide a substantially constant voltage to the power conductors may be electrically connected to the power conductors.

In at least one light-emitting string, at least one (or even each) light-emitting element is coupled to conductive traces on the substrate via a solder. The solder may include or consist essentially of bismuth and/or indium. The solder may have a liquidus temperature less than 165° C., less than 150° C., or less than 130° C. The solder may include or consist essentially of 50% to 65% bismuth and 35% to 50% tin. The solder may include 0.25% to 3% silver. The solder may include or consist essentially of 20% to 40% bismuth, 40% to 60% indium, and 8% to 25% tin. The lightsheet may be flexible. A conductive joint may electrically couple two discrete regions of the lightsheet at a joint region. The flexibility of the lightsheet at the joint region (and proximate the conductive joint) may be approximately equal to the flexibility of the lightsheet at a region spaced away from the joint region. The conductive joint may include or consist essentially of solder. The conductive joint may electrically couple (a) portions of the first power conductor on each region of the lightsheet or (b) portions of the second power conductor on each region of the lightsheet. The conductive joint may be flexible. The conductive joint may include at least one undulation therewithin. The conductive traces may include or consist essentially of copper, brass, aluminum, silver, and/or gold. The thickness of the conductive traces may be less than 50 µm and the lightsheet may include or consist essentially of polyethylene terephthalate. The thickness of the lightsheet may be less than 100 µm.

In another aspect, embodiments of the invention feature a lighting system including or consisting essentially of a lightsheet. The lightsheet includes or consists essentially of a substantially planar flexible substrate (i) including or consisting essentially of polyethylene terephthalate and (ii) having a thickness less than 100 µm. Disposed on the substrate are first and second spaced-apart power conductors each (i) extending in a first direction, (ii) including or consisting essentially of aluminum and/or copper, and (iii) having a thickness less than 50 µm. Disposed on the substrate are a plurality of conductive traces each (i) including or consisting essentially of aluminum and/or copper, and (ii) having a thickness less than 50 µm. The lighting system includes a plurality of light-emitting strings, each light-emitting string (i) comprising, spaced along the light-emitting string, a plurality of interconnected light-emitting diodes each emitting substantially white light, (ii) having a first end electrically coupled to the first power conductor, (iii) having a second end electrically coupled to the second power conductor, and (iv) being oriented in a second direction not parallel (e.g., perpendicular) to the first direction, where the power conductors supply power to each of the light-emitting strings. The lighting system includes a plurality of control elements each (i) electrically connected to at least one light-emitting string and (ii) configured to utilize power supplied from the power conductors to control the current to the at least one light-emitting string to which it is electrically connected. The lightsheet has a thickness less than 1.5 mm and has a weight per area of less than 400 µm/m$^2$. The lightsheet is separable, via a cut (which may be substantially perpendicular to the first and second power conductors) spanning the first and second power conductors and not crossing a light-emitting string, into two partial lightsheets each comprising (i) one or more light-emitting strings, (ii) one or more control elements, and (iii) portions of the first and second power conductors configured to supply power to and thereby illuminate the one or more light-emitting strings of the partial lightsheet.

These and other objects, along with advantages and features of the invention, will become more apparent through reference to the following description, the accompanying drawings, and the claims. Furthermore, it is to be understood that the features of the various embodiments described herein are not mutually exclusive and can exist in various combinations and permutations. Reference throughout this specification to "one example," "an example," "one embodiment," or "an embodiment" means that a particular feature, structure, or characteristic described in connection with the example is included in at least one example of the present technology. Thus, the occurrences of the phrases "in one example," "in an example," "one embodiment," or "an embodiment" in various places throughout this specification are not necessarily all referring to the same example. Furthermore, the particular features, structures, routines, steps, or characteristics may be combined in any suitable manner in one or more examples of the technology. As used herein, the terms "about," "approximately," and "substantially" mean ±10%, and in some embodiments, ±5%. The term "consists essentially of" means excluding other materials that contribute to function, unless otherwise defined herein. Nonetheless, such other materials may be present, collectively or individually, in trace amounts.

Herein, two components such as light-emitting elements and/or optical elements being "aligned" or "associated" with each other may refer to such components being mechanically and/or optically aligned. By "mechanically aligned" is meant coaxial or situated along a parallel axis. By "optically aligned" is meant that at least some light (or other electromagnetic signal) emitted by or passing through one component passes through and/or is emitted by the other.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3 and 4 are schematic plan views of lighting systems in accordance with various embodiments of the invention;

FIGS. 9A and 9B are a schematic cross-section and plan view, respectively, of a lighting system in accordance with various embodiments of the invention;

FIGS. 10A-10E are schematic illustrations of vias in a lighting system in accordance with various embodiments of the invention;

FIGS. 25A and 25B are schematic illustrations of an element of a lighting system in accordance with various embodiments of the invention;

FIG. 26 is a schematic cross-section of a light-emitting element in accordance with various embodiments of the invention;

FIGS. 27 and 28 are schematic cross-sections of light-emitting elements integrated with phosphor materials in accordance with various embodiments of the invention;

FIGS. 31, 32A-32D, and 33 are schematic illustrations of lighting systems featuring control elements in accordance with various embodiments of the invention;

DETAILED DESCRIPTION

Figure 1A:
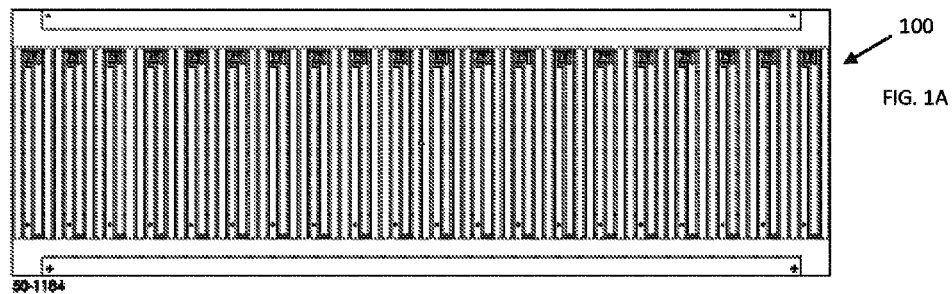
FIGS. 1A and 1B are schematic plan views of lighting systems in accordance with various embodiments of the invention.
Figure 1B:
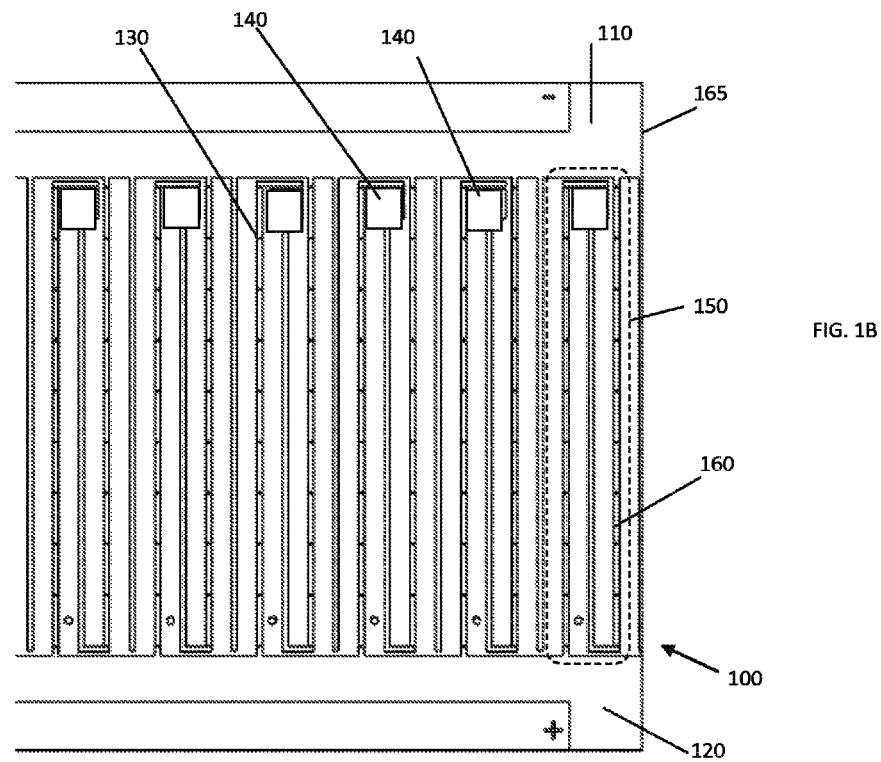

FIGS. 1A-1B are schematic drawings of an electronic device (or "lightsheet") 100 in accordance with embodiments of the present invention. For convenience purposes, the "width" of electronic device 100 refers to the short side of the rectangle while the "length" refers to the long side of the rectangle. While electronic device 100 is shown as a rectangle, this is not a limitation of the present invention, and in other embodiments electronic device 100 may be square, circular, or have any other shape. In various embodiments, the shape of electronic device 100 is engineered such that it may be tiled in one or more directions (as detailed below). In some embodiments, the lightsheet may have a width in the range of about 1 inch to about 24 inches and a length in the range of about 1 inch to about 50 feet; however, this is not a limitation of the present invention, and in other embodiments the length and/or width of the lightsheet may have any values.

Referring to FIG. 1B, lightsheet 100 features an array of light-emitting elements (LEEs) 130 each electrically coupled between conductive traces 160, and power conductors 110 and 120 providing power to conductive traces 160 and control elements (CEs) 140, all of which are disposed over a substrate 165. As utilized herein, a "wiring board" refers to a substrate for LEEs with or without additional elements such as conductive traces or CEs. A wiring board may also be referred to as a substrate or a circuit board. FIG. 1B shows an enlarged portion of lightsheet 100. In the exemplary embodiment depicted in FIG. 1B, power conductors 110, 120 are spaced apart from each other and light-emitting strings (or simply "strings") 150 are connected in parallel across power conductors 110, 120. In some embodiments, for example as shown in FIG. 1B, strings 150 do not cross (i.e., intersect) each other. In other words, power conductors 110, 120 are oriented in one direction and strings 150 are oriented such that they span power conductors 110, 120 in a different direction. As shown in FIG. 1B, strings 150 are substantially perpendicular to power conductors 110, 120. However, this is not a limitation of the present invention, and in other embodiments, for example as shown in FIGS. 5C-5E, at least some segments (i.e., portions connecting two or more LEEs 130), or even the entire strings 150, generally define a line that is not perpendicular to power conductors 110, 120 yet is (at least for an entire string 150) not parallel to power conductors 110, 120. Notably, in the examples shown in FIGS. 5C-5E, strings 150 are still non-intersecting and do not cross each other. However, this is not a limitation of the present invention, and in other embodiments strings 150 may intersect, for example one string 150 splitting into two or more strings 150, or two or more strings 150 joining to form a reduced number of strings 150, as shown in FIGS. 5F-5G. FIGS. 5F-5G show strings 150 splitting at the joint with power conductor 120; however, this is not a limitation of the present invention, and in other embodiments strings 150 may split at the joint with power conductor 110, or strings 150 may split anywhere between LEEs 130 and/or CE 140. In some embodiments, as described herein, for example in reference to FIGS. 25A and 25B, conductive elements may cross over each other without being electrically coupled, and in some embodiments strings 150 may cross over or under each other, as shown in FIG. 5H. While the examples discussed with respect to FIGS. 5A-5H show LEEs 130 and strings 150 between power conductors 110, 120 this is not a limitation of the present invention and in other embodiments all or a portion of one or more strings 150 may be outside of power conductors 110, 120. For example FIG. 5I shows a portion of string 150 extending beyond power conductors 110, 120.

As shown, LEEs 130 are positioned across substrate 165 in a regular periodic array, although this is not a limitation of the present invention and in other embodiments LEEs 130 may occupy any positions on lightsheet 100. Power conductors 110 and 120 provide power to each LEE string, for example the string 150 encircled by the dashed line in FIG. 1B. Each LEE string 150 typically includes multiple conductive traces 160 that interconnect multiple LEEs 130, as well as one or more CEs 140, which in FIG. 1B is in series with LEEs 130. String 150 shown in FIG. 1B is a folded string, i.e., a string that has three segments electrically coupled in series but positioned as three adjacent segments. A string segment is a portion of a string spanning all or a portion of the region between power conductors 110 and 120 in FIG. 1B. In lightsheet 100, some string segments include LEEs 130 while others do not. However, in other embodiments the distribution and position of LEEs 130 along conductive elements 160 and string segments may be different. In some embodiments, a string 150 may be a straight string, that is a string with no folds (as shown schematically in FIG. 3). One end of string 150 is electrically coupled to power conductor 110, while the other end of string 150 is electrically coupled to power conductor 120. As will be discussed, the number of segments in a string 150 is not a limitation of the present invention.

FIGS. 1A and 1B illustrate three aspects in accordance with embodiments of the present invention. The first is the multiple strings 150 that are powered by the set of power conductors 110, 120. The second is the positional relationship between the locations of LEEs 130 and CE 140, which is disposed between the conductive traces 160 and between power conductors 110,120. The third is the inclusion of a CE 140 in each string of series-connected LEEs 130. Combinations of these three aspects enable electronic device 100 to be economically manufactured in very long lengths, for example in a roll-to-roll process, and cut to specified lengths, forming lightsheets, while maintaining the ability to tile, or place lightsheets adjacent to each other (e.g., in the length direction), with no or substantially no change in pitch between LEEs 130 or in the optical characteristics across the joint between two adjacent lightsheets, as discussed in more detail below.

In an exemplary embodiment, CE 140 is configured to maintain a constant or substantially constant current through LEEs 130 of string 150. For example, in some embodiments, the constant voltage applied to power conductors 110, 120 may vary, or the sum of the forward voltages of LEEs 130 in different strings may be somewhat different, for example as a result of manufacturing tolerances, or the component and/or operational values of the element(s) within CE 140 may vary, for example as a result of manufacturing tolerances or changes in operating temperature, and CE 140 acts to maintain the current through LEEs 130 substantially constant in the face of these variations. In other words, the input to the lightsheet is a constant voltage that is applied to power conductors 110, 120, and CEs 140 convert the constant voltage to a constant or substantially constant current through LEEs 130. As will be described herein, the design of CE 140 may be varied to provide different levels of control or variation of the current through LEEs 130. In some embodiments, CEs 140 may control the current through LEEs 130 to be substantially constant with a variation of less than about ±25%. In some embodiments, CEs 140 may control the current through LEEs 130 to be substantially constant with a variation of less than about ±15%. In some embodiments, CEs 140 may control the current through LEEs 130 to be substantially constant with a variation of less than about ±10%. In some embodiments, CEs 140 may control the current through LEEs 130 to be substantially constant with a variation of less than about ±5%.

In some embodiments, as detailed herein, CEs 140 may, in response to a control signal, act to maintain a constant or substantially constant current through LEEs 130 until instructed to change to a different constant or substantially constant current, for example by an external control signal. In some embodiments, as detailed herein, all CEs 140 on a sheet may act in concert, that is maintain or change the current through all associated LEEs 130; however, this is not a limitation of the present invention, and in other embodiments one or more CEs 140 may be individually instructed and/or energized.

Figure 2A:
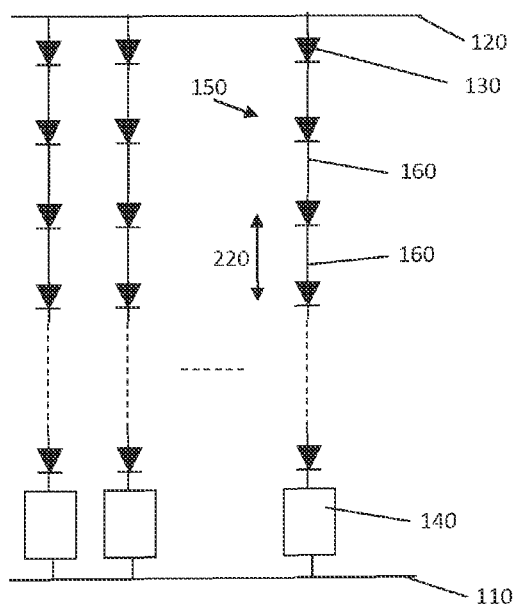
FIGS. 2A-2C are schematic illustrations of electrical configurations of lighting systems in accordance with various embodiments of the invention.
Figure 2B:
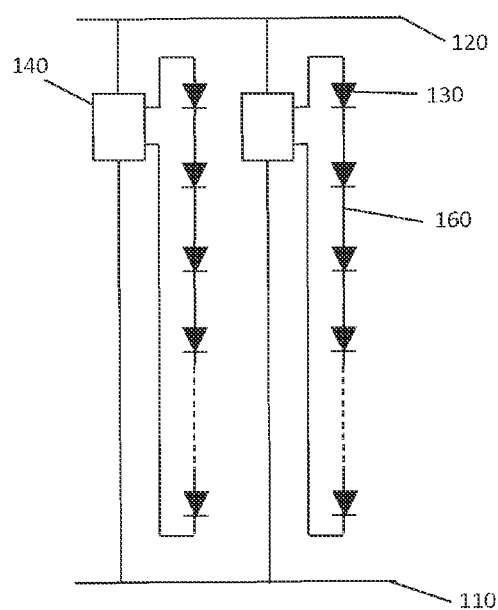
Figure 2C:
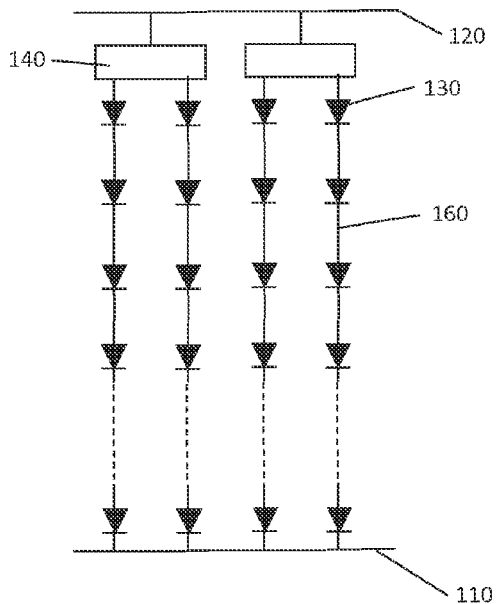

FIG. 2A depicts an exemplary circuit topography in accordance with embodiments of the present invention that features conductive traces 160, at least two power conductors 110, 120, multiple LEEs 130, and CE 140. In some embodiments, LEEs 130 may be configured in a regular periodic array having a pitch (i.e., distance between adjacent LEEs 130) 220, as shown in FIG. 2A. FIG. 2A shows two power conductors 110 and 120, which may be used to provide power to strings of LEEs 130, as well as a string 150. Each string 150 may include two or more electrically coupled LEEs 130. LEEs 130 in string 150 may be electrically coupled in series, as shown in FIG. 2A; however, this is not a limitation of the present invention and in other embodiments other examples of electrical coupling may be utilized, for example LEEs in parallel or in any combination of series and parallel connections. FIG. 2A shows CE 140 in series with string 150; however, this is not a limitation of the present invention and in other embodiments CE 140 may have different electrical coupling between power conductors 110, 120. For example, FIG. 2B shows CE 140 separately electrically coupled to power conductors 110, 120 and the LED string, while FIG. 2C shows each CE 140 electrically coupled to two strings. The number of strings electrically coupled to each CE 140 is not a limitation of the present invention. Combinations of structures shown in FIGS. 2A-2C, as well as other electrical connections, all fall within the scope of the present invention. Power conductors 110, 120 may be used to provide power to strings 150, for example AC power, DC power, or power modulated by any other means. Lightsheets may be produced as individual components or in a roll-to-roll format.

Lightsheets of different lengths, where for convenience the length is identified by the double-headed arrow 305 in FIG. 3, may be separated from a roll and sold as separate products. Herein, a lightsheet may refer to a cut or segmented portion of a larger length, for example the structures shown in FIGS. 1A and 1B, and before cutting or separation, the larger length may also be referred to as a lightsheet or "lightsheet web." Thus, one lightsheet web of constant width, i.e., the direction perpendicular to direction 305, may be used for a wide variety of lightsheet products of different lengths. For example, FIG. 3 shows a lightsheet 360 or lightsheet web that may have a width of about 10 cm and a pitch (identified as dimension 220 in FIG. 2A) between LEEs 130 of about 1 cm. The square identified as 310 in FIG. 3 has sides equal in length to pitch 220. Thus, in this example the length of a particular lightsheet may be selected in any increment of about 1 cm by separating the lightsheet web 360 between two adjacent strings 150. For example lightsheet 360 shown in FIG. 3 may be segmented into a lightsheet that is four strings long and a lightsheet that is six strings long by cutting or separating along cut line 320.

In embodiments where the lightsheet includes or consists essentially of folded strings, the distance between adjacent strings (i.e., the "string pitch") may be different from the LEE pitch (i.e., the distance between adjacent LEEs on a string). For reference, in FIG. 3B the string pitch is substantially the same as the LEE pitch. FIG. 1B shows an example of an embodiment having a folded string in which the string pitch is larger than the LEE pitch. In some embodiments, the string pitch may be equal to or substantially equal to the spacing between CEs 140, as shown in FIG. 1B; however, this is not a limitation of the present invention. In some embodiments, the string pitch is an integer multiple or substantially an integer multiple of the LEE pitch. For example, in some embodiments the LEE pitch is the same across all strings, including embodiments including or consisting essentially of folded strings, and in some of these embodiments the string pitch is an integer multiple or substantially an integer multiple of the LEE pitch. For example, in FIG. 1B the string pitch is about four times the LEE pitch. In reference to FIG. 5A, the string pitch is about three times the LEE pitch, in FIG. 5C, the string pitch is about twice the LEE pitch, and in FIG. 6B, the string pitch is about five times the LEE pitch. However, this is not a limitation of the present invention, and in other embodiments the string pitch may not be an integer multiple or substantially an integer multiple of the LEE pitch.

Cutting or segmenting lightsheet web 360 into smaller lightsheets may be carried out by a wide variety of techniques, for example knife cutting, laser cutting, or the like. The method of segmentation is not a limitation of the present invention. In one embodiment, segmentation occurs at the midpoint or substantially at the midpoint between adjacent strings, as discussed in more detail below.

Lightsheet segmentation may occur at any point in the manufacturing process, for example after formation of the substrate 165, after formation of LEEs 130 and/or CEs 140 over substrate 165 (FIG. 1B), or as the final step of the manufacturing process. Segmentation may occur before or after optional testing. Furthermore, completed or partially completed lightsheets or lightsheet webs may be inventoried or stored for a period of time, after which manufacture may be completed, if necessary, and/or the lightsheet or lightsheet web segmented. Segmentation may be performed on a just-in-time basis or on an order-by-order basis. In some embodiments, lightsheets or lightsheet webs may be segmented in the field. In some embodiments, segmentation is performed by cutting with a scissors or knife. In some embodiments, segmentation may occur after installation, for example to change the size of the lightsheet or to remove and replace a damaged or nonfunctional lightsheet or portion of a lightsheet, or to fit in a luminaire or architectural feature of a specific dimension.

In addition, individual lightsheets 360 may be tiled with little or no substantial change in pitch or variation in optical characteristics across the joint. In some embodiments tiling may be enabled in one direction, i.e., length or width, for example the length identified by arrow 305 in FIG. 3, while in other embodiments tiling may be enabled in more than one direction.

In one embodiment, tiling is achieved by segmenting one or more lightsheets or lightsheet webs between adjacent strings 150. In some embodiments, lightsheets or lightsheet webs are segmented at the midpoint or substantially at the midpoint between adjacent strings 150, such that the distance between the last string and the edge of sheet 360 is one-half of the string pitch, as shown in FIG. 4, and then positioning the lightsheets adjacent to each other at their "tiling edges." FIG. 4 shows two wiring boards 360, 360' that are tiled together such that there is no difference, or no substantial difference, in spacing between the strings on adjacent sides of a joint 410 therebetween. Because there is no or almost no difference in spacing between the strings on adjacent sides of the joint 410, the optical characteristics appear uniform across the joint 410, i.e., the lightsheet appears to be "joint-free." In some embodiments of the present invention such joint-free tiling may occur in the orthogonal direction, i.e., perpendicular to the direction 305 (FIG. 3), for example if power conductors 110, 120 occupy less than one-half of the pitch distance, or by other means, which will be discussed later. In some embodiments, segmentation may be accomplished by removing one or more portions of strings or adjacent strings 150. In some embodiments such joint-free tiling may occur in non-orthogonal directions, for example for non-square or non-rectangular lightsheets.

In some embodiments of the present invention, the pitch is determined at least in part by the desired wiring board width, the string voltage, the LEE voltage at the desired operating current (e.g., the forward voltage of an LED), and the LEE pitch (i.e., the spacing between individual LEEs). The string voltage may be determined by various constraints, for example the desired or available power for powering the system, certification issues or the like. In one embodiment, the design process starts with the forward voltage of the LEE $V_f$, the specified string voltage $V_s$, and LEE pitch p. The number of LEEs in a string is given approximately by $n=V_s/V_f$. The physical string length is then given approximately by the product of the pitch and the number of LEEs, i.e., $(n-1) \times p$. In some embodiments of this approach, n may not be an integer and adjustments to n or p may be employed to make n an integer. In another embodiment, adjustments to $V_f$, for example by changing the operating current or temperature, or to $V_s$, by changing the design requirement, may also be employed, for example to make n an integer.

Figure 5A:
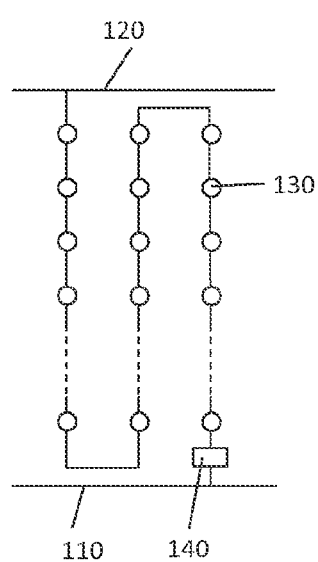
FIGS. 5A-5I, 6A, and 6B are schematic illustrations of electrical configurations of lighting systems in accordance with various embodiments of the invention.
Figure 5B:
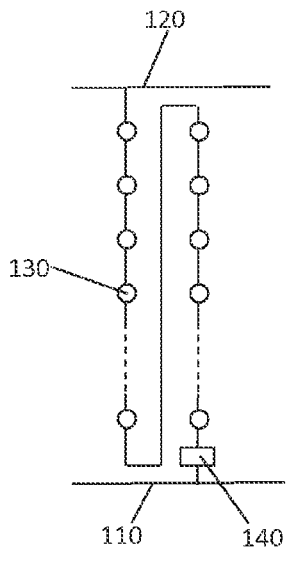
Figure 5C:
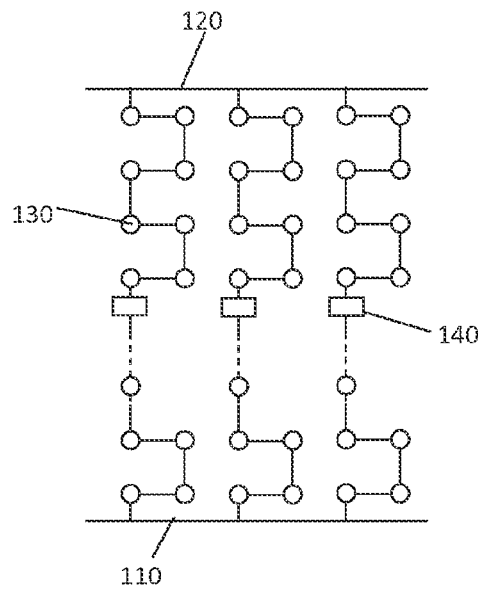
Figure 5D:
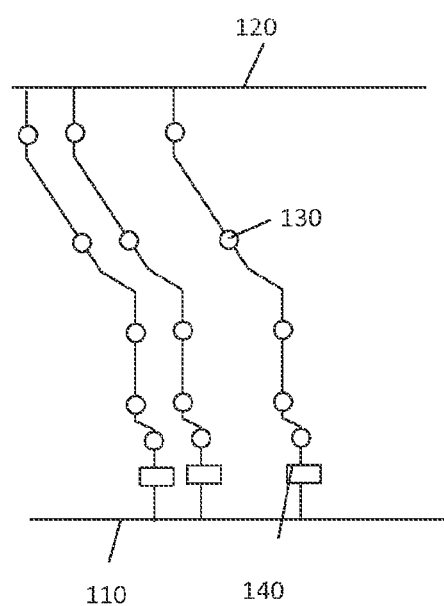
Figure 5E:
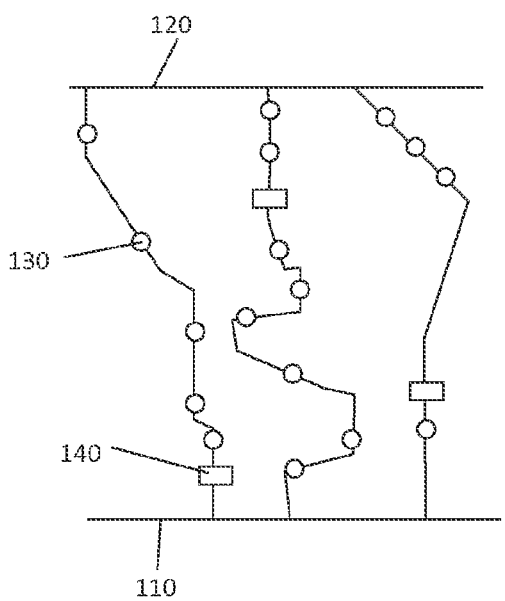
Figure 5F:
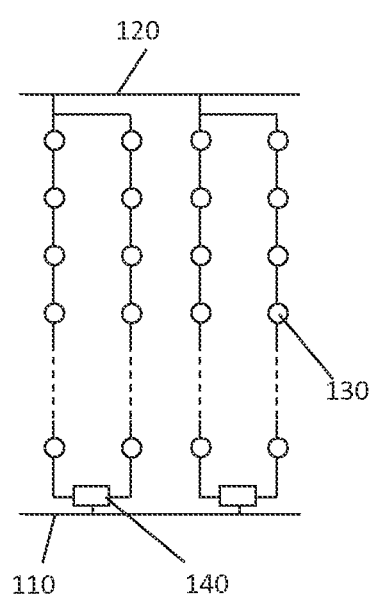
Figure 5G:
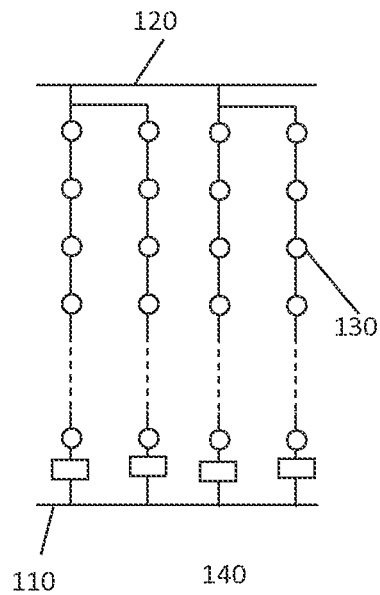
Figure 5H:
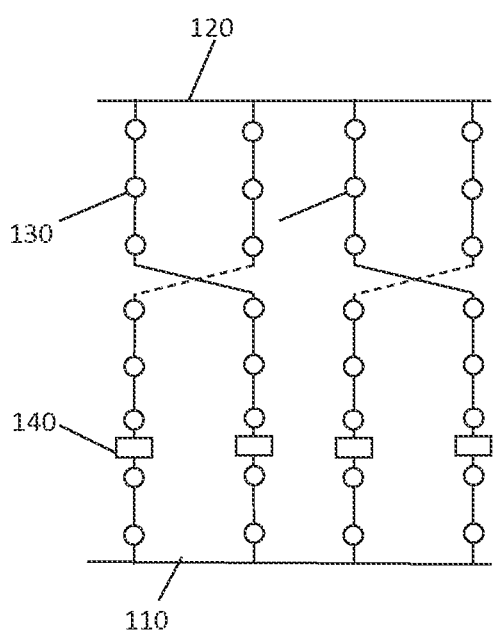
Figure 5I:
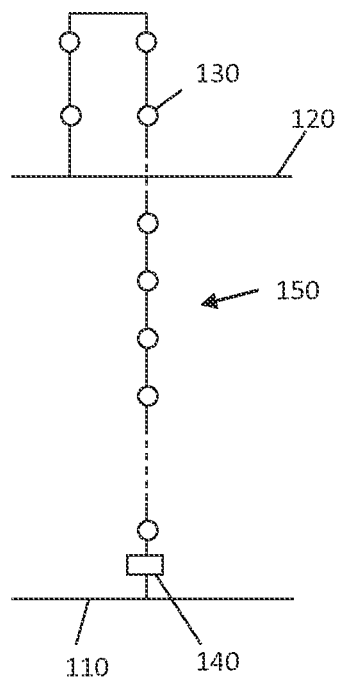

In some embodiments, the physical string length, i.e., the length of the string if it were laid out in a straight line, is larger than the desired wiring board width and in this case the string may be folded or twisted to fit within the desired wiring board width, for example as shown in FIGS. 5A-5C, in which LEEs 130 are shown schematically as circles for clarity. FIGS. 5A-5C depict several examples of "folding" a string. FIGS. 5A and 5B show one string, while FIG. 5C shows three strings, all with approximately the same pitch. In one embodiment, LEEs 130 are positioned in a regular periodic array, with a fixed pitch between LEEs 130, and the power conductors that electrically interconnect them as a string may have any layout that fits within the constraints of the LEE pitch. In other embodiments, LEEs 130 may be positioned in other ways; the position of LEEs 130 and the configuration of the power conductors that interconnect LEEs 130 within one string are not limitations of the present invention. In various embodiments the design process may start with different constraints, for example including one or more of these characteristics: lumen or optical power density per unit area, lumen or optical power per LEE 130, pitch, cost, luminous efficacy, electrical power per unit area, electrical power per LEE 130, or the like.

While FIGS. 5A-5C show folding of strings into a plurality of parallel segments, this is not a limitation of the present invention and in other embodiments, the string segments may not all be parallel, or may form different angles relative to each other or the edges of substrate 165 (FIG. 1B), for example as shown in FIGS. 5D and 5E. The orientation of the strings and/or portions or segments of the strings is not a limitation of the present invention. In some embodiments, multiple LEEs 130 in one or more strings 150 may be oriented to form various shapes, pictures, images, letters, or the like. Such embodiments may be used for decorative purposes, signage, or other applications. As discussed herein, FIGS. 5F and 5G show examples of split strings, while FIG. 5H shows an example of crossed-over strings and FIG. 5I shows an example of a string extending beyond (i.e., outside of) power conductors 110, 120.

Another aspect of embodiments of the present invention may be realized in reference to FIGS. 5A and 5B. While LEEs 130 are shown as circles in these figures, in some embodiments LEEs 130 may have a polarity, for example p- and n-sides in the case of an LEE 130 being an LED or laser. In such embodiments, the conductive traces may be configured such that all LEEs 130 are oriented in one direction, for example with the positive or cathode end of each LEE 130 oriented or pointed in the same direction. FIG. 5B shows one embodiment of such a configuration of conductive trace 160; however, this configuration is not a limitation of the present invention and in other embodiments other configurations of conductive traces 160 may be employed to achieve polarity orientation of LEEs 130. In some embodiments, LEEs 130 may not all have the same polarity orientation. The polarity orientation of the plurality of LEEs 130 is not a limitation of the present invention.

Figure 6A:
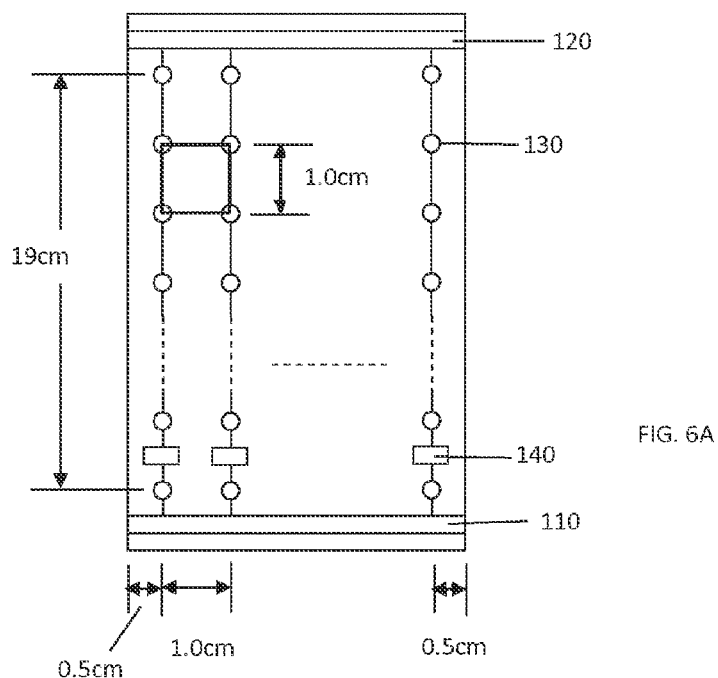

In a first exemplary embodiment, $V_s=60$ V, $V_f=3.0$ V and p=1 cm. This results in 20 LEDs per string and a "straight" string length of about 19 cm between the first and last LEDs. FIG. 6A shows an example where the string is straight, resulting in a sheet that has a width equal to the string length (19 cm) plus additional space on each edge for the power conductors. The lightsheet in FIG. 6A has a length of m×p, where m is the number of strings on the sheet. If the number of strings on the sheet m is 20, then the total length of the sheet is about 20 cm.

Figure 6B:
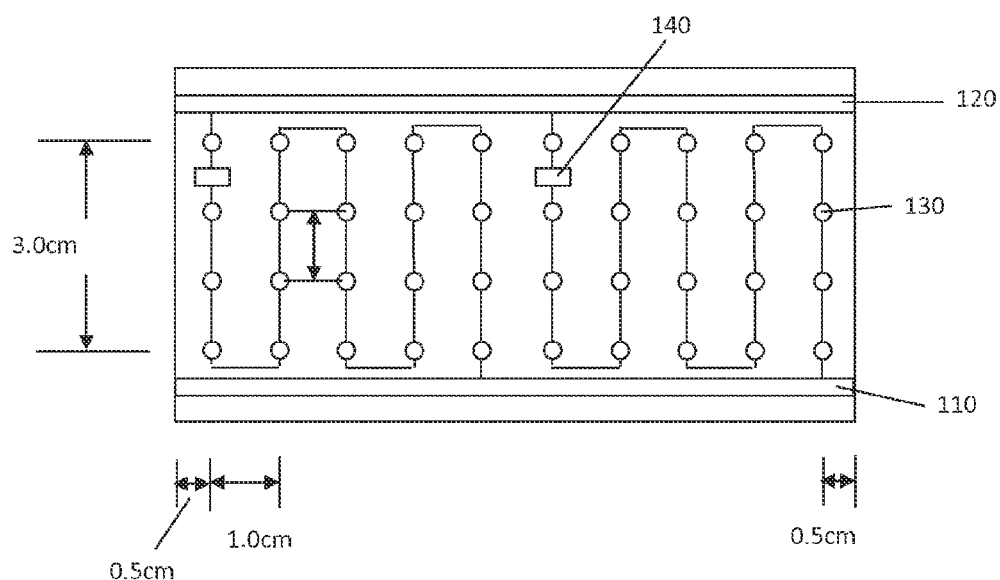

In the first exemplary embodiment above, $V_s=60$ V, $V_f=3.0$ V and p=1 cm. This results in 20 LEDs per string and a "straight" string length of about 19 cm between the first and last LED. FIG. 6B shows an example where the sheet is relatively narrower than the straight string length, for example in the range of about 1 cm to about 5 cm. In this case the number of LEDs 130 between power conductors 110 and 120 is 4 (in a straight line) and the string forms a 4×5 array, as shown in FIG. 6B, with each string segment having a length of about 3 cm. The wiring board in FIG. 6B has a length of $m_s \times p$, where $m_s$ is the number of string segments on the sheet. In this example there are 10 string segments, resulting in a total length of about 10 cm. In this example the string pitch is about five times the LEE pitch. Similarly, the total length of about 10 cm may be determined from the product of the number of strings (two) and the string pitch (five).

As detailed herein, the wiring boards shown in FIGS. 6A and 6B may be tiled together in the length direction such that the distance between adjacent LEEs across a joint is the same as the LEE pitch p, resulting in uniform lighting characteristics with virtually no change at or near the joint region.

The examples shown in FIGS. 6A and 6B provide an example of further embodiments of the present invention. In some embodiments, it may be desirable to manufacture lightsheets of different width, but able to operate on the same voltage. In these embodiments, the string voltage is preferably the same or substantially the same for each different-width lightsheet. In one embodiment, this may be accomplished by using strings with the same number of LEEs 130 per string and folding the strings to fit the different widths. In order to be able to produce a relatively larger number of different width lightsheets, the number of LEEs 130 in a string may be advantageously determined to be a value with a relatively large number of divisors (or "factors"). Table 1 shows an example of different configurations for strings including or consisting essentially of 4 to 25 LEEs 130. In Table 1, the entry A×B means "A" string segments and "B" LEEs per string segment. For example, 1×16 means a straight string with 16 LEEs per string and 3×4 means a string with 12 LEEs, configured in 3 string segments, each having 4 LEEs per string segment. As may be seen from Table 1, strings having any prime number of LEEs 130 generally cannot be folded. Strings including or consisting essentially of 12, 18, or 20 LEEs 130 may have 5 folded configurations (Table 1 does not include the case of a string containing only a single LEE 130). Strings including or consisting essentially of 24 LEEs 130 may have 7 folded configurations.

The number of configurations may be determined by taking the quantity of factors of for a particular number and subtracting one, to eliminate the single-LEE string. Table 2 shows the number of folded string configurations for strings including or consisting of LEEs from 30 to 220. Table 2 may be used to determine the number of different folded string configurations for different numbers of LEEs per string.

In some embodiments, it may be desirable to limit the voltage supplied to the lightsheet and/or to limit the power supplied to one or more electrically coupled lightsheets. For example, in the United States, a class 2 UL electrical certification requires that the voltage not exceed 60V and the power not exceed 100 watts. For such class 2 configurations, strings including or consisting essentially of 12, 16, 18, or 20 LEEs 130 may be advantageously chosen to permit a relatively large number of lightsheet width configurations.

For higher voltage strings, Table 2 may be used to advantageously select the number of LEEs per string to achieve any number of folded string configurations. As may be seen from Table 2, strings including or consisting essentially of 60, 72, 84, 90, 96, 108, 126, 140, 150, 156, 160, 198, 200, 204, and 211 LEEs have 11 folded string configurations. As may be seen from Table 2, strings including or consisting essentially of 144 LEEs have 14 folded string configurations. As may be seen from Table 2, strings including or consisting essentially of 120, 168, 210, and 216 LEEs have 15 folded string configurations. As may be seen from Table 2, strings including or consisting essentially of 180 LEEs have 17 folded string configurations.

TABLE 1

| LEEs Per String | Folded String Configurations | | | | |
|---|---|---|---|---|---|
| 4 | 1 × 4 | 2 × 2 | | | |
| 5 | 1 × 5 | | | | |
| 6 | 1 × 6 | 2 × 3 | 3 × 2 | | |
| 7 | 1 × 7 | | | | |
| 8 | 1 × 8 | 2 × 4 | 4 × 2 | | |
| 9 | 1 × 9 | 3 × 3 | | | |
| 10 | 1 × 10 | 2 × 5 | 5 × 2 | | |
| 11 | 1 × 11 | | | | |
| 12 | 1 × 12 | 2 × 6 | 3 × 4 | 4 × 3 | 6 × 2 |
| 13 | 1 × 13 | | | | |
| 14 | 1 × 14 | 2 × 7 | 7 × 2 | | |
| 15 | 1 × 15 | 3 × 5 | 5 × 3 | | |
| 16 | 1 × 16 | 2 × 8 | 4 × 4 | 8 × 2 | |
| 17 | 1 × 17 | | | | |
| 18 | 1 × 18 | 2 × 9 | 3 × 6 | 6 × 3 | 9 × 2 |
| 19 | 1 × 19 | | | | |
| 20 | 1 × 20 | 2 × 10 | 4 × 5 | 5 × 4 | 10 × 2 |
| 21 | 1 × 21 | 3 × 7 | 7 × 3 | | |
| 22 | 1 × 22 | 2 × 11 | 11 × 2 | | |
| 23 | 1 × 23 | | | | |
| 24 | 1 × 24 | 2 × 12 | 3 × 8 | 4 × 6 | 6 × 4  8 × 3  12 × 2 |
| 25 | 1 × 25 | 5 × 5 | | | |

TABLE 2

| LEEs Per String | Number of Folded String Configurations |
|---|---|
| 30 | 7 |
| 36 | 8 |
| 40 | 7 |
| 42 | 7 |
| 48 | 9 |
| 54 | 7 |
| 60 | 11 |
| 66 | 7 |
| 70 | 7 |
| 72 | 11 |
| 80 | 9 |
| 84 | 11 |
| 90 | 11 |
| 96 | 11 |
| 100 | 8 |
| 102 | 7 |
| 104 | 7 |
| 108 | 11 |
| 112 | 9 |
| 120 | 15 |
| 126 | 11 |
| 135 | 7 |
| 136 | 7 |
| 138 | 7 |
| 140 | 11 |
| 144 | 14 |
| 150 | 11 |
| 152 | 7 |
| 156 | 11 |
| 160 | 11 |
| 162 | 9 |
| 165 | 7 |
| 168 | 15 |
| 170 | 7 |
| 174 | 7 |
| 176 | 9 |
| 180 | 17 |
| 182 | 7 |
| 184 | 7 |
| 186 | 7 |
| 189 | 7 |
| 190 | 7 |
| 192 | 13 |
| 195 | 7 |
| 196 | 8 |
| 198 | 11 |
| 200 | 11 |
| 204 | 11 |
| 208 | 9 |
| 210 | 15 |
| 216 | 15 |
| 220 | 11 |

Figure 7:
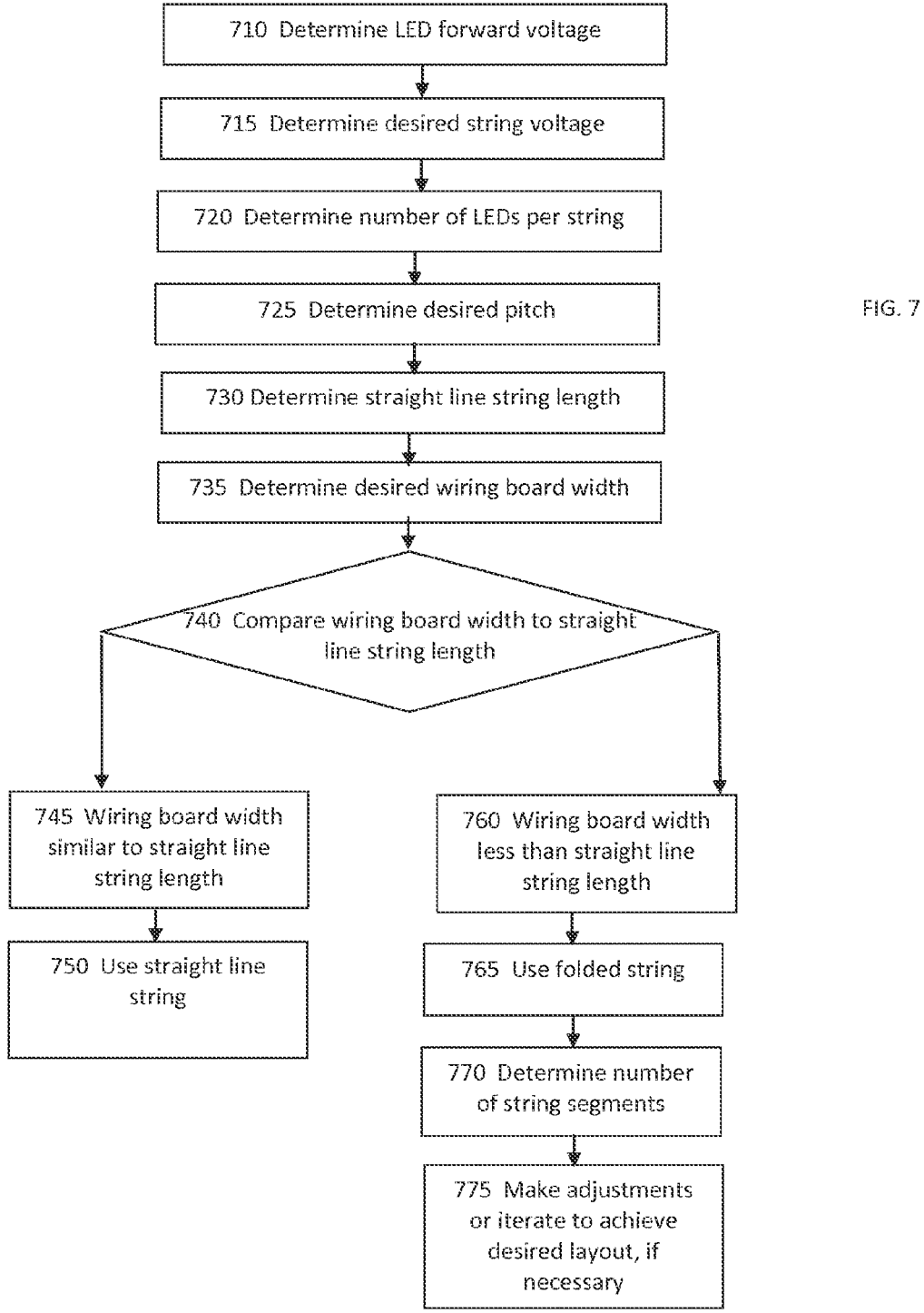
FIG. 7 is a flow chart depicting a process flow for manufacture of lighting systems in accordance with various embodiments of the invention.

FIG. 7 is a flow chart of a design process that may be used in one embodiment of this invention. The number of steps shown in the process shown in FIG. 7 is not a limitation of the present invention, and in other embodiments such processes have more or fewer steps and/or the steps may be performed in different orders. In step 710 the forward voltage of the LEE at the operating current and conditions is determined. In step 715 the total string voltage is determined. In step 720 the number of LEEs in each string is determined by dividing the total string voltage by the LED forward voltage. In step 725 the desired pitch is determined. In step 730 the "straight-line" string length is determined by multiplying the number of LEDs per string by the pitch. In step 735 the desired wiring board width is determined. In step 740 the straight-line string length is compared to the desired wiring board width. If the desired wiring board width is approximately the same as the straight-line string length, then a straight string may be used, in which case each string is separated from the adjacent string by the LED pitch, as shown in steps 745 and 750. If the desired wiring board width is less than the straight line string length, then a folded string is used, as shown in steps 760 and 765. The number of string segments may then be calculated initially by dividing the straight string length by the desired wiring board width, as shown in step 770. Some adjustment or iteration steps may be required to adjust the parameters to achieve the desired layout, as shown in step 775. This adjustment may take the form of using a different interconnect topology, for example like those shown in FIGS. 5A-5C, or may take the form of adjusting the pitch, $V_f$ of the LEDs, number of LEEs per string, string voltage, or the like. In some embodiments, the order of steps shown in FIG. 7 may be changed, or some steps omitted or other steps added or repeated. In some embodiments, the order is modified when different initial constraints are utilized. For example, in FIG. 7 the initial constraints include the LEE forward voltage and the string voltage; in another embodiment the initial constraints may include, for example, the number of LEEs in each string, or the desired light output power of each LEE, the desired light power density, the desired electrical power density, the cost, or the like, which may determine the operating conditions, leading to a particular forward voltage.

If the desired width of the wiring board or lightsheet is larger than the straight-line string voltage, several approaches may be used. In one embodiment, wiring boards with a smaller width may be tiled together in the width direction; however, with the structures discussed above, the LEEs on adjacent sides of the joint in the width direction may not have the same pitch as the LEEs on the wiring board due to the presence of power conductors 110 and 120. Another approach is to modify some of the parameters to achieve a longer straight-line string length, per the flow chart in FIG. 7, for example by increasing the string voltage or increasing the LEE pitch.

In step 715 the total string voltage is determined. In some embodiments a string may include one or more CEs 140, which may have their own voltage requirements (i.e., to account for a voltage drop across CEs 140). If present, this voltage drop may be taken into account when determining the total string voltage, which also includes the voltage across the LEEs 130 in each string. In some embodiments it may also be necessary to include the voltage drop across the conductive elements (traces) in each string and/or in the power conductors.

In some embodiments, power conductors 110 and 120 provide a fixed or substantially fixed voltage to each string, and that voltage may be larger than the string voltage discussed above, for example to accommodate voltage taken up by CEs 140. For example, if the string voltage discussed above is the voltage across only the LEEs in each string; then the voltage across power conductors 110 and 120, for example in FIGS. 6A and 6B, may be $V_f \times n + V_{CE}$, where $V_{CE}$ is the voltage across CEs 140. In some embodiments, the voltage supplied across power conductors 110 and 120 and thus the supplied string voltage may vary, for example because of variations in the input power source, changes in temperature, variations in component characteristics (for example LED I-V characteristics or the characteristics of CEs 140) or the like. Such variations may be accommodated and techniques for doing so are described herein.

In some embodiments, it may be desirable to increase the conductivity of power conductors 110, 120 and or conductive elements 160. For example, power conductors 110, 120 formed on substrate 165 may have an undesirably large resistance, resulting in an undesirably large voltage drop across power conductors 110, 120 in operation causing a reduction in efficiency or luminous efficacy or even the inability to turn on one or more strings, if the voltage is reduced sufficiently. In some embodiments, this may be accommodated by modifying the voltage required to power each string. In some embodiments, the voltage level on power conductors 110, 120 may change along the lengths of the power conductors. For example, the voltage level may decrease in a direction away from the point of connection to the power source because, e.g., of the resistance in the power conductors. In some embodiments, the voltage to energize each string may then be designed to follow the available voltage along the power conductor, for example by changing the voltage drop across CE 140, conductive elements 160 and/or reducing the number of LEEs 130 in the string.

In some embodiments, power conductors 110, 120 may be formed using a higher conductivity material than that used for conductive traces 160. In some embodiments, power conductors 110, 120 may be formed of the same material as that used for conductive traces 160, but may have a relatively larger thickness or relatively larger width or cross-sectional area than that used for conductive traces 160, thus decreasing their resistance. In some embodiments, power conductors 110, 120 may have multiple layers of the same or different materials.

Figure 8A:
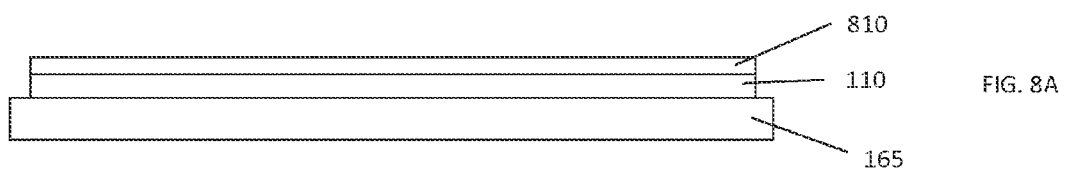
FIG. 8A is a schematic cross-section of a lighting system in accordance with various embodiments of the invention.
Figure 8B:
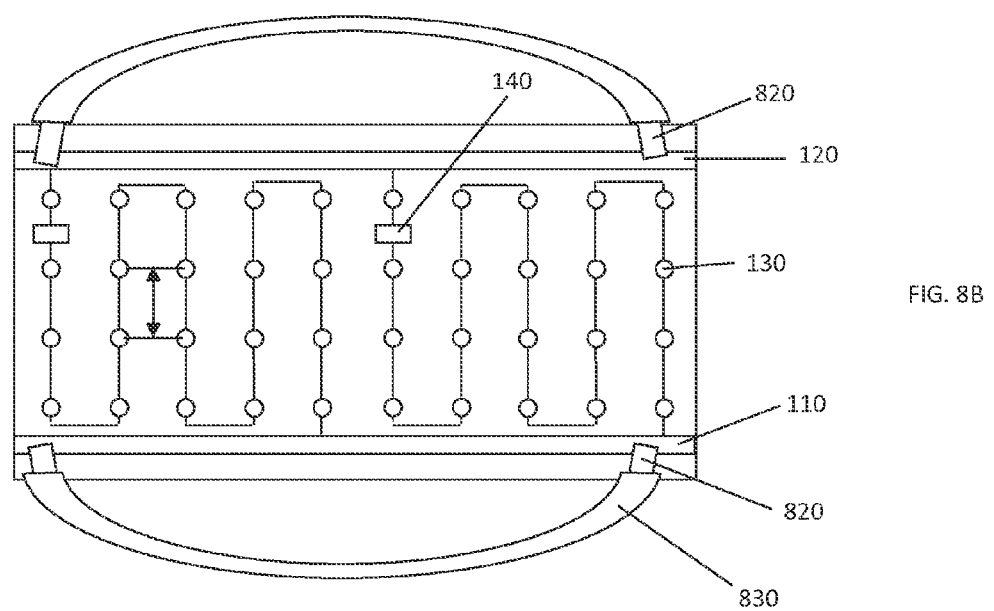
FIG. 8B is a schematic plan view of a lighting system in accordance with various embodiments of the invention.

In some embodiments, an additional conductive path may be formed in parallel with all or parts of power conductors 110, 120 in order to reduce the total resistance. This may be advantageous in embodiments where multiple lightsheets 360 are connected together and powered by a single power supply or where lightsheet 360 is relatively long, for example at least about 1 meter, or at least 5 meters, or at least 10 meters long. In some embodiments the conductivity of power conductors 110, 120 and/or conductive elements 160 may not be sufficiently high to achieve a desired value of voltage drop in the conductors. Such a situation may lead to undesirably high resistance losses, leading to a loss in luminous efficacy of the lighting system and/or undesirable heating of the conductors. In some embodiments, a conductive material may be formed over and in electrical contact with all or portions of power conductors 110, 120. For example, a conductive tape 810, optionally including a conductive adhesive, may be formed over or adhered to power conductors 110, 120 to decrease their resistance, as shown in FIG. 8A. An example of such a conductive tape is 3M 1183 tape. In some embodiments, a separate conductive path 820, which may include or consist essentially of a wire or other conductive material, may be electrically coupled in parallel to portions of power conductors 110, 120, as shown in FIG. 8B, which depicts wire 820 with optional insulation 830. Wire 820 may be electrically attached to power conductors 110,120 by various techniques, for example solder or mechanical crimp connectors. In some embodiments, the separate conductive path 820 may include or consist essentially of all or a portion of the frame, fixture, or enclosure into which the lightsheet is placed. In some embodiments, the separate conductive path 820 may include or consist essentially of all or a portion of the hardware or mounting equipment with which the lightsheet is mounted.

Various embodiments of the invention may include a carrier for one or more lightsheets. For example, as discussed above, the lightsheet may be installed in a frame, fixture or enclosure, which may also be identified as a carrier. The carrier may be rigid or flexible and may provide support for the lightsheet(s), an enclosure for the lightsheet(s), support for additional equipment such as a power supply, driver, control or sense electronics, or the like.

In some embodiments, the lightsheet may include one or more conductive elements on the back of the substrate, for example on the back of substrate 165 illustrated in FIG. 1B. Such conductive elements, also called power conductors, back power conductors, power bus, power bus lines, and/or bus lines, may be configured and used to permit much longer lightsheets while still maintaining acceptable voltage loss in the power conductor and thus acceptably high efficiency. FIGS. 9A and 9B depict an electrical device 900 in cross-section and plan view respectively. Electrical device 900 includes or consists essentially of power conductors 110, 120, conductive traces 160, strings 150, and LEEs 130 formed over substrate 165. Electrical device 900 also features back power conductors 910, 920 that are formed on the side of substrate 165 opposite the side on which power conductors 110, 120 are formed. In FIGS. 9A and 9B, the CEs 140 are omitted for clarity. Back power conductors 910, 920 may be electrically coupled to power conductors 110, 120 respectively, using vias 930. Vias 930 permit electrical coupling of back power conductor 910 to power conductor 110 and back power conductor 920 to power conductor 120. Via 930 may include or consist essentially of, e.g., a crimp-type via or a through-hole that is been filled or partially filled with conductive material 1050 (FIG. 10D). In some embodiments, a via 930 may have other configurations, for example a clamp 1010 (FIG. 10A), a rivet 1020 (FIG. 10B), a staple 1030 (FIG. 10C), a wire, or the like. In some embodiments, the conductive traces and/or power conductors are formed or printed and via 930 is formed as part of the forming or printing process. The means of electrical coupling between back power conductors 910, 920 and power conductors 110, 120 is not a limitation of the present invention. In some embodiments, the connection between the back and front power conductors may be made by folding or rolling the end of the sheet, to put a conductor on one side of the sheet in contact with a conductor on the other side of the sheet, for example as shown in FIG. 10E, identified as 1060 in FIG. 10E. In one embodiment, such a structure (shown in FIG. 10E) may be held in place with tape, adhesive, a clamp, or other means. In some embodiments, via 930 may be formed in a roll-to-roll process. In some embodiments, electrical coupling between back power conductors 910, 920 and power conductors 110, 120 may be formed in the roll-to-roll process that is used to form the conductive elements (for example back power conductors 910, 920, power conductors 110, 120 and/or conductive elements 160) over substrate 165.

Figure 11:
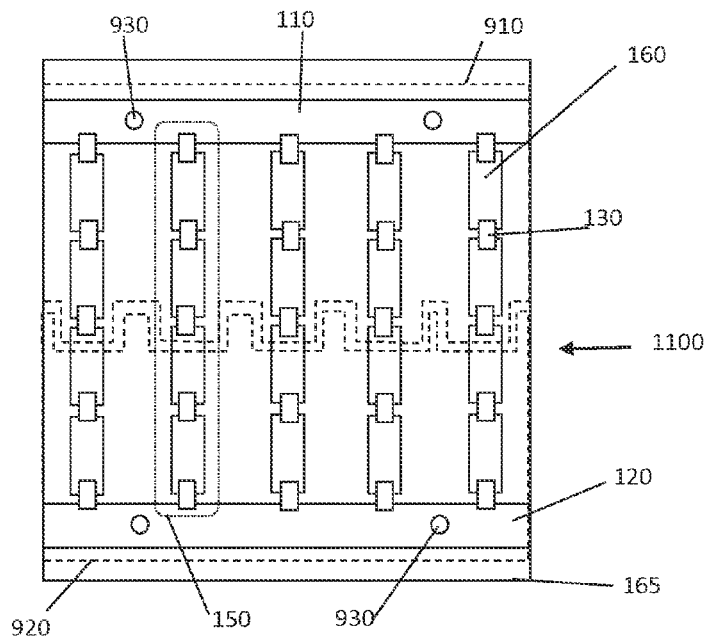
FIG. 11 is a schematic illustration of a lighting system in accordance with various embodiments of the invention.

In some embodiments, the back and/or front metal may act as a reflector for light generated by LEEs 130, for example to direct it more in the forward direction, away from sheet 165. In some embodiments, conductive elements 160, back power conductors 910, 920 and/or power conductors 110, 120 may be reflective to a wavelength of light emitted by LEE 130. In some embodiments, conductive elements 160, back power conductors 910, 920 and/or power conductors 110, 120 may have a reflectivity greater than 70% to a wavelength of light emitted by LEEs 130. In some embodiments, the conductive elements near or below LEEs 130 may be configured such that there is no direct pathway for light from the front to the back of the lightsheet. One example of such a configuration is shown for electrical device 1100 in FIG. 11. While string 150 in FIGS. 9B and 11 features five LEEs 130, this is not a limitation of the present invention, and in other embodiments string 150 may include or consist essentially of any number of LEEs 130. In FIG. 11 CEs 140 are omitted for clarity.

Figure 12:
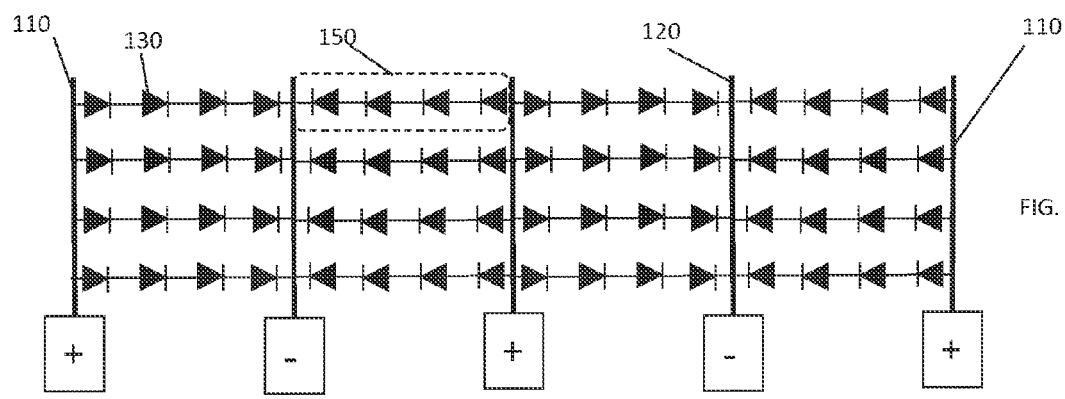
FIGS. 12 and 13 are schematic illustrations of electrical configurations of lighting systems in accordance with various embodiments of the invention.
Figure 13:
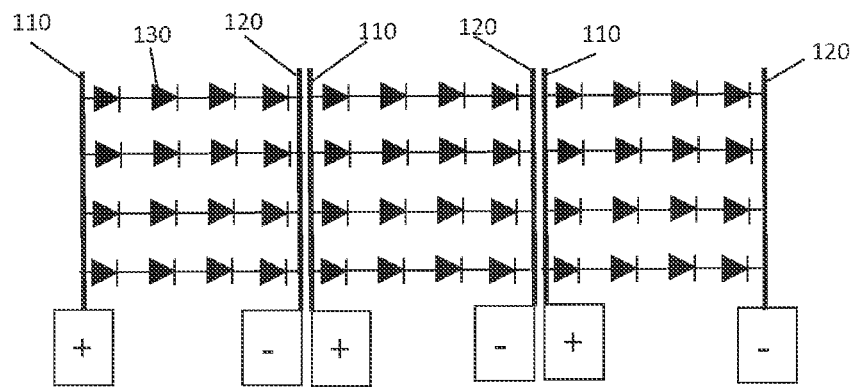

In some embodiments of the present invention, the lightsheet may include parallel groups of strings, as schematically illustrated in FIG. 12. This configuration permits manufacture of a lightsheet or lightsheet web wider than the length occupied by the string between adjacent power conductors 110, 120. While FIG. 12 shows four adjacent strings, this is not a limitation of the present invention and in other embodiments any number of strings may be configured adjacently in this fashion. While FIG. 12 shows strings 150 including four LEEs 130, this is not a limitation of the present invention and in other embodiments string 150 may include any number of LEEs 130. FIG. 12 shows LEEs 130 oriented in opposite directions in adjacent groups of strings 150; however, this is not a limitation of the present invention and the physical orientation of LEEs 130 may not be the same as in the electrical schematic. In other embodiments, adjacent groups of strings 150 may be oriented in the same direction and two sets of power conductors may be formed between each group of strings, as shown in FIG. 13.

Figure 14:
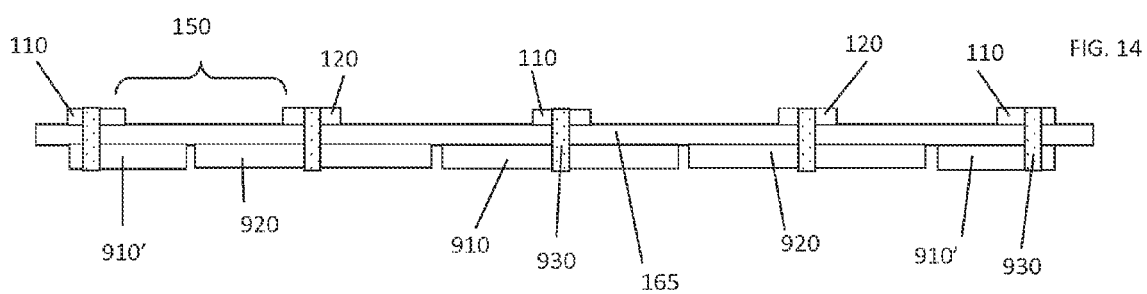
FIG. 14 is a schematic cross-section of a lighting system in accordance with various embodiments of the invention.

FIG. 14 shows a cross-sectional schematic of one embodiment of the electrical schematic shown in FIG. 12 in accordance with this invention. In some embodiments, the sections of 120, 110 and 910, 920 adjacent to via 930 are electrically continuous. While FIG. 14 shows four sections of strings 150, this is not a limitation of the present invention and in other embodiments any number of sections of strings may be used. In FIG. 14, the sections of back power conductor 910 at the edges of sheet 165, identified in FIG. 14 as 910', are not as wide as other 910 sections. In some embodiments, back power conductors 910' may have a width that is about one-half the width of back power conductors 910. In some embodiments, back power conductors 910' may carry about one half of the current as other sections of back power conductors 910. In other words, in the electrical schematic shown in FIG. 12 back power conductors that are electrically coupled to two sections of strings 150 carry about twice the current as back power conductors that are electrically coupled to one section of strings 150, and in some embodiments the resistance of such strings that carry about twice the current may have about half of the resistance as back power conductors that carry the current for one section of strings 150.

In some embodiments, control of the resistance may be by other means than controlling the width of the conductive traces, i.e., by controlling dimensions of conductive elements 160, power conductors 110, 120, and/or back power conductors 910, 920. In some embodiments, resistance control may be achieved by using different thickness conductive traces. In some embodiments, resistance control may be achieved by using different materials for different conductive traces or different portions of conductive traces, for example with different conductivities. In some embodiments, resistance control may be achieved by using a plurality of layers of conductive and/or non-conductive materials that form all or portions of the conductive traces.

Figure 15:
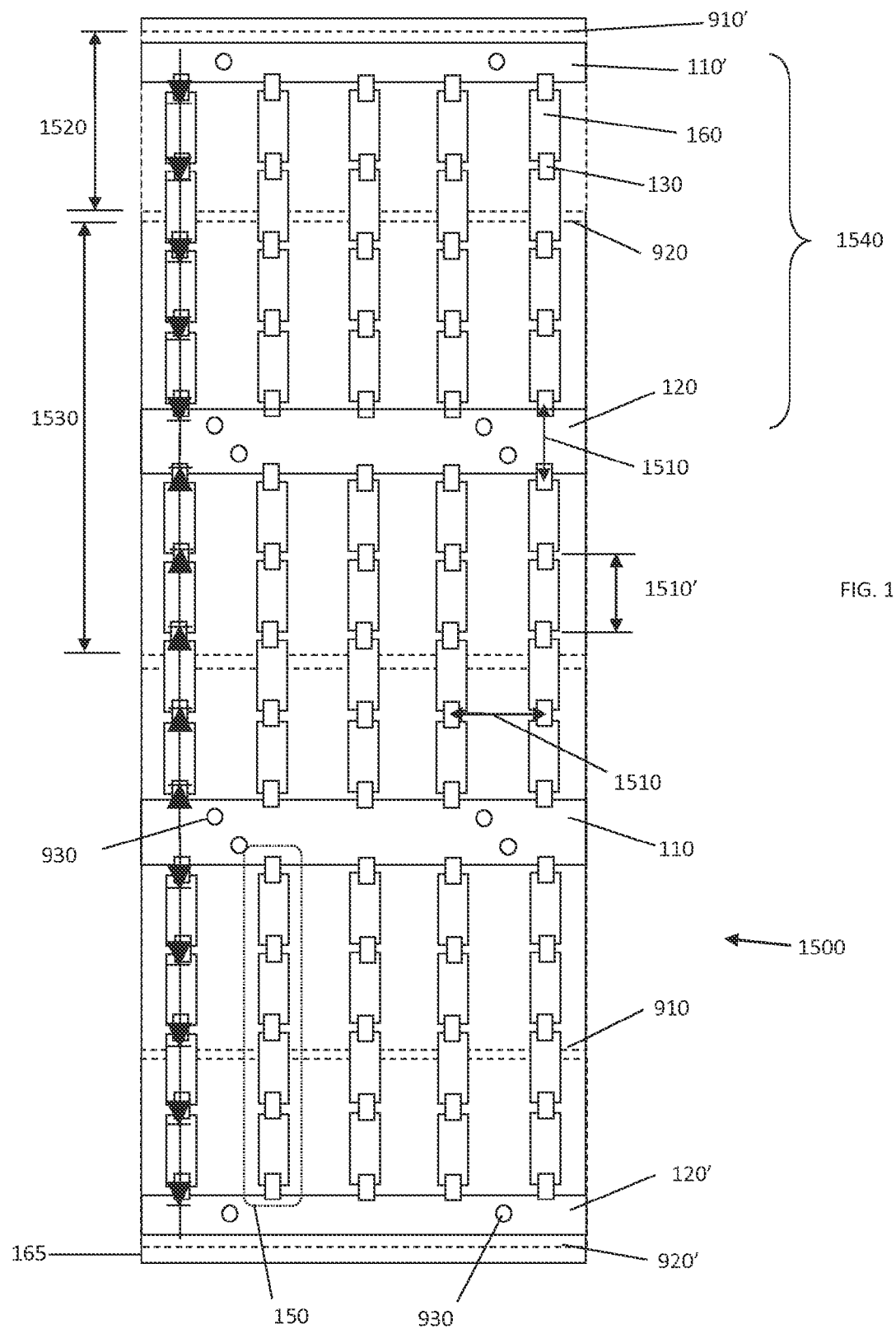
FIGS. 15, 16, and 17 are schematic illustrations of lighting systems in accordance with various embodiments of the invention.

FIG. 15 illustrates an electronic device 1500 in accordance with embodiments of the present invention. Electronic device 1500 is similar to electronic device 900 of FIG. 9, but includes three segments 1540 each containing multiple strings 150. In FIG. 15 CEs 140 are omitted for clarity. In some embodiments, the pitch between LEEs 130, identified as 1510 in FIG. 15, is the same within a string segment 1540 (identified as 1510' in FIG. 15) as it is between string segments 1540. In other words, power conductors 110 and 120 have the same or substantially the same length as conductive element 160. However, this is not a limitation of the present invention and in other embodiments, power conductors 110 and 120 may have a length different from that of conductive element 160.

As shown in FIG. 15, the back power conductors 910, 910', 920, 920' cover substantially all of the area of the back surface of substrate 165. In some such embodiments, the resistance of the back power conductors scales with the power required per unit length of the lightsheet. For example, In FIG. 15, the string length and distance between power conductors 110' and 120 scales with the number of LEEs 130 in the string (and thus the string voltage). The power per string is the product of the string voltage and current. Thus, as the string length increases the power per string increases. For a fixed current drive, this means the string voltage increases. The resistance drop in the back power conductor is the product of the current and voltage. For each string unit, this is just the product of the string voltage and the current. If no change is made to the back power conductor resistance, the voltage drop in the back power conductor will increase with increasing string length. However, by making the back power conductor cover essentially all of the area of the back of substrate 165, the resistance of the back power conductors scales inversely with the string length; that is, as the string length increases, the back power conductor resistance per unit length decreases proportionately. The back power conductor resistance in some embodiments may be defined by the product of the resistivity of the back power conductor material and its length, divided by its cross-sectional area. As the width increases, the cross-sectional area increases and the resulting resistance decreases. Thus, the voltage drop per unit length of back power conductor is the same for different string lengths. Therefore, from a design point of view, once an acceptable back power conductor voltage or power loss per unit length has been determined, this same voltage or power loss per unit length is automatically maintained when the string length or distance between front power conductors 110' and 120 is changed.

As discussed above, the back power conductors that carry less current are relatively narrower than the back power conductors that carry more current. In the example shown in FIG. 15, the edge back power conductors, identified as 910' and 920' carry current for one string segment 1540, while back power conductors 920 and 910 carry current for two string segments 1540. As shown, the width 1520 of back power conductors 910' or 920' is about half the width 1530 of back power conductors 910 and 920. However, this is not a limitation of the present invention and in other embodiments back power conductors 910, 910', 920, 920' may all have the same width or different widths. While the exemplary embodiment shown in FIGS. 9A, 9B, 14, and 15 has the back power conductors covering a large portion or substantially all of the back surface of substrate 165, this is not a limitation of the present invention and in other embodiments the back power conductors may cover a smaller portion of the back surface of substrate 165. In some embodiments, the back power conductors may be substantially the same size as the front power conductors. In some embodiments, the back power conductors may be substantially the same size as and positioned below the front power conductors, for example to achieve a more transparent lightsheet (i.e., to increase the amount of area of the lightsheet not covered on one or both sides by a power conductor or conductive element 160).

In some embodiments, the region between adjacent back power conductors is shifted so that it does not coincide with the position of LEEs 130 on the front of electronic device 1500. In some embodiments, this configuration may provide relatively higher reflectivity from the back power conductors to a wavelength of light emitted by LEEs 130.

As shown in FIG. 15, power conductors 120' and 110' that carry less current are relatively narrower than power conductors 110, 120 that carry more current. In the example shown in FIG. 15, the edge power conductors, identified as 110' and 120' carry current for one string segment 1540, while power conductors 120 and 110 carry current for two string segments 1540. As shown the width of power conductors 110' or 120' is about one-half the width of power conductors 110 and 120. However, this is not a limitation of the present invention and in other embodiments power conductors 110, 110', 120, 120' may all have the same width or different widths. FIG. 15 shows a larger number of vias 930 in wide power conductors (for example 110 and 910) than in the narrow power conductors (for example 120' and 920); however, this is not a limitation of the present invention and in other embodiments the number of vias 930 in any given power conductor may be the same as or different from that in other power conductors. In some embodiments, the number of vias 930 in a particular power conductor may be proportional to the current flowing in that power conductor, or to the conductivity of that power conductor.

Utilization of the same electrical constraints as in the first exemplary embodiment detailed above, that is $V_s$=60 V, $V_f$=3.0 V, and p=1 cm, results in a 20-LEE string having a "straight" string length of about 19 cm. Thus, each string segment has a width of about 19 cm and the distance between adjacent strings is about 1 cm. In this example, the lightsheet has three adjacent string segments—it thus looks similar to electrical device 1500 shown in FIG. 15, but it has 20 LEEs 130 per string instead of the five LEEs 130 per string shown in FIG. 15. Thus, the lightsheet in this example has a width of about 3×19=57 cm. If each LEE 130 is operated at about 20 mA, then the amount of current required per string per cm is about 20 mA and the current required for the entire sheet per cm is 3×20=60 mA. Power conductor 120 has a width of about 0.9 cm. Assuming power conductor 120 includes or consists essentially of aluminum and has a sheet resistance of 0.04 ohm/sq for a 2.5 μm thickness, it has a resistance of about 0.044 ohm. Power conductor 120 carries current for two string segments, and thus carries 120 mA per string. Thus, the voltage drop in power conductor 120 per cm (or per string) is about 0.0053 V, or a voltage drop per meter of 0.53 V, which may be unacceptably large. In particular, as the lightsheet length increases, the voltage drop in the power conductor reduces the available string voltage down the length of the lightsheet away from the power supply. At some point the available string voltage may not be sufficient to turn on LEEs 130 and operate CEs 140 in a string. This is in addition to power losses in the power conductors that may reduce luminous efficacy. By adding back power conductor 920, a relatively lower resistance current path is added in parallel to power conductor 120. For example, if back power conductor 920 includes or consists essentially of the same material as power conductor 120, but has a width about six times larger than that of power conductor 120, then its resistance and voltage drop reduce proportionately to about 0.007 ohm/sq and about 0.0009 V/cm, respectively.

In some embodiments, back power conductor 920 may include or consist essentially of a different material or set of materials with a lower sheet resistance, or may include or consist essentially of a thicker layer of the same material as power conductor 120. This may result in a further reduction in power conductor power loss. For example, back power conductor 920 may have a thickness of at least about 10 μm or at least about 25 μm or at least about 50 μm or even larger than about 100 μm. In the case where back power conductor 920 has a thickness of about 25 μm, then the voltage drop per cm in the above example would be reduced by a factor of about 10 to about 0.00009 V per cm. In this case, a lightsheet may be made 10 m long with a total voltage drop across back power conductor 920 of only about 0.009 V. It should be noted that the power losses in the power conductors at the edge of the lightsheet are about the same as the losses in the ones in the center, because the edge power conductors have about half the width and thus about twice the resistance, but are carrying about one-half of the current. Thus in this embodiment, the resistive losses are substantially equalized for both size power conductors.

This embodiment of the present invention therefore provides the ability to make lightsheets with three key attributes: (i) very large dimensions, (ii) a single power connection to one end of the lightsheet, and (iii) relatively very low resistive power losses for relatively large lightsheet sizes. The width may be increased by adding additional adjacent segments of strings while the length may be increased by adding more strings between the power conductors. The pitch between LEEs 130 in a string is the same or substantially the same as between adjacent LEEs 130 in adjacent strings and in adjacent string segments—that is, in both the length and width direction of the lightsheet, resulting in the production of substantially uniform illumination from the sheet as a function of area.

The discussion above provides one example of an embodiment of the present invention. The dimensions of and materials used for the power conductors may be modified as discussed above to achieve acceptable power losses and operation for a variety of lightsheet designs and sizes. For example, smaller lightsheet sizes may permit the use of thinner power conductors or less costly materials making up the power conductors, or may permit the elimination of the back power conductors.

Another embodiment of the present invention is a lightsheet or lightsheet web that may be manufactured in large area and then cut to size. As discussed previously, cutting or segmentation of a lightsheet or lightsheet web may occur at various points in the manufacturing process. In some embodiments, lightsheets or lightsheet webs may be inventoried or stored in complete or partially completed form. In some embodiments, lightsheets or lightsheet webs may be segmented in the field. In some embodiments, segmentation may occur after installation, for example to change the size of the lightsheet or to remove and replace a damaged or nonfunctional lightsheet or portion of a lightsheet.

Electrical device 1500 shown in FIG. 15 is one embodiment of a configurable lightsheet. In some embodiments, electrical device 1500 may be manufactured on relatively large sheets or in rolls, for example in a roll-to-roll process. In an embodiment manufactured using roll-to-roll processing, lightsheet web 1500 may have a width for example of about 500 mm, or about 1000 mm or larger. The width of lightsheet web 1500 is not a limitation of the present invention. In an embodiment manufactured using roll-to-roll processing, lightsheet web 1500 may have a length for example of about 100 m, or about 1000 m or about 10,000 m or larger. The length of lightsheet web 1500 is not a limitation of the present invention. Lightsheet web 1500 may be segmented or cut in both the length and width directions. In the length direction, lightsheet web 1500 may be cut or separated between strings 150, resulting in a minimum length increment for lightsheet web 1500 shown in FIG. 15 of one string, which is basically equivalent to the LEE 130 pitch. In the example above this is 1 cm; however LEE 130 pitch is not a limitation of the present invention and in other embodiments LEE 130 pitch may have any value. In the width direction, lightsheet web 1500 may be cut or separated between string segments, for example down the middle of power conductor 120 or 110. This results in a minimum width increment for lightsheet web 1500 shown in FIG. 15 of one string segment, which is basically equivalent to the product of LEE 130 pitch and the number of LEEs 130 per string 150. In the example above, where the string voltage is 60 V, the number of LEEs 130 per string is 20 and with a 1 cm LEE 130 pitch, this makes the minimum width increment about 19 cm. Thus in this example there is relatively finer granularity of the length increment compared to width increment.

As shown in FIG. 15, there is not necessarily a one-to one correspondence between the number of vias 930 and the number of strings in a lightsheet. In one embodiment of the present invention, each power conductor has at least one via 930 for each string 150 attached to that power conductor, such that if lightsheet 1500 is cut or separated between adjacent strings, each section has at least one via 930 electrically coupling the back power conductor to the front power conductor. However, this is not a limitation of the present invention and in other embodiments the number of vias 930 in a given power conductor may be more or less than the number of strings attached to that power conductor. A plurality of vias 930 also provide redundancy; if one via 930 should fail open, the other vias 930 in that conductor can still provide electrical conduction between the front and back with almost no or little increase in resistance.

FIG. 15 also shows one embodiment of the orientation of LEEs 130. In FIG. 15, LEEs 130 in adjacent string segments are oriented in opposite directions. For example in the string in the upper left-hand corner, power conductor 110' provides a positive voltage to which the cathode of LEE 130 is attached. At the end of this string the anode of the last LEE 130 in the string is attached to the return, power conductor 120. In the string just below this one, that is the one in the lower left-hand corner, the positions of LEEs 130 are reversed, such that the anode of the first LEE 130 is attached to power conductor 120 and the cathode of the last LEE 130 in the string is attached to power conductor 110. However, this is not a limitation of the present invention and in other embodiments the orientation and electrical coupling of LEEs 130 may be different.

Figure 16:
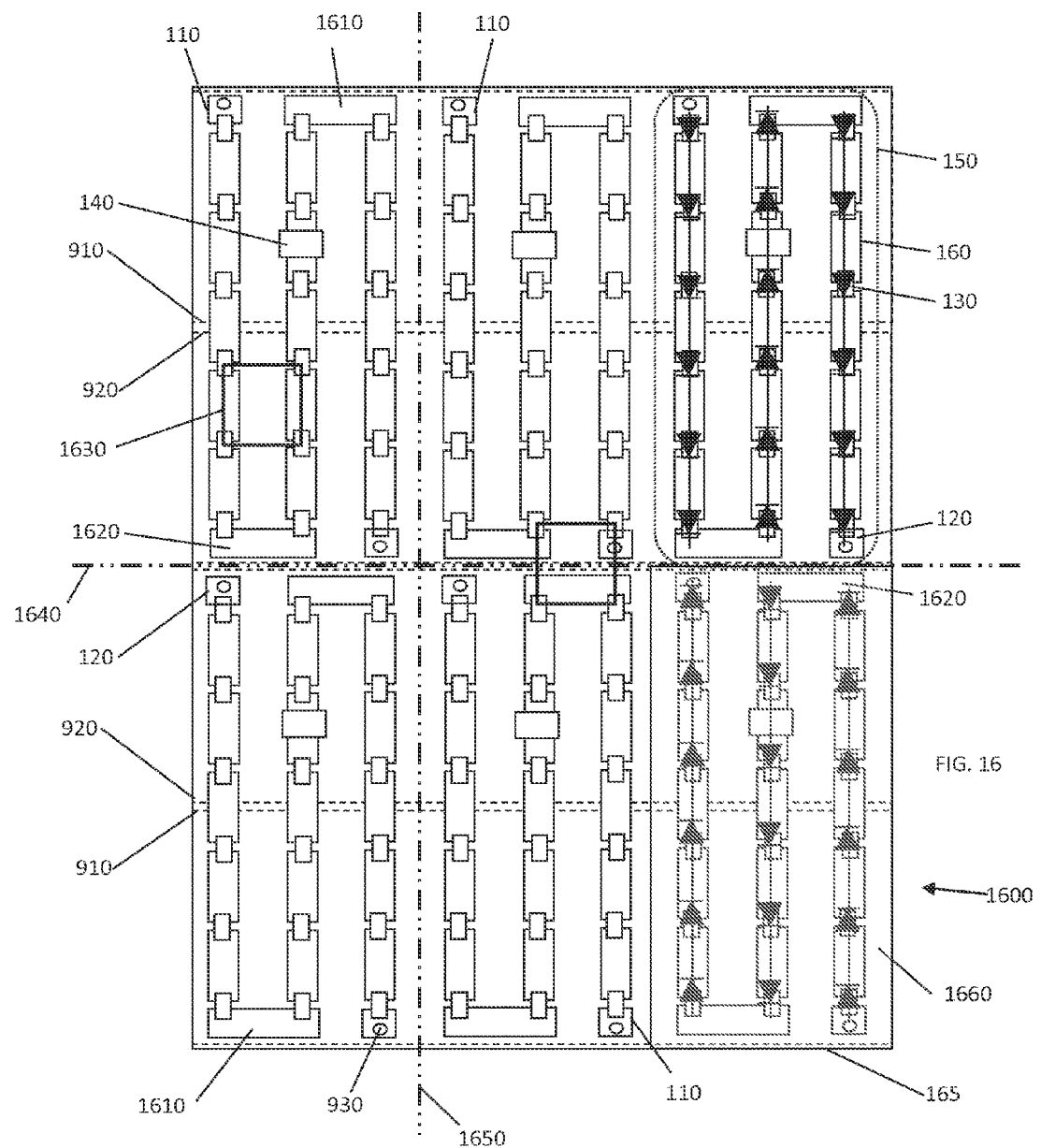

FIG. 16 shows another embodiment of the present invention, electrical device 1600, which is similar to electrical device 1500 of FIG. 15; however, electrical device 1600 features folded strings. The orientation of LEEs 130 in each string segment is shown by the diode symbols overlaid on the schematic of electronic device 1600. The use of folded strings may be advantageous where the desired minimum increment in lightsheet web is less than the straight string length. Electrical device 1600 has multiple strings 150, where each string 150 comprises 18 LEE 130 and a CE 140, and where the strings 150 are divided into two string sections, also referred to as sections. Each string 150 is powered via a connections to power conductor 110 on one end and power conductor 120 on the other end. String segments are connected by power conductors 1610 and 1620. Power conductors 110 and 120 have vias 930 connecting them to back power conductors 910 and 920 respectively. In FIG. 16, back power conductor 920 is divided in half, so that there is no back power conductor 920 material in the region of cutline 1640. In some embodiments, this may simplify separation or cutting of electrical device 1600. However, this is not a limitation of the present invention and in other embodiments back power conductor 920 may not be divided in this manner. The spacing between adjacent conductive elements 160 is not a limitation of the present invention. In some embodiments, the spacing may be relatively larger, resulting in a relatively more narrow conductive element 160, while in other embodiments the spacing may be relatively smaller, resulting in a relatively wider conductive element 160, for a fixed LEE 130 pitch. The example of FIG. 16 also shows that in some embodiments CEs 140 may have any position within strings 150. While FIG. 16 shows one via 930 per power conductors 110 and 120 this is not a limitation of the present invention and in other embodiments power conductors 110 and 120 may have more than one via 930.

The schematic of electrical device 1600 may represent a stand-alone lightsheet, a portion of a stand-alone lightsheet, or all or a portion of a lightsheet web. As shown in FIG. 16, electrical device 1600 may be cut or divided between strings 150 and/or between string sections. Cutline 1650 identifies one location between strings 150 where electrical device 1600 may be cut. In this embodiment, cut lines 1650 are separated by a distance corresponding to about three times the pitch between LEEs 130, because each string 150 has three string segments. In other embodiments, the number of string segments may have any value. Cutline 1640 identifies one possible location between string sections where electrical device 1600 may be cut. In this embodiment, cut lines 1640 are separated by a distance corresponding to about six times the pitch between LEE 130, because each string segment includes six LEEs 130. In other embodiments, the number of LEEs per string segment may have any value. Using the example described above, where the LEE 130 pitch is about 1 cm, this means the minimum size lightsheet is about 3 cm long and about 6 cm wide. This defines a unit cell of lightsheet, shown as the grey area identified as 1660 in FIG. 16. As shown, LEE pitch 1630 is constant or substantially constant between adjacent LEEs 130 whether they are in one string, in adjacent string segments, or in adjacent string sections.

This structure provides a useful advantage. Instead of having to design and manufacture lightsheets of many different shapes and sizes, a lightsheet web may be manufactured in very large volumes and then cut to the required sizes. Such cutting may be done during manufacture, after manufacture or in the field. In some embodiments, lightsheet web may be shipped to storage or distribution sites and cut to order. In some embodiments, lightsheet web may be shipped to a job site and cut to order. The minimum lightsheet size is determined by unit cell 1660 size, as described above. The unit cell may be made relatively small, permitting relatively fine control of the final lightsheet size and shape. Using the values from the above example, the unit cell is about 3 cm by about 6 cm, i.e., the minimum length increment is about 3 cm and the minimum width increment is about 6 cm. In other embodiments, the number of LEEs 130 per string 150 and the configuration of string 150, for example a straight string, or how the string is folded, permit variation of the size of unit cell 1660 and thus of the minimum length and width increments.

Just as electrical device 1600 may be cut or separated into unit cell segments, multiple segments or lightsheets may be tiled together in the length or width or both length and width directions without any change in pitch across the joint between adjacent segments or lightsheets. This permits fabrication, both at the manufacture site, and in the field, of relatively large illuminated areas comprising multiple lightsheets, with no change in LEE 130 pitch or optical characteristics across the joint.

Figure 17:
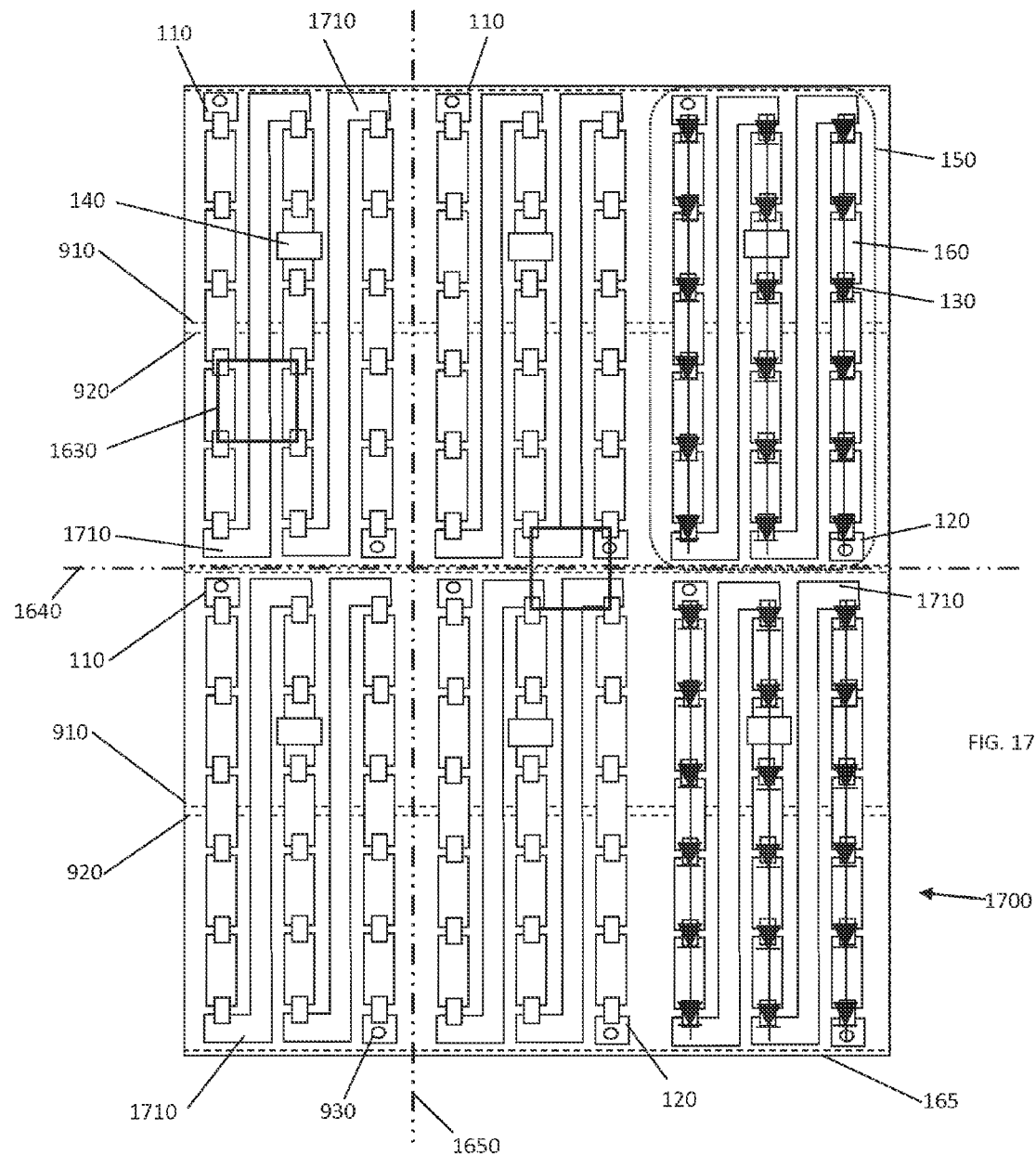

FIG. 17 shows another embodiment of the present invention, electrical device 1700, which is similar to electrical device 1600 shown in FIG. 16; however, in the case of electrical device 1700, each string 150 includes one or more string segments that do not comprise LEEs 130. As indicated by the diode symbols overlaid on the schematic of electronic device 1700, this permits all LEEs 130 to have the same orientation in all string segments, in contrast to electrical device 1600 shown in FIG. 16. Furthermore, the back power conductors in electrical device 1700 have been positioned such that all LEEs 130 in the different string segments have the same orientation. In some embodiments, this may simplify the positioning and formation of LEEs 130 on substrate 165.

In some embodiments of the present invention, all or portions of the front and/or back of the lightsheet may be covered by a cover layer or material. In some embodiments, the cover layer may include or consist essentially of an insulating layer, for example to prevent electrical contact with conductive elements 160, power conductors 110, 120 and/or back power conductors 910, 920. In some embodiments, the insulating material may include or consist essentially of, e.g., one or more layers formed over the back or front. Such layers may include or consist essentially of a material the same as or similar to that of substrate 165, e.g., PET, PEN, polyimide, polyester, acrylic or the like. In some embodiments, the insulating material may include or consist essentially of, for example, silicone, silicon oxide, silicon dioxide, silicon nitride or the like. In some embodiments, the insulating material may comprise an ink, where the ink may have one or a plurality of colors or markings. In some embodiments the insulating material comprises a white ink. In some embodiments, the insulating material may be a separate layer adhered to the lightsheet, for example using glue or adhesive or tape. In some embodiments, the insulating material may be formed over the lightsheet by, for example, spray coating, dip coating, printing, sputtering, evaporation, chemical vapor deposition or the like. In some embodiments, the insulating layer may be patterned and a portion of the insulating layer removed to permit access to a portion of the underlying lightsheet. In some embodiments, the insulating layer may be patterned such that it does not cover LEEs 130. In some embodiments, patterning may be achieved by selective deposition, for example, selective spray coating, or by patterning and etching or removal of portions of the insulating layer. In some embodiments, the cover layer may have additional properties, for example, to provide flame resistance or to provide a reflective or light-absorbing surface. In some embodiments, a front cover material is reflective to a wavelength of light emitted by LEEs 130. In some embodiments, the front cover material is white. In some embodiments, the back cover layer is black.

Figure 18:
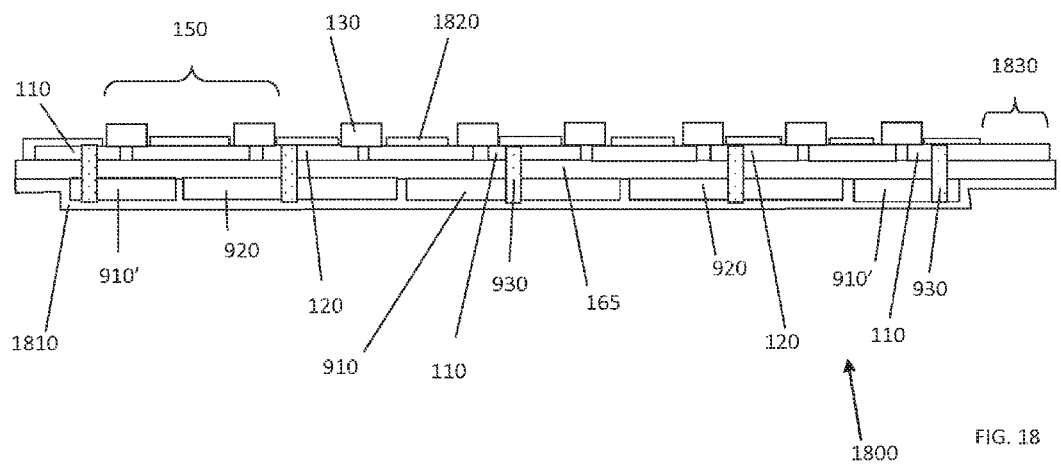
FIG. 18 is a schematic cross-section of a lighting system in accordance with various embodiments of the invention.

FIG. 18 is a cross-section of an exemplary electrical device 1800. Electrical device 1800 features a back cover layer 1810 and a front cover layer 1820. In the embodiment shown in FIG. 18, back cover layer 1810 covers the entire backside of electrical device 1800; however, this is not a limitation of the present invention and in other embodiments portions of the backside of electrical device 1800 may be exposed. In the embodiment shown in FIG. 18, front cover layer 1820 covers portions of electrical device 1800, leaving LEEs 130 as well as a portion 1830 of a power conductor 110 exposed. Portion 1830 of power conductor 110 may be used, for example, to provide electrical coupling to electrical device 1800. However, this is not a limitation of the present invention, and in other embodiments all of the front of electrical device may be covered by front cover layer 1820. In some embodiments all or a portion of LEEs 130 may be covered by front layer 1820. In some embodiments, electrical connection to electrical device 1820 may be made by piercing or scraping away a portion of front cover layer 1820 and/or back cover layer 1810. In some embodiments, such removal of portions of the cover layers may occur during application of a connector or wire or other means of electrical connection to electrical device 1800. In some embodiments, the front and/or back cover layers are formed using printed ink. In some embodiments, the front cover layer includes or consists essentially of white ink. In some embodiments, the back cover layer includes or consists essentially of black ink. Each lightsheet may be electrically coupled to a power source or to an adjacent lightsheet. In one embodiment, a first set of power conductors 110, 120 on a first lightsheet are electrically coupled to a second set of power conductors 110, 120 on a second lightsheet. Forming an electrical connection to a power conductor on a lightsheet may be done using a variety of techniques; the means of electrical connection is not a limitation of the present invention.

Figure 19:
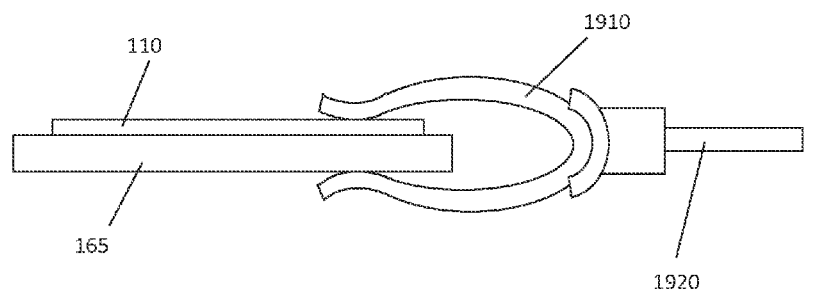
FIG. 19 is a schematic illustration of a connector for a lighting system in accordance with various embodiments of the invention.

In one embodiment, electrical connection to a power conductor on a lightsheet is made using a crimp connector 1910 (where the crimp connector is pressed against power conductor 110 and substrate 165 such that it makes an electrical connection), as shown in FIG. 19. The crimp connector 1910 may be electrically coupled to a wire 1920, wiring harness, printed circuit board or the like. In one embodiment, crimp connector 1910 includes or consists essentially of a crimp connector such as an Etco crimp part number 51608.

One or more lightsheets may be powered from a power supply, for example a constant-voltage or constant-current power supply. In some embodiments, the input power for the power supply may be line voltage, for example 120 AC, 240 VAC, 277 VAC with a frequency of, for example, 50 Hz or 60 Hz. In some embodiments, the power supply may include or consist essentially of a universal power supply capable of accommodating a relatively wide range of input voltages and frequencies. In some embodiments, the input power for the power supply may be a DC voltage. The input power for the power supply is not a limitation of the present invention and in other embodiments any input power may be used.

Figure 20:
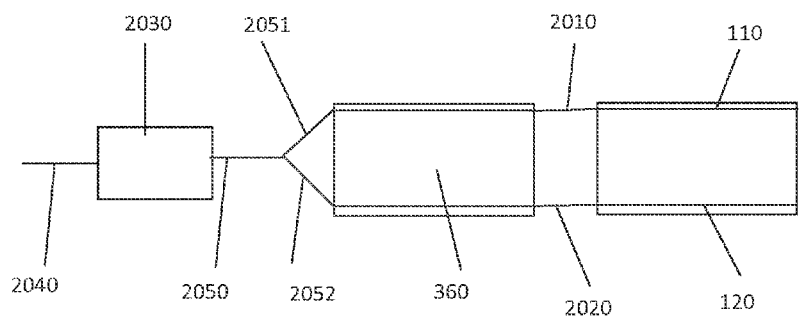
FIGS. 20, 21A, 21B, and 22A are schematic illustrations of a lighting system in accordance with various embodiments of the invention.

FIG. 20 is a schematic of an exemplary lighting system in accordance with embodiments of the present invention and that includes or consists essentially of a power supply 2030 with input power 2040, and one or more lightsheets 360, where power supply 2030 has an output 2050 that optionally may split into two conductors 2051 and 2052 that are electrically coupled to power conductors 110 and 120 respectively. In some embodiments, an advantage of this approach is that one power supply 2030 may provide power to one or more lightsheets, independent of the number of strings 150 on the lightsheet and/or independent of the number of lightsheets electrically connected in series. In some embodiments, the power capacity of power supply 2030 may be varied to match that of different lightsheets. For example, in some embodiments, lightsheet 360 may have 40 strings, each string operating at nominally 5 mA. In this example each lightsheet utilizes about 200 mA of current. If the constant voltage is about 60 volts, then the lightsheet utilizes about 12 watts. If one lightsheet is connected to the power supply, then the power supply should provide at least 12 watts. If two lightsheet are connected to the power supply in series, then the power supply should provide at least 24 watts. In this way it is relatively straightforward to determine the power levels required to support any one or combination of lightsheets. In some embodiments, one or a small number of power supplies may be able to provide power to a relatively large number of configurations of lightsheets, thus advantageously reducing the number of power supplies required to be manufactured and/or stocked.

Figure 21A:
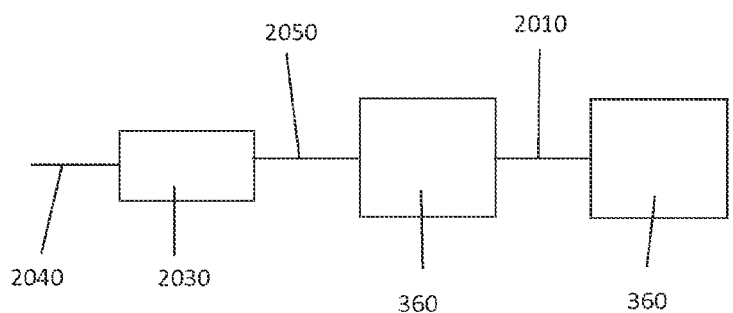
Figure 21B:
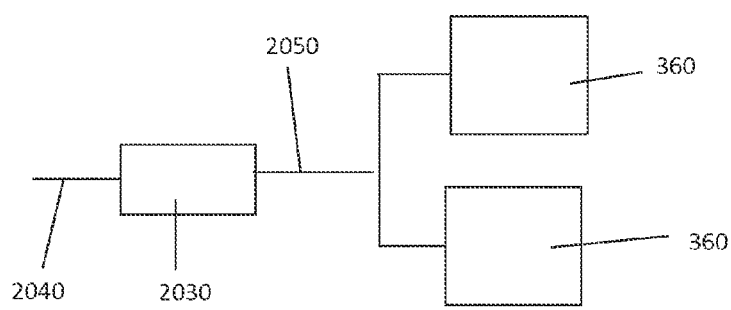

FIGS. 21A and 21B show other exemplary embodiments of lighting systems in accordance with embodiments of the present invention that include or consist essentially of power supply 2030 with input power 2040, and one or more lightsheets 360. In FIG. 21A lightsheets 360 are in a series configuration, while in FIG. 21B lightsheets 360 are in a parallel configuration. While the examples shown in FIGS. 20, 21A, and 21B depict two lightsheets 360, this is not a limitation of the present invention and in other embodiments the lighting system may include one lightsheet 360 or more than two lightsheets 360. While the examples shown in FIGS. 20, 21A, and 21B show one power supply 2030, this is not a limitation of the present invention and in other embodiments the lighting system may feature multiple power supplies 2030. While the examples shown in FIGS. 20, 21A, and 21B show the lightsheets 360 electrically coupled by additional conductors, for example 2010 and 2020 in FIG. 20 or 2010 in FIG. 21A, this is not a limitation of the present invention and in other embodiments multiple lightsheets 360 are tiled together, as described above, and electrically coupled together without the use of additional wires. In such embodiments a variety of means of electrical coupling may be used, for example including crimp connectors, ZIF connectors, edge connectors, electrically coupling rivets or staples, conductive adhesives or glues, conductive tapes, adhesives, glues, tapes, or the like.

In some embodiments, the light intensity or light output power of the lighting system, for example as shown in FIGS. 20, 21A, and 21B, may be adjustable or may be dimmed. In one embodiment, the light output power of the lighting system may be adjusted by modulating the output power from power supply 2030. In one embodiment, the light output power of the lighting system may be adjusted by pulse width modulating the output power from power supply 2030.

In some embodiments, LEEs 130 of one or more lightsheets are of the same type. In some embodiments, LEEs 130 of one or more lightsheets may be different. In some embodiments, the lightsheet may include multiple different types of LEEs 130. For example, different types of LEEs 130 may include different size LEEs 130 or LEEs 130 that have different electrical or optical characteristics, such as emission wavelength, forward voltage, and/or spectral power distribution. In some embodiments, a string 150 may include multiple LEEs 130 of the same type; however, this is not a limitation of the present invention and in other embodiments the string 150 may include more than one type of LEE, for example LEEs that emit light at different wavelengths or with different spectral power distributions or have different sizes. In some embodiments, the lightsheet may include multiple strings 150, where each string 150 includes or consists essentially of multiple LEEs 130 of the same type; however, this is not a limitation of the present invention and in other embodiments the lightsheet many include multiple strings 150 where each string 150 may include or consist essentially of more than one type of LEE, for example LEEs that emit light at different wavelengths or with different spectral power distributions or have different sizes. The number of different types of LEEs 130 or lightsheets of a lighting system is not a limitation of the present invention. The number of different types of lightsheets of the lighting system is not a limitation of the present invention. In some embodiments, the lighting system may include a combination of bare-die LEEs 130 and packaged LEDs 130.

In some embodiments, a lightsheet, lightsheet web or lightsheet-based illumination system may also include one or more control elements that permit control of LEEs 130 within a string 150, individual strings 150 and/or one or more groups of strings 150. Such control may be implemented within one lightsheet or group of lightsheets, for example, lightsheets that are tiled together. These control elements may be used for a variety of purposes. For example, in some embodiments, strings may be individually or group-wise addressed and controlled to provide a range of light levels, for example to implement dimming functionality. In one embodiment, this may be implemented by turning one or more strings off to reduce the overall light output level. In one embodiment this may be implemented by changing the drive current level to LEEs 130 within one or more strings 150. In one embodiment this may be implemented by pulse-width-modulating the power, e.g., the current or voltage, to LEEs 130 within one or more strings 150.

In some embodiments, different strings 150 may include one or more different types of LEEs 130, for example, having different color temperatures or light distribution patterns. In this way one or more optical characteristics of the lightsheet or illumination system may be changed by selective activation and deactivation of one or groups of strings 150, or by changing the drive current to one or more groups of strings 150.

Figure 22A:
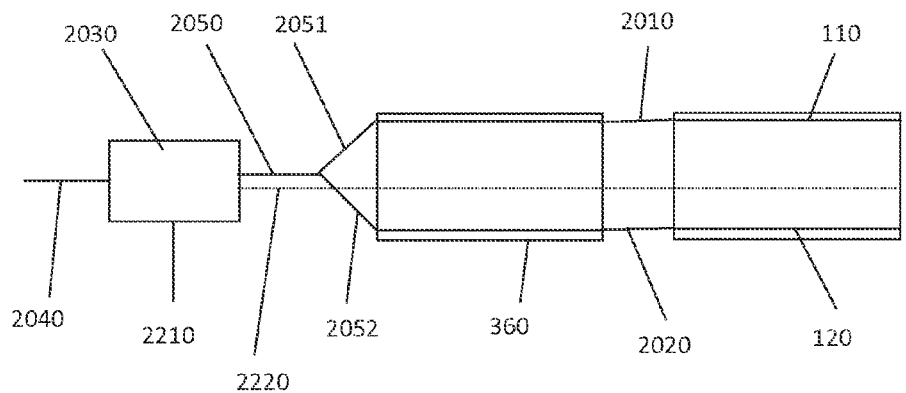

FIG. 22A shows another embodiment of the present invention, similar to that shown in FIG. 20; however the embodiment in FIG. 22A features control input 2210 and control channel 2220. In some embodiments, control input 2210 and control channel 2220 may be used to control one or more characteristics of lightsheets 360, for example light intensity, dimming, color temperature, light distribution pattern, or the like. In some embodiments, control input 2210 and control channel 2220 may be used to selectively address and activate and deactivate one or more strings 150 or lightsheets 360. For example, a lightsheet 360 may comprise a plurality of strings or a plurality of groups of strings 150, where each string has LEEs 130 with different characteristics, for example light output power, color temperature, color rendering index, light distribution patterns or the like, and control input 2210 and control channel 2220 may be used to selectively activate, deactivate, or partially power one or more strings 150 or groups of strings 150.

In some embodiments, control input 2210 may be applied to power supply 2030 as shown in FIG. 22A; however, this is not a limitation of the present invention and in other embodiments control input 2210 may be applied directly to lightsheets 360 or may be applied to lightsheets 360 through power supply 2030 or one or more intermediate systems (not shown). In some embodiments, control input 2210 and control channel 2220 may comprise one conductor, while in other embodiments control input 2210 and control channel 2220 may comprise a plurality of conductors. In some embodiments, control input 2210 and control channel 2220 may carry one signal, while in other embodiments control input 2210 and control channel 2220 may carry a plurality of signals. In some embodiments, control input 2210 and control channel 2220 may act on or control all strings 150 within one or more lightsheets 360 simultaneously, while in other embodiments control input 2210 and control channel 2220 may independently control each or a plurality of strings 150 within one or more lightsheets 360. In some embodiments, each lightsheet 360 and/or each string 150 may be separately identifiable or addressed so as to permit individual control of each lightsheet 360 and/or each string 150.

Figure 22B:
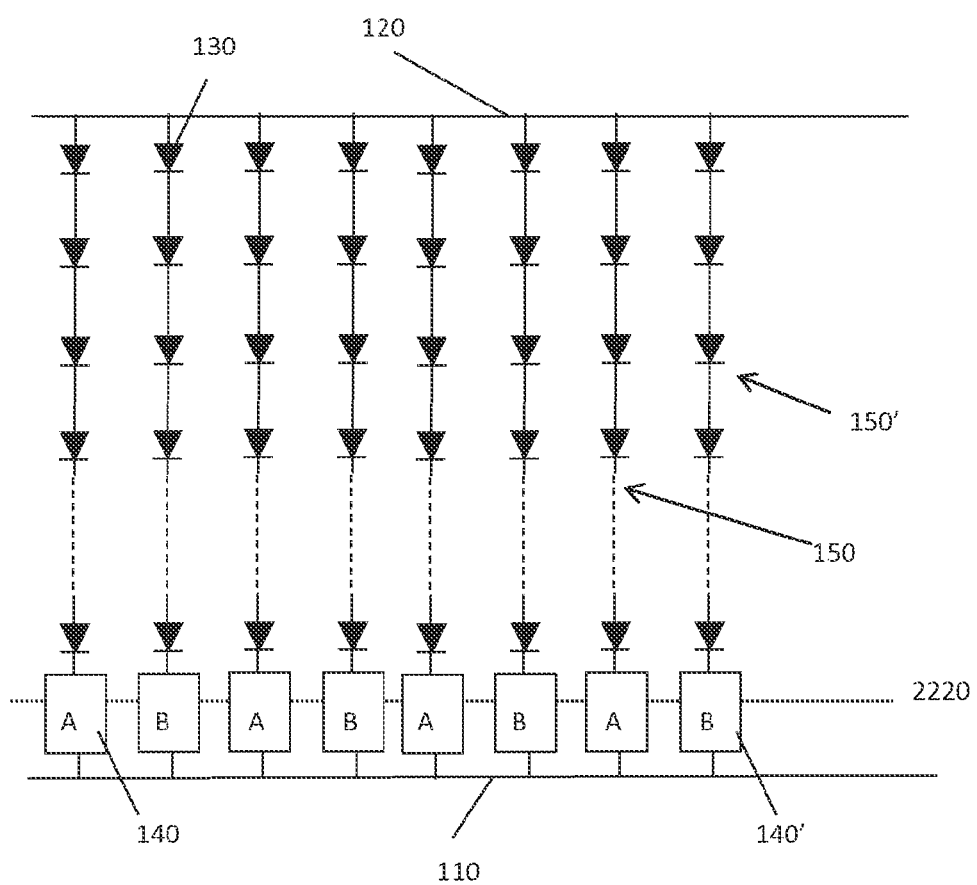
FIG. 22B is a schematic circuit diagram of a lighting system in accordance with various embodiments of the invention.
Figure 23:
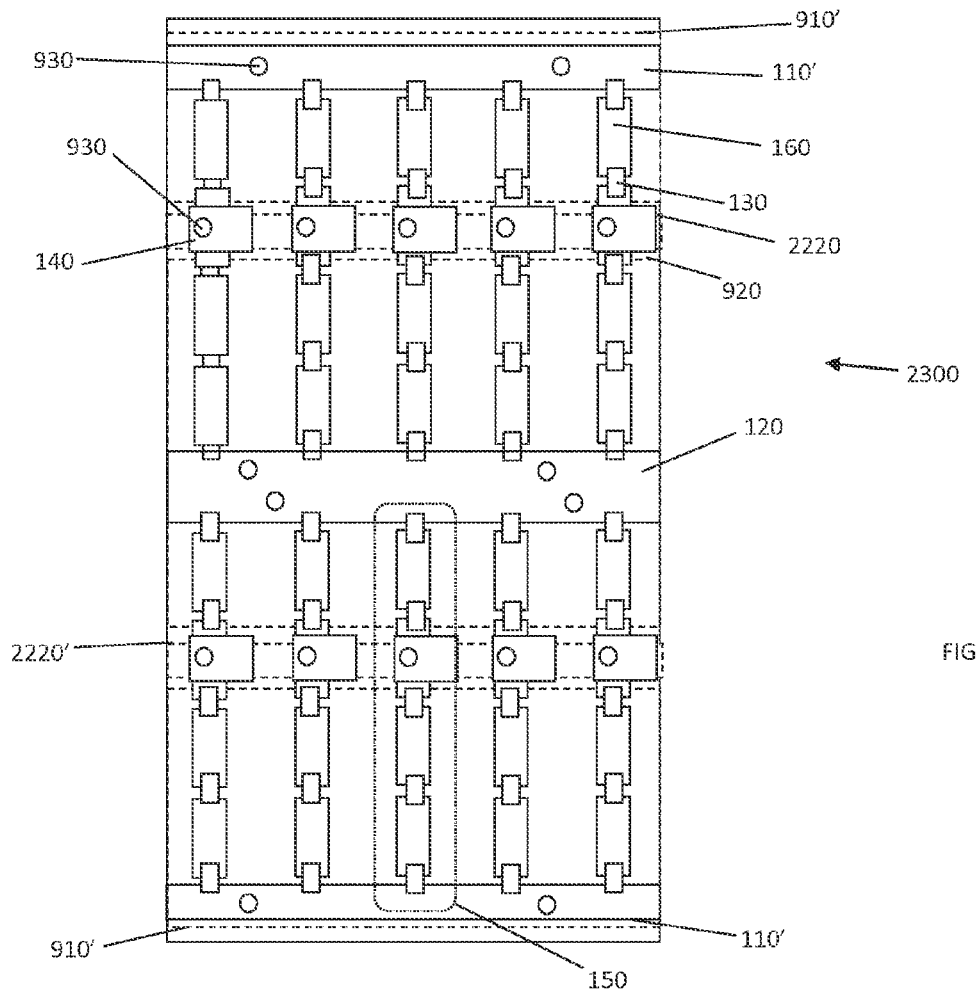
FIG. 23 is a schematic illustration of a lighting system in accordance with various embodiments of the invention.

FIG. 22B is a schematic of a lightsheet or a portion of a lightsheet having two groups of strings 150, identified as 150 and 150'. Control elements 140 are associated with strings 150 and have an address A, while control elements 140 associated with strings 150' are identified as 140' and have an address B. In one embodiment, strings 150 and 150' have different optical characteristics, for example color temperature, CRI, light output power, or the like. In one embodiment, control channel 2220 provides a signal that addresses strings 150 and 150' separately, telling each group when to activate and when to deactivate. In one embodiment, the drive currents to strings 150 and/or 150' are fixed and control channel 2220 only acts to activate or deactivate the strings. In one embodiment, control channel 2220 carries information related to drive current, and thus is able to not only activate or deactivate groups of strings 150 and 150', but to independently change the drive current to groups of strings 150 and 150'. In one embodiment, control channel 2220 carries information related to the power to LEEs 130, and thus is able to not only activate or deactivate groups of strings 150 and 150', but also to independently change the power to groups of strings 150 and 150', e.g., by modulation of the voltage and/or current. In some embodiments, each string 150 has its own address and thus is able to be controlled independently of all other strings 150. In some embodiments, a lighting system may comprise a plurality of lightsheets, where each lightsheet has a plurality of groups of independently addressable and controllable strings. In some embodiments, the plurality of groups of independently addressable and controllable strings are the same on each of the plurality of lightsheets in the system, while in other embodiments the groups of independently addressable and controllable strings are different on one or more of the plurality of lightsheets in the system, FIG. 23 is a schematic of an electrical device 2300 that includes control channels 2220 and 2220' that are formed on the back of electrical device 2300 and are electrically coupled to control elements 140 through vias 930. In some embodiments, control channel 2220 and 2220' may be the same, while in other embodiments control channel 2220 and control channel 2220' may be different. While FIG. 23 shows two control channels 2220, this is not a limitation of the present invention and in other embodiments electrical device 2300 may feature more than two control channels 2220. While FIG. 23 shows control channels 2220 on the back of electrical device 2300, this is not a limitation of the present invention and in other embodiments control channels may be on the front of electrical device 2300 or may be on both the back and front of electrical device 2300.

Figure 24:
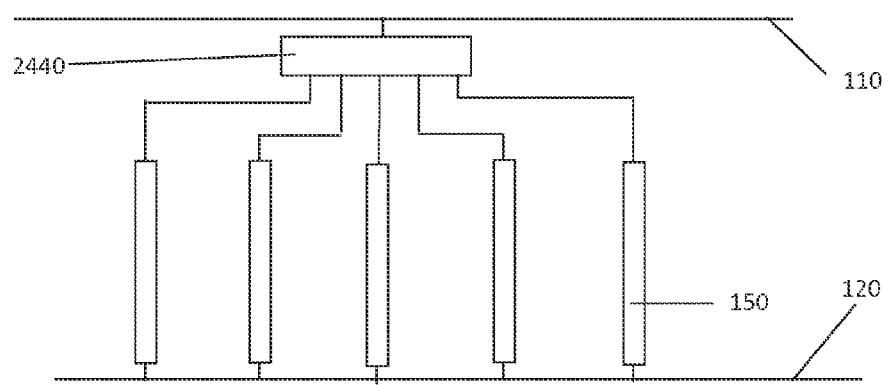
FIG. 24 is a schematic illustration of a lighting system in accordance with various embodiments of the invention.

FIG. 24 shows an example of an embodiment of the present invention that features strings 150 electrically coupled to power conductors 110 and 120 and a control element 2440 that comprises multiple control elements 140. In some embodiments, control element 2440 may comprise multiple control elements 140 integrated in a monolithic or hybrid form on one or a plurality of semiconductor chips. In some embodiments the structure shown in FIG. 24 may optionally include control input 2210 and/or control channel 2220. In some embodiments, control element 2440 may include additional circuitry to permit addressing or control of strings 150.

As described above, lightsheet 360 may have conductive traces on the front, back or both sides. In some embodiments, it may be desirable to have separate conductive traces cross each other without electrical coupling between the two conductive traces but not have conductive traces on both sides of lightsheet 360. In this case cross-over elements may be employed as shown in FIGS. 25A and 25B, which depict a crossover element 2550 that electrically couples conductive elements 160 and 160' together and bridges conductive element 160". Conductive element 2550 may include a base 2520 over which is formed a conductive layer 2510 and optional pads 2530. In other embodiments, conductive element 2550 may be formed of a single conductive material. In some embodiments, base 2520 may be insulating, and may therefore include or consist essentially of, for example, sapphire, glass, plastic, or the like. In some embodiments, base 2520 may include or consist essentially of a semiconductor such as silicon, gallium arsenide, gallium phosphide, or the like. In some embodiments, conductive layer 2510 may include or consist essentially of one or more metals such as silver, copper, gold, aluminum, chromium, tungsten, titanium, or the like. The specific configuration of conductive element 2550 is not a limitation of the present invention. In some embodiments pads 2530 may be bond pads or stud bumps. In some embodiments, pads 2530 may include or consist essentially of one or more conductive materials, e.g., metals such as gold.

While the discussion above related to control signals has used control lines on the lightsheet to deliver the control signals to the control elements, this is not a limitation of the present invention and in other embodiments control signals may be delivered to control elements by any means, for example using light-based communication, radio-based communication, Wi-Fi, or communication using radiation in other parts of the electromagnetic spectrum.

While the discussion above has focused on one-way control, that is the use of control signals to effect changes on the lightsheet, this is not a limitation of the present invention and in other embodiments communication may be bidirectional. For example, in some embodiments LEEs, 130, strings 150, or the lightsheet may communicate information back to a control system. Examples of such information may include lightsheet or LEE 130 temperature, light output value, operation time, lumen degradation, color temperature, or the like.

Control input 2210 may be provided in a variety of ways. In one embodiment, control input 2210 may be provided from a switch or knob that is actuated manually. In one embodiment, control input 2210 may originate from another system, for example, one that is used to control lighting within the space. In one embodiment, control input 2210 may originate in a building management system, for example, one that controls heating or lighting or emergency operations or the like. In one embodiment, control input 2210 may originate in a portable or wireless device, for example a mobile phone, computer, tablet, or the like. In one embodiment, control input 2210 may originate from a sensor system, for example, one that senses ambient light, occupancy, heat, humidity, smoke or the like. In one embodiment, sensors that act to provide control input 2210 may be positioned on the lightsheet or within the luminaire containing the lightsheet or they may be positioned elsewhere.

While the discussion above related to control signals has used control lines on the lightsheet to deliver the control signals to the control elements to control aspects of the lightsheet, this is not a limitation of the present invention and in other embodiments control signals may be provided for other purposes, for example, to act as a receiving and transmitting center for wireless signals for tablets, computers, telephones, mobile phones and other such electronic devices. Such communication signals may take place over any portion of the electromagnetic spectrum, for example IR, visible light, UV, radio waves, etc.

As utilized herein, the term "light-emitting element" (LEE) refers to any device that emits electromagnetic radiation within a wavelength regime of interest, for example, visible, infrared or ultraviolet regime, when activated, by applying a potential difference across the device or passing a current through the device. Examples of light-emitting elements include solid-state, organic, polymer, phosphor-coated or high-flux LEDs, laser diodes or other similar devices as would be readily understood. The emitted radiation of an LEE may be visible, such as red, blue or green, or invisible, such as infrared or ultraviolet. An LEE may produce radiation of a continuous or discontinuous spread of wavelengths. An LEE may feature a phosphorescent or fluorescent material, also known as a light-conversion material, for converting a portion of its emissions from one set of wavelengths to another. In some embodiments, the light from an LEE includes or consists essentially of a combination of light directly emitted by the LEE and light emitted by an adjacent or surrounding light-conversion material. An LEE may include multiple LEEs, each emitting essentially the same or different wavelengths. In some embodiments, a LEE is an LED that may feature a reflector over all or a portion of its surface upon which electrical contacts are positioned. The reflector may also be formed over all or a portion of the contacts themselves. In some embodiments, the contacts are themselves reflective. Herein "reflective" is defined as having a reflectivity greater than 65% for a wavelength of light emitted by the LEE on which the contacts are disposed. In some embodiments, an LEE may include or consist essentially of an electronic device or circuit or a passive device or circuit. In some embodiments, an LEE includes or consists essentially of multiple devices, for example an LED and a Zener diode for static-electricity protection. In some embodiments, an LEE may include or consist essentially of a packaged LED, i.e., a bare LED die encased or partially encased in a package. In some embodiments, the packaged LED may also include a light-conversion material. In some embodiments, the light from the LEE may include or consist essentially of light emitted only by the light-conversion material, while in other embodiments the light from the LEE may include or consist essentially of a combination of light emitted from an LED and from the light-conversion material. In some embodiments, the light from the LEE may include or consist essentially of light emitted only by an LED.

One or more non-LEE devices such as Zener diodes, transient voltage suppressors (TVSs), varistors, etc., may be placed on each lightsheet to protect the LEEs 130 from damage that may be caused by high-voltage events, such as electrostatic discharge (ESD) or lightning strikes. In one embodiment, conductive trace segments shown in FIG. 1B between the LEE strings 150 may be used for placement of a single protection device per lightsheet, where the device spans the positive and negative power traces, for example power conductors 110, 120. These trace segments also serve to provide a uniform visual pattern of lines in the web direction, which may be more aesthetically pleasing than a lightsheet with noticeable gaps between LEE strings 150. In a more general sense, in addition to conductive traces 160 that are part of string 150, additional conductive traces 160 that may or may not be electrically coupled to other strings 150 and/or power conductors 110, 120 may be formed on substrate 165, for example to provide additional power conduction pathways or to achieve a decorative or aesthetically pleasing look to the pattern on the lightsheet or to provide a communication pathway to one or more CEs 140, for example to provide a control signal to the one or more CEs 140. These trace segments also serve to provide a uniform visual pattern of lines in the web direction, which may be more aesthetically pleasing than a lightsheet with noticeable gaps between LEE strings 150.

In one embodiment, an LEE 130 includes or consists essentially of a bare semiconductor die 2600, a schematic example of which is shown in FIG. 26, which may include a substrate 2610 with one or more semiconductor layers 2620 disposed thereover. In an exemplary embodiment, LEE 130 represents an LEE such as an LED or a laser, but other embodiments of the invention feature one or more semiconductor dies with different or additional functionality, e.g., processors, sensors, detectors, photovoltaic cells, control elements, and the like. Non-LEE dies may or may not be bonded as described herein, and may or may not have contact geometries differing from those of the LEEs; moreover, they may or may not have semiconductor layers disposed over a substrate as discussed below. Substrate 2610 may include or consist essentially of one or more semiconductor materials, e.g., silicon, GaAs, InP, GaN, and may be doped or substantially undoped (e.g., not intentionally doped). In some embodiments, substrate 2610 includes or consists essentially of sapphire or silicon carbide; however, the composition of the substrate is not a limitation of the present invention. Substrate 2610 may be substantially transparent to a wavelength of light emitted by the LEE 130 and/or light-conversion material 2710 (see FIG. 27). The semiconductor layers 2620 may include or consist essentially of first and second doped layers 2630, 2650 that are preferably doped with opposite polarities (i.e., one n-type doped and the other p-type doped). One or more light-emitting layers, e.g., or one or more quantum wells 2640, may be disposed between layers 2630 and 2650. Each of layers may include or consist essentially of one or more semiconductor materials, e.g., silicon, InAs, AlAs, GaAs, InP, AlP, GaP, InSb, GaSb, AlSb, GaN, AlN, InN, and/or mixtures and alloys (e.g., ternary or quaternary, etc. alloys) thereof. In preferred embodiments, LEE 130 is an inorganic, rather than a polymeric or organic, device.

As used herein, wavelength-conversion material or phosphor refers to any material that shifts the wavelengths of light irradiating it and/or that is fluorescent and/or phosphorescent, is utilized interchangeably with the terms "light-conversion material" or "phosphor," and may refer to only a powder or particles or to the powder or particles with a binder. In some embodiments, the phosphor includes or consists essentially of a mixture of one or more wavelength-conversion materials and a matrix material. The wavelength-conversion material is incorporated to shift one or more wavelengths of at least a portion of the light emitted by the light emitter to other desired wavelengths (which are then emitted from the larger device alone or color-mixed with another portion of the original light emitted by the die). A wavelength-conversion material may include or consist essentially of phosphor powders, quantum dots or the like within a transparent matrix. Phosphors are typically available in the form of powders or particles, and in such case may be mixed in binders, e.g., silicone. Phosphors vary in composition, and may include lutetium aluminum garnet (LuAG or GAL), yttrium aluminum garnet (YAG) or other phosphors known in the art. GAL, LuAG, YAG and other materials may be doped with various materials including for example Ce, Eu, etc. The phosphor may be a plurality of individual phosphors. The specific components and/or formulation of the phosphor and/or matrix material are not limitations of the present invention.

The binder may also be referred to as an encapsulant or a matrix material. In one embodiment the binder includes or consists essentially of a transparent material, for example a silicone-based material or epoxy, having an index of refraction greater than 1.35. In one embodiment, the phosphor includes other materials, for example $SiO_2$, $Al_2O_3$, fumed silica or fumed alumina, to achieve other properties, for example to scatter light, to change the viscosity or to reduce settling of the powder in the binder. An example of the binder material includes materials from the ASP series of silicone phenyls manufactured by Shin Etsu, or the Sylgard series manufactured by Dow Corning.

In some embodiments, substantially all or a portion of substrate 2610 is removed prior to or after the bonding of LEE 130 described below. Such removal may be performed by, e.g., chemical etching, laser lift-off, mechanical grinding and/or chemical-mechanical polishing or the like. In some embodiments all or a portion of substrate 2610 is removed and a second substrate—e.g., one that is transparent to or reflective of a wavelength of light emitted by LEE 130—is attached to the substrate or semiconductor layer 2620 prior to or after the bonding of LEE 130 as described below. In some embodiments substrate 2610 includes or consists essentially of silicon and all or a portion of the silicon substrate may be removed prior to or after the bonding of LEE 130 described below. Such removal may be performed by, e.g., chemical etching, laser lift off, mechanical grinding and/or chemical-mechanical polishing or the like.

Electrical contact to LEE 130 may be achieved through contacts 2670 and 2680, which may make contact to the p- and n-layers 2650, 2630 respectively. LEE 130 may optionally feature a mirror or reflective surface 2660 formed over all or portions of layer 2650 and optionally other portions of LEE 130. Mirror 2660 may act to direct light emitted from light-emitting layer 2640 back towards and out of the substrate 2610, particularly in a flip-chip configuration where LEE 130 is mounted contact side down.

In some embodiments, LEE 130 has a square shape, while in other embodiments LEE 130 has a rectangular shape. In some preferred embodiments, to facilitate bonding (as described below) LEE 130 has a shape with a dimension in one direction that exceeds a dimension in an orthogonal direction (e.g., a rectangular shape), and has an aspect ratio of the orthogonal directions (length to width, in the case of a rectangular shape) of LEE 130 greater than about 1.2:1. In some embodiments, LEE 130 has an aspect ratio greater than about 2:1 or greater than 3:1. The shape and aspect ratio are not critical to the present invention, however, and LEE 130 may have any desired shape.

In some embodiments, LEE 130 has one lateral dimension less than 500 μm. Exemplary sizes of semiconductor die 2610 may include about 250 μm by about 600 μm, about 250 μm by about 400 μm, about 250 μm by about 300 μm, or about 225 μm by about 175 μm. In some embodiments, LEE 130 includes or consists essentially of a small LED die, also referred to as a "microLED." A microLED generally has one lateral dimension less than about 300 μm. In some embodiments, semiconductor die 2610 has one lateral dimension less than about 200 μm or even less than about 100 μm. For example, a microLED may have a size of about 225 μm by about 175 μm or about 150 μm by about 100 μm or about 150 μm by about 50 μm. In some embodiments, the surface area of the top surface of a microLED is less than 50,000 $μm^2$ or less than 10,000 $μm^2$. However, the size of LEE 130 is not a limitation of the present invention and in other embodiments LEE 130 may have any size. For example, in some embodiments LEE 130 may have one lateral dimension of about 1 mm or about 2 mm. In some embodiments, LEE may include or consist essentially of a relatively large high-power packaged LEE, for example a relatively large high-power LED, for example with an input power of about 1 W, about 3 W, or 10 W or larger.

In some embodiments, LEE 130 may include or consist essentially of a "white die" that includes an LED that is integrated with a light-conversion material (e.g., a phosphor) before being attached to the lightsheet. An exemplary schematic of a white die 2700 is shown in FIG. 27. As shown, white die 2700 includes a die 2720 that is partially covered or encased in a light-conversion material 2710. All or portions of contacts 2670, 2680 may be exposed to provide for electrical contact to die 2720. In some embodiments die 2720 is a bare LED, such as that shown and described in reference to FIG. 26.

In some embodiments, white die 2700 is formed by forming the light-conversion material 2710 over and/or around multiple dies 2720 and then separating this structure into individual white dies as shown in FIG. 27 and as described in U.S. Provisional Patent Application No. 61/589,908, filed Jan. 24, 2012, the entire disclosure of which is incorporated by reference herein. FIG. 27 depicts one die 2720 associated with light-conversion material 2710, but this is not a limitation of the present invention and in other embodiments multiple dies 2720 are associated with the same surrounding light-conversion material 2710. FIG. 27 shows light-conversion material 2710 having a square or rectangular shape; however, this is not a limitation of the present invention and in other embodiments light-conversion material 2710 has a hemispherical or substantially hemispherical shape, a parabolic or substantially parabolic shape, or any shape. FIG. 27 shows substantially the same thickness of light-conversion material 2710 over the top and sidewalls of die 2720; however, this is not a limitation of the present invention and in other embodiments the thickness of light-conversion material 2710 varies over different portions of die 2720. White die 2700 may be used to produce embodiments of this invention, rather than forming a light-conversion material 2710 over die 2720 after attachment of die 2720 to substrate 165.

Light-conversion material 2710 may include or consist essentially of a transparent binder material alone, or phosphor powders, quantum dots or the like within a transparent binder matrix. Phosphors vary in composition, and in some embodiments may include lutetium aluminum garnet (LuAG or GAL), yttrium aluminum garnet (YAG) or other phosphors known in the art. GAL, LuAG, YAG and other materials may be doped with various materials including for example Ce, Eu, silicates doped with various materials including Ce, Eu, etc., aluminates, nitrides, and the like. The specific components and/or formulation of the phosphor and/or matrix material are not limitations of the present invention.

Light-conversion material 2710 may include a combination of individual phosphors. In one embodiment, the transparent matrix or binder includes silicone, epoxy, or other suitable materials. An example of a matrix material includes materials from the ASP series of silicone phenyls manufactured by Shin Etsu, or the Sylgard series manufactured by Dow Corning. The specific components and/or formulation of the phosphor and/or matrix material are not limitations of the present invention.

It should be noted that LEEs 130 may have other features than those shown in FIG. 26 or 27 or discussed above, or may have fewer or more features than shown in FIG. 26 or 27 or discussed above; the details of LEEs 130 are not limiting to the present invention.

Figure 28:
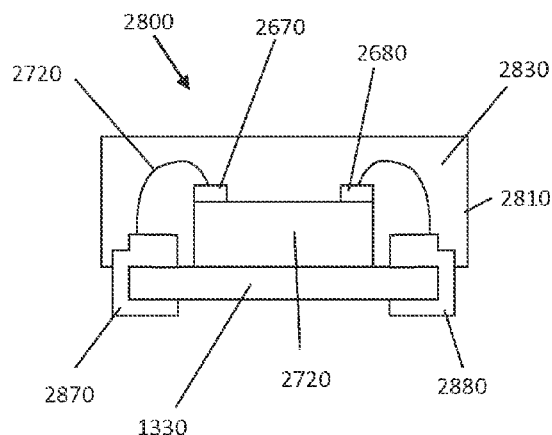

In another embodiment, an LEE 130 includes or consists essentially of a packaged semiconductor die, for example a packaged laser diode or LED. FIG. 28 shows an exemplary packaged LED 2800 that includes a die 2720 having contacts 2670, 2680 that are electrically coupled to package contacts 2870, 2880 respectively. A package body 2810 holds or encases all or a portion of the die 2720. All or a portion of the interior of package body 2810 may be empty, or may be filled with a material 2830, which may include or consist essentially of a transparent material such as a binder (for example silicone or epoxy), or a light-conversion material, such as one or more phosphors or similar materials infused in a binder. In some embodiments the binder may have an index of refraction greater than about 1.35 or greater than about 1.45. Contacts 2670, 2680 may be electrically coupled to package contacts 2870, 2880 respectively using a variety of techniques, for example wire bonding, ball bonding, solder, conductive adhesive, anisotropic conductive adhesive (ACA) or the like. Packaged LEE 2800 shown in FIG. 28 is an example of one type of packaged LEE. As is known to those skilled in the art, many different types of packaged LEEs are available, and the type or size of packaged LEE is not a limitation of the present invention.

In some embodiments, LEEs 130 may emit light in a relatively small wavelength range, for example having a full width at half maximum in the range of about 20 nm to about 200 nm. In some embodiments, all LEEs 130 may emit light of the same or substantially the same wavelength, while in other embodiments different LEEs 130 may emit light of different wavelengths. In some embodiments LEEs 130 may emit white light, for example that is perceived as white light by the eye. In some embodiments, the white light may be visible light with a spectral power distribution the chromaticity of which is close to the blackbody locus in the CIE 1931 xy or similar color space. In some embodiments, white light has a color temperature in the range of about 2000 K to about 10,000 K. The emission wavelength, full width at half maximum (FWHM) of the emitted light or radiation or other optical characteristics of LEEs 130 may not be all the same and are not a limitation of the present invention.

Substrate 165 may include or consist essentially of a semi-crystalline or amorphous material, e.g., polyethylene naphthalate (PEN), polyethylene terephthalate (PET), polycarbonate, polyethersulfone, polyester, polyimide, polyethylene, fiberglass, FR4, MCPCB, and/or paper. Substrate 165 may include multiple layers, e.g., a deformable layer over a rigid layer, for example, a semicrystalline or amorphous material, e.g., PEN, PET, polycarbonate, polyethersulfone, polyester, polyimide, polyethylene, and/or paper formed over a rigid substrate for example comprising, acrylic, aluminum, steel and the like. Depending upon the desired application for which embodiments of the invention are utilized, substrate 165 may be substantially optically transparent, translucent, or opaque. For example, substrate 165 may exhibit a transmittance or a reflectivity greater than 70% for optical wavelengths ranging between approximately 400 nm and approximately 700 nm. In some embodiments substrate 165 may exhibit a transmittance or a reflectivity of greater than 70% for one or more wavelengths emitted by LED 130. Substrate 165 may also be substantially insulating, and may have an electrical resistivity greater than approximately 100 ohm-cm, greater than approximately $1 \times 10^6$ ohm-cm, or even greater than approximately $1 \times 10^{10}$ ohm-cm.

Conductive elements, i.e., power conductors 110, 120, back power conductors 910, 920 and conductive traces 160, may be formed via conventional deposition, photolithography, and etching processes, plating processes, lamination, lamination and patterning, evaporation sputtering or the like or may be formed using a variety of different printing processes. For example, power conductors 110, 120, back power conductors 910, 920 and conductive traces 160 may be formed via screen printing, flexographic printing, ink jet printing, and/or gravure printing. Power conductors 110, 120, back power conductors 910, 920 and conductive traces 160 may include or consist essentially of a conductive material (e.g., an ink or a metal, metal film or other conductive materials or the like), which may include one or more elements such as silver, gold, aluminum, chromium, copper, and/or carbon. Power conductors 110, 120, back power conductors 910, 920 and conductive traces 160 may have a thickness in the range of about 50 nm to about 1000 µm. In some embodiments the thickness of power conductors 110, 120, back power conductors 910, 920 and conductive traces 160 may be determined by the current to be carried thereby. While the thickness of one or more of power conductors 110, 120, back power conductors 910, 920 and conductive traces 160 may vary, the thickness is generally substantially uniform along the length of the trace to simplify processing. However, this is not a limitation of the present invention and in other embodiments the thickness and/or material of power conductors 110, 120, back power conductors 910, 920 and conductive traces 160 may vary. In some embodiments, all or a portion of power conductors 110, 120, back power conductors 910, 920 and conductive traces 160 may be covered or encapsulated. In some embodiments, a layer of material, for example insulating material, may be formed over all or a portion of power conductors 110, 120, back power conductors 910, 920 and conductive traces 160. Such a material may include, e.g., a sheet of material such as used for substrate 165, a printed layer, for example using screen, ink jet, stencil or other printing means, a laminated layer, or the like. Such a printed layer may include, for example, an ink, a plastic and oxide, or the like. The covering material and/or the method by which it is applied is not a limitation of the present invention.

Figure 29:
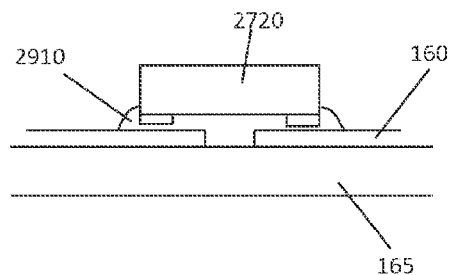
FIG. 29 is a schematic illustration of a light-emitting element bonded to a substrate in accordance with various embodiments of the invention.

In one embodiment, the conductive traces 160 are formed with a gap between adjacent conductive traces 160, and LEEs 130 and CEs 140 are electrically coupled to conductive traces 160 using conductive adhesive, e.g., an isotropically conductive adhesive and/or an ACA. FIG. 29 shows one example of a die 2720 electrically coupled to conductive traces 160 using an ACA 2910. ACAs may be utilized with or without stud bumps and embodiments of the present invention are not limited by the particular mode of operation of the ACA. For example, the ACA may utilize a magnetic field rather than pressure (e.g., the ZTACH ACA available from SunRay Scientific of Mt. Laurel, N.J., for which a magnetic field is applied during curing in order to align magnetic conductive particles to form electrically conductive "columns" in the desired conduction direction). Furthermore, various embodiments utilize one or more other electrically conductive adhesives, e.g., isotropically conductive adhesives, non-conductive adhesives, in addition to or instead of one or more ACAs. In other embodiments, LEEs 130 and CEs 140 may be attached to and/or electrically coupled to conductive traces 160 by other means, for example solder, reflow solder, wave solder, wire bonding, or the like. The method by which LEEs 130 and CEs 140 are attached to conductive traces 160 is not a limitation of the present invention.

Turning now to CE 140, in one embodiment of this invention the position of CE 140 fits within the pitch structure of the LEEs 130. In other words, the placement of CE 140 generally does not change the pitch of the LEEs 130. For example, in FIG. 16, CE 140 does not displace the position of any adjacent LEEs 130. In some embodiments CEs 140 may be located between any two arbitrary LEEs 130, not just at the end or beginning of a string 150, and the CE 140 has dimensions such that it fits between adjacent LEEs 130 spaced at the LEE pitch. For the case of the first exemplary embodiment described above, CE 140 would have a dimension less than about 1 cm.

Figure 30A:
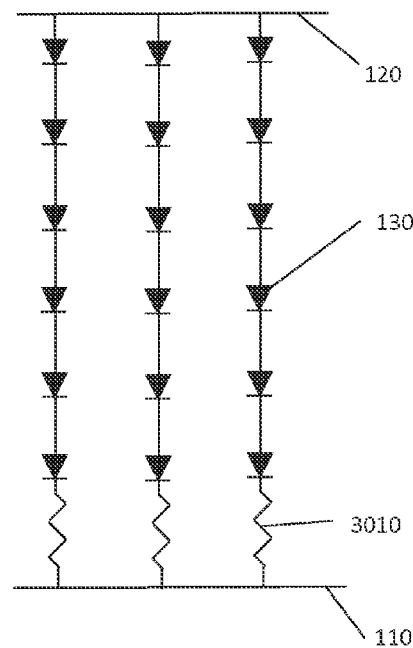
FIGS. 30A, 30B, and 30C are schematic illustrations of electrical configurations of light-emitting elements and control elements in accordance with various embodiments of the invention.

As discussed above, CE 140 may be one component or multiple active and/or passive components. In one embodiment, power conductors 110, 120 provide a DC voltage or substantially DC voltage and CE 140 includes or consists essentially of a resistor 3010, e.g., a current-limiting resistor, as shown in FIG. 30A. The choice of the resistance value may be a trade-off between a number of parameters and characteristics that may include, e.g., efficiency and current stability. In general, a larger resistance will result in reduced efficiency but greater current stability, while a smaller resistance will result in increased efficiency but reduced current stability. Variations in the current may result from variations in the input voltage (for example across power conductors 110, 120), variations in forward voltage of the LEEs 130 within the string, variations in the value of the current-limiting resistor, variations in current that may occur if one or more LEEs 130 in the string become short-circuited or the like. In the case of CE 140 including or consisting essentially of a resistor, in some embodiments CE 140 is a discrete resistor formed within or on conductive traces 160, such as a chip resistor, a bare-die resistor or surface mount device (SMD) resistor.

Figure 30B:
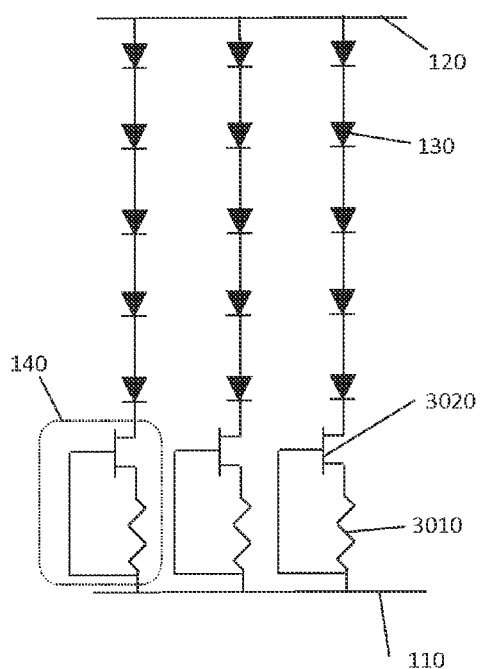

As discussed above, in embodiments where CE 140 includes or consists essentially of a resistor, there may be trade-offs between efficiency and current stability. While such trade-offs may be acceptable in certain products, other products may require relatively better current stability at higher efficiencies, and in these cases CE 140 may include or consist essentially of multiple components or a circuit element, as discussed above. FIG. 30B shows one example of such a circuit, where CE 140 includes or consists essentially of a field-effect transistor (FET) 3020 and a resistor 3010. In another embodiment CE 140 includes or consists essentially of two bipolar junction transistors (BJTs) and two resistors.

In one embodiment, CE 140 includes or consists essentially of a FET 3020 and a resistor 3010, as shown in FIG. 30B. In one embodiment, FET 3020 is a depletion-mode FET that is normally on and easily allows current to flow essentially unimpeded. In order to reduce the amount of current flowing through FET 3020, a negative voltage potential is applied between its source and gate. As current begins to flow through the FET 3020 and the series-connected resistor 3010, a potential difference develops across resistor 3010, thus generating a negative voltage potential between the gate and source of FET 3020. Once this potential difference reaches a certain value equal to the pinch-off voltage of the FET 3020, the current is restricted from increasing further and thus CE 140 acts as a constant-current regulator. Different FETs 3020 may be manufactured to have different pinch-off voltage thresholds; therefore, by matching the FET characteristics to a certain value of resistor 3010, a specific current limit may be defined for CE 140

Figure 30C:
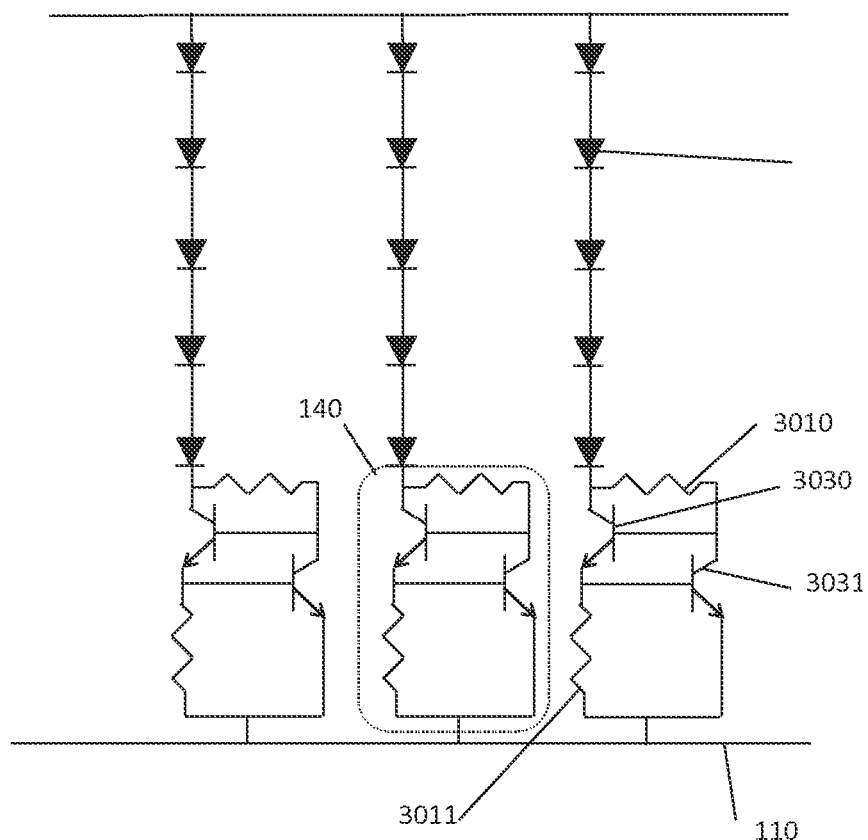

In one embodiment, the CE 140 includes or consists essentially of two NPN BJTs 3030, 3031 and two resistors 3010, 3011 (as shown in FIG. 30C) and is connected in series with the LED string and may be located at one end of the string or anywhere mid-string. Such a CE 140 acts like a two-terminal polarized device, allowing current to flow only in one direction and maintaining an essentially constant current. The transistor 3030 acts as a buffer that is turned on by base current flowing through resistor 3010—changes in string voltage are thus taken up by transistor 3030. Once current starts flowing through transistor 3030, base current is provided to turn on transistor 3031. With transistor 3031 turned on the voltage across the base-emitter junction of transistor 3031 is nominally, e.g., 0.6V, which is the typical voltage drop of a standard forward biased silicon diode p-n junction. This base emitter voltage acts as a reference, so dividing that voltage by the value of resistor 3011 defines the current set point of the circuit. It is self-correcting in the following manner. If more current tries to flow through transistor 3030 the voltage at the base of transistor 3031 will rise, along with the base current into transistor 3031, which will increase the amount of current which may flow through transistor 3031. This in effect "steals" base current away from transistor 3030, which in turn will reduce the amount of current which may pass through transistor 3030. This negative feedback self-regulates the amount of current that may flow through the circuit. Resistor 3010 preferably has a resistance value sufficiently high to limit the amount of bias current that may flow through transistor 3031 to less than approximately 5% of the current through resistor 3010. Thus, the total current through the LED string will be nominally, in this example, the bias current added to 0.6V divided by this resistance value. Finally, as the voltage across the circuit changes, for example if one or more LEEs in the string short out, the voltage across transistor 3030 and resistor 3010 will increase, which will slightly increase the base current into transistor 3030, thus allowing more current to flow through transistor 3030. Thus, even with the feedback response of transistor 3031 the drive current may increase slightly. For example, if the voltage across transistor 3030 changes by about 10 V, the current through the circuit will increase by less than about 1 mA. The description above is of a specific embodiment of this invention and in other embodiments the circuit layout, elements and configuration may be different; the specific circuit is not a limitation of the present invention.

In one example, FET 3020 is a MMBFJ113 manufactured by Fairchild Semiconductor and resistor 3010 has a value of about 250 ohms to achieve a constant current of approximately 5 mA. In one example BJTs 3030, 3031 are MMBT2484 manufactured by Fairchild Semiconductor and resistors 3010, 3011 have a value of approximately 39 kiloohms and 113 ohms, respectively, to achieve a constant current of approximately 5 mA.

In general, the efficiency and current stability increase with the number of components, as does the cost. In some embodiments where CE 140 includes or consists essentially of multiple components, the components may be in discrete form (i.e., each component individually electrically coupled to conductive traces 160) or in hybrid form (where multiple separate components are mounted on a submount, which is then electrically coupled to conductive traces 160), or in monolithic form (where multiple components are integrated on a semiconductor chip, for example a silicon-based or other semiconductor-based integrated circuit). In some embodiments, CE 140 may be in bare-die form, while in other embodiments CE 140 may be packaged or potted or the like. In some embodiments, CE 140 may include or consist essentially of a bare-die integrated circuit, for example including or consisting essentially of resistor 3010 and FET 3020 of FIG. 30B. In some embodiments, the integrated circuit includes or consists essentially of multiple active and/or passive devices that are fabricated on a common semiconductor substrate.

In other embodiments, power conductors 110, 120 may provide AC power, or power modulated at different frequencies and in these embodiments CEs 140 may be selected accordingly or may be omitted. In one embodiment, power conductors 110, 120 may provide a standard line voltage, for example about 120 VAC or about 240 VAC or about 277 VAC, for example at about 50 Hz or about 60 Hz. In some embodiments, CE 140 may accommodate a plurality of input types, a so-called "universal" CE 140, while in other embodiments different CEs 140 may be required for different input types. The actual component or components of CEs 140 are not limiting to this invention; however, in preferred embodiments of this invention, the positioning of CEs 140 does not disrupt the LEE pitch. In another embodiment of this invention, the positioning of CEs 140 is independent of LEE pitch.

As discussed above, CEs 140 and LEEs 130 may be electrically coupled to conductive traces 160 using a conductive adhesive. FIG. 31 shows a plan-view schematic example of a portion of a lightsheet featuring LEEs 130 electrically coupled to conductive traces 160 using conductive adhesive 2910, for example an ACA, resistors 3110 electrically coupled to conductive traces 160 using conductive adhesive 2910, and conductive traces 160 electrically coupled to power conductors 110, 120.

Figure 32C:
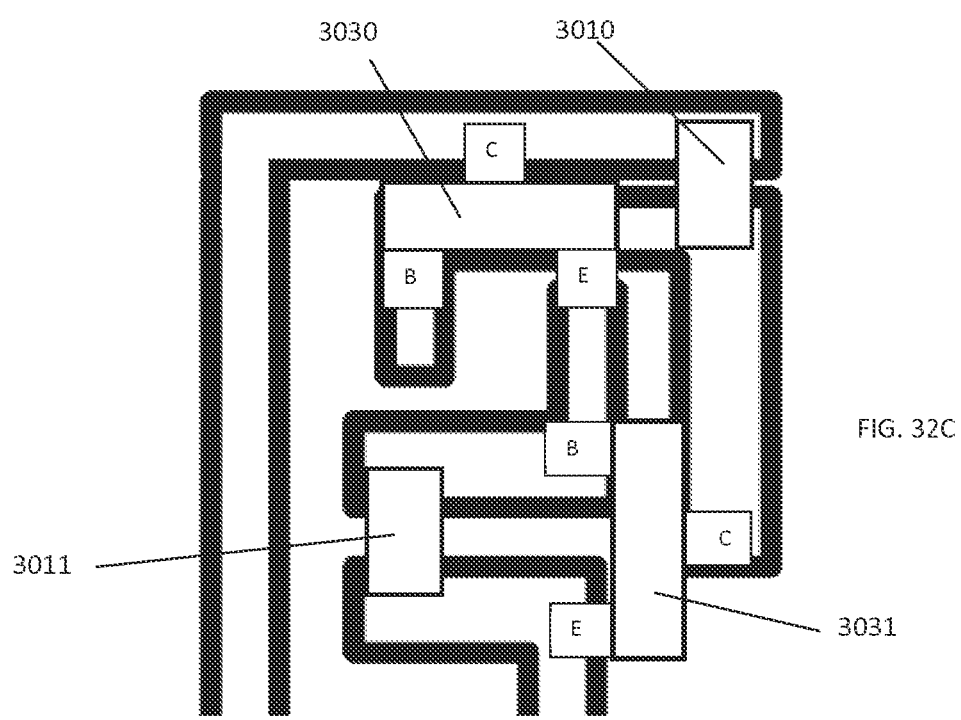
Figure 32D:
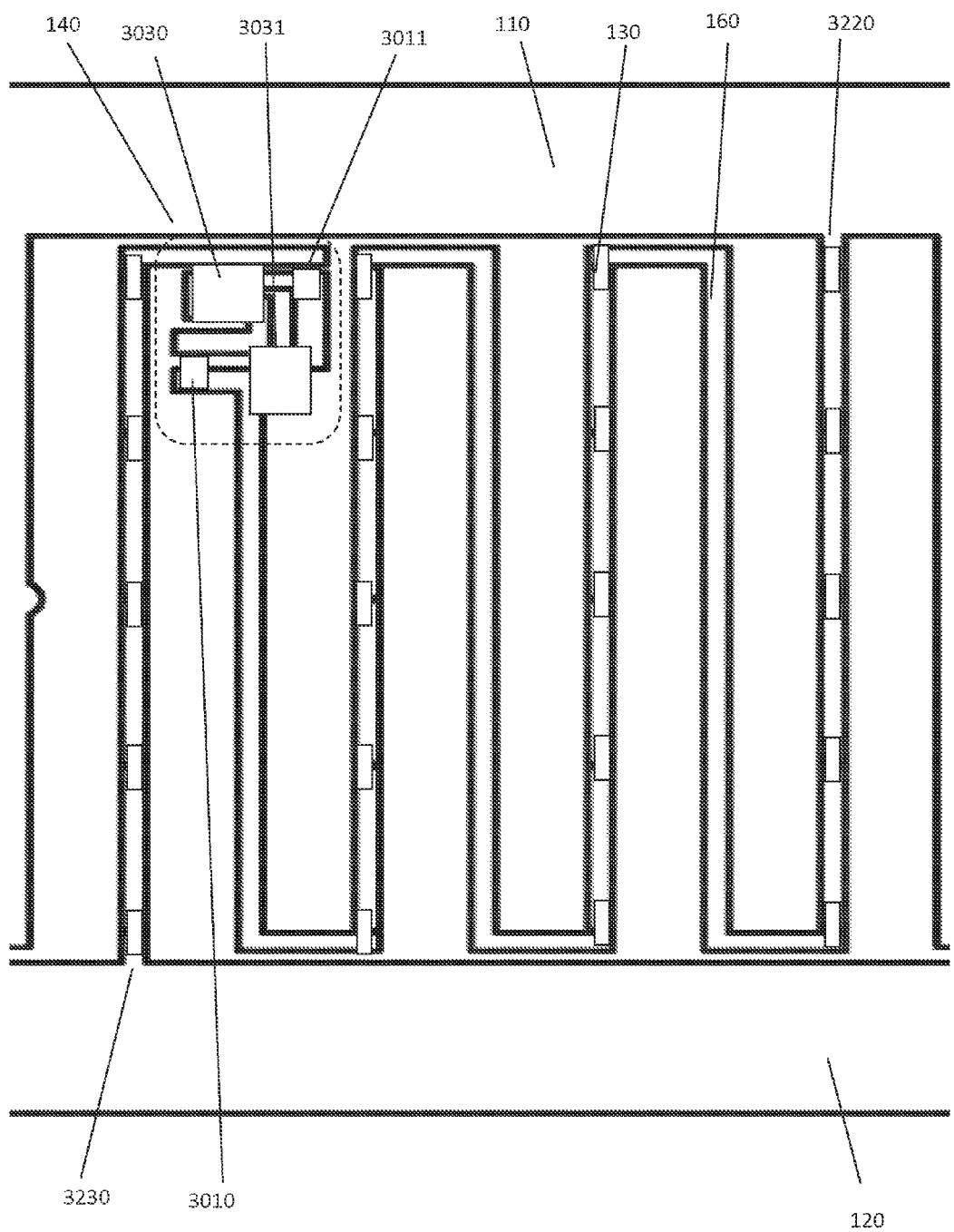

FIGS. 32A, 32B, 32C, and 32D illustrate another aspect in accordance with embodiments of the present invention. FIG. 32A is a schematic of a conductive pattern that may be used for formation of CE 140. The structure shown in FIG. 32A is electrically coupled to string 150 as described above. Current flows through the structure from conductive element 160 to conductive element 160'. In some embodiments, the conductive pattern for CE 140 may permit the formation of different types of CE 140. In this case one sheet design may be used for different products that have different CEs 140, by placing various components comprising CE 140 across various conductive elements making up the structure shown in FIG. 32A. For example, FIG. 32B shows an embodiment of the present invention where CE 140 is a resistor 3110 while FIG. 32C shows an embodiment of the present invention where CE 140 comprises two bipolar junction transistors 3030 and 3031 and resistors 3010 and 3011. FIG. 32D shows an expanded view of FIG. 32C that includes power conductors 110, 120 and LEEs 130. As shown, the string joins power conductor 110 at the point identified as 3220, and the string joins power conductor 120 at the point identified as 3230. As shown, the same conductive trace pattern may be configured and used for multiple different types of CEs 140, for example comprising different numbers of components and/or different types of components. The conductive pattern shown in FIG. 32A is an example of this embodiment of the present invention and in other embodiments other patterns or layouts may be used to achieve the ability to use different CEs 140 with a single pattern.

Figure 33:
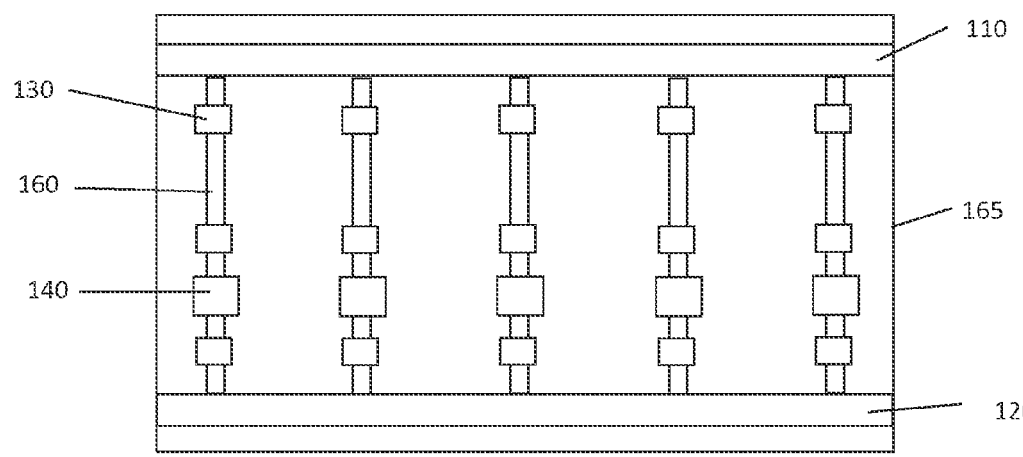

While the discussion above has focused on manufacture of embodiments of the present invention in flexible sheet form, this is not a limitation of the present invention, and in other embodiments the inventive concepts may be applied to other systems. For example, some examples above utilize a flexible substrate 165 to permit fabrication of a flexible lightsheet and/or to permit roll-to-roll processing or manufacture; however, this is not a limitation of the present invention and in other embodiments substrate 165 may include or consist essentially of other materials or types of wiring boards, for example conventional printed circuit boards (PCBs), FR4, metal core PCBs, or the like. For example, some examples above utilize a conductive adhesive or an ACA to attach LEE 130 to conductive elements 160; however, this is not a limitation of the present invention and in other embodiments other attachment methods, for example ones that may provide higher thermal conductivity or higher temperature operation, or the like, may be used. Thus, one or all of the inventive concepts of the present invention, including but not limited to (i) powering multiple strings 150 from one set of power conductors with a constant voltage; (ii) each string including CE 140 to control the current in LEEs 130 of that string; (iii) disposition of CE 140 within LEE 130 pitch; (iv) ability to cut to length; and (v) ability to tile across the joint with substantially no change in pitch across the joint, are applicable to any type of system. For example, FIG. 33 shows a schematic of a MCPCB including LEEs 130, where the LEEs 130 are relatively high-power packaged LEDs.

In some embodiments, a low-profile (i.e., relatively thin) lighting system having a relatively low weight may be desirable. For example, some applications require a relatively thin enclosure for the lighting system. Examples of such applications include back lighting of translucent panels (e.g., enclosures composed of plastic, wood, or stone), surface-mount applications where the lighting system extends only a small amount above the surrounding surface, flush-mount applications where it is desirable that the lighting system consume as little space below the surface as possible, inlay applications where the lighting system is incorporated into another structure, back lighting of fixed-image or video displays, back lighting of display or video monitors and the like. In some embodiments it may be desirable to have a low profile in a ceiling mount application so that the lighting system does not consume a large amount of space. For example, multi-story buildings typically require a certain amount of space between floors to accommodate electrical, heating, air conditioning and lighting facilities. Reduction of the amount of this space may result in reduction of the cost-per-floor of the building. The use of relatively thin, low-profile lighting systems may aid in the reduction of between-floor space requirements. Furthermore, houses, buildings, and other structures must be constructed to support the weight of the building itself, all associated facilities, and weight added to the building by its occupants as well as the occupants themselves. In general terms the weight not directly associated with the structure may be termed the "building load." Reducing the building load, for example by reducing the weight of lighting systems, potentially enables a reduction in the cost of the building.

In some applications it is desirable for a lighting system to include or consist essentially of a light sheet and a transparent or translucent panel over the light-emitting side of the light sheet to impart one or more optical characteristics to the lighting system and/or to protect the light sheet. In some embodiments, it is desirable for the combination of the light sheet and overlying panel to be relatively thin. The thickness of such a combination is determined by the thickness of the light sheet, the thickness of the panel above the light sheet and the spacing between the panel and the light sheet. In some embodiments, the overlying panel may act to diffuse the light, modify the light intensity distribution, modify the light intensity distribution as a function of angle, modify the color temperature, modify the color, modify the color temperature as a function of angle, modify the appearance of the light emitted by the lighting system, protect the light sheet, or the like. In some embodiments, the overlying panel may include or consist essentially of a flat or substantially featureless panel, while in other embodiments the overlying panel may include or consist essentially of one or more optical elements or features, for example a refractive optic, a reflector or reflective optic, a total internal reflection (TIR) element or optic, a Fresnel optic or element, or the like. In some embodiments, the overlying panel may include or consist essentially of transparent or translucent words and/or images, for example for advertising, identification, signage, or the like. The transparency of the overlying panel is not a limitation of the present invention.

In one embodiment, the above-described attributes may be achieved by the use of a very thin substrate 165. For example, in one embodiment the substrate 165 may include or consist essentially of a material with a thickness less than approximately 200 lam, less than approximately 100 μm, or less than approximately 50 μm. PET has a density of about 1.38 μm/cm³, which translates to a weight per square meter of about 1.38 grams per micron of thickness. Thus, one square meter of PET having thicknesses of approximately 200 μm, approximately 100 μm, approximately 50 μm, and approximately 38 μm weighs approximately 276 μm, approximately 138 μm, approximately 69 μm, and approximately 52 μm respectively. As described herein, conductive elements, for example conductive elements 160 and power conductors 110, 120, may include metals such as Cu, Al, Au, Ag, Cr, or the like or carbon or inks including or consisting essentially of such metals or carbon. In some embodiments, the conductive elements may have a thickness in the range of about 3 μm to about 100 μm, and more preferably in the range of about 5 μm to about 50 μm. LEEs 130 may be attached to conductive elements 160 using a variety of means, for example ACA, conductive adhesive, or solder. The means of attachment of LEEs 130 to conductive elements 160 is not a limitation of the present invention.

In some embodiments, the total lightsheet weight may be less than about 1000 μm/m², less than about 500 μm/m², less than about 100 μm/m², or even less than about 50 μm/m². For example, in one embodiment a lightsheet may include or consist essentially of a PET substrate having a thickness of about 38 μm, Cu conductive traces having a thickness of about 30 μm, and LEDs having a pitch of about 12 mm, the entire lightsheet having a weight of about 325 μm/m². In another embodiment, a lightsheet may include or consist essentially of a PET substrate having a thickness of about 38 μm, Al conductive traces having a thickness of about 9 μm, and LEDs having a pitch of about 12 mm, the entire lightsheet having a weight of about 82 μm/m². In some embodiments, the relatively thin substrate 165 may have thermal limitations; that is, the small thickness of the substrate 165 may render the use of conventional solder difficult due to the relatively high temperatures required for conventional solders. For example, conventional gold/tin (Au/Sn) solders have a relatively high melting point, for example 80% Au/20% Sn solders having a composition of about 80% Au and about 20% Sn have a melting point of about 280° C., which is above the melting point of PET, which is about 265° C. Another example of a somewhat lower melting point conventional solder is SAC 305, for example manufactured by MG Chemicals or Kester, having a composition of about 96.5% tin, about 0.5% copper and about 3% silver, which has a melting point of about 220° C. Even though the melting point of SAC 305 is below the melting point of PET, it is still undesirably high. PET undergoes a crystallization reaction when exposed for extended times to temperatures near the glass transition temperature (which for PET is in the range of about 67° C. to about 81° C.), resulting in a change in properties, particularly transparency, and thus it is often desirable to limit the thermal budget (time and temperature) for a solder-based attachment process. Lead has been used in solder alloys to help achieve lower temperatures, but in some embodiments, lead may not be acceptable from a health and safety point of view. Bismuth (Bi) and indium (In) have been utilized as constituents for relatively low temperature solders. In melts at about 156° C. while Bi melts at about 271° C. In some embodiments, the solder includes or consists essentially of bismuth and tin, the composition of bismuth in the range of about 45% to about 70% and the composition of tin in the range of about 30% to about 55%. In some embodiments, the solder includes or consists essentially of bismuth, tin, and silver, the composition of bismuth in the range of about 45% to about 70%, the composition of tin in the range of about 30% to about 55%, and the composition of silver in the range of about 0.1% to about 8%. In some embodiments, the solder includes or consists essentially of bismuth, tin, and silver, the composition of bismuth in the range of about 20% to about 50%, the composition of tin in the range of about 5% to about 28%, and the composition of indium in the range of about 35% to about 65%.

Alloys of, for example, Bi, Sn, Pb, and Ag may be formulated to have a liquidus temperature in the range of, for example, about 100° C. to about 150° C. For example, Indalloy 282 from the Indium Corporation has a composition of about 57% Bi, about 43% Sn, and about 1% Ag and a liquidus temperature of about 140° C. Indalloy 97 from the Indium Corporation has a composition of about 43% Bi, about 43% Pb, and about 14% Bi and a liquidus temperature of about 163° C. Indalloy 281 from the Indium Corporation has a composition of about 58% Bi and about 42% Sn and a liquidus temperature of about 138° C. Another even lower temperature, but relatively more expensive, solder is InSn solder, having a composition of about 50% In and about 50% tin and a liquidus temperature about 125° C.

Figure 34A:
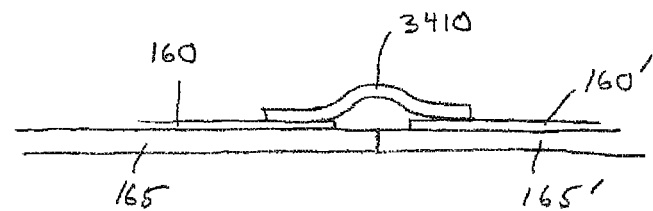
FIGS. 34A-34K are schematic cross-sections of portions of lightsheets at least partially connected by joining elements in accordance with various embodiments of the invention.

In some embodiments, it may be desirable to connect more than one sheet together while still maintaining the flexibility of the sheet, for example to have the joint region have substantially the same flexibility as the sheet itself. Conventional methods of joining sheets, for example soldering adjacent sheets together, may result in the joint region having a relatively higher stiffness than the sheet itself, for example if the solder that attaches a connecting element between two sheets forms a rigid solder joint that may resist bending or crack under bending. FIG. 34A shows an example of one embodiment featuring a hinge or flexible member providing electrical coupling and optional compliant mechanical coupling between two lightsheets. In the embodiment shown in FIG. 34A, the lighting system includes or consists essentially of two substrates 165 and 165', each including or consisting essentially of conductive elements 160 and 160', respectively, and a joint element 3410 that electrically couples conductive elements 160 and 160'. In some embodiments, the joint element 3410 may include or consist essentially of metal, for example copper, brass, aluminum, gold, silver, or the like. In some embodiments, the joint element 3410 may have a thickness in the range of about 25 μm to about 500 μm. In some embodiments, joint element 3410 may have a width in the range of about 0.5 mm to about 10 mm; however, the width of joint element 3410 is not a limitation of the present invention. In some embodiments, joint element 3410 may have a length in the range of about 3 mm to about 25 mm; however, the length of joint element 3410 is not a limitation of the present invention.

In some embodiments, joint element 3410 may include or consist essentially of one material; however, this is not a limitation of the present invention, and in other embodiments joint element 3410 may include or consist essentially of more than one material. For example, in some embodiments joint element 3410 may include or consist essentially of a layered structure or an alloy or compound. In some embodiments, joint element 3410 may include or consist essentially of a flat or planar conductor or conductive tape. In some embodiments, joint element 3410 may include or consist essentially of a wire. In some embodiments, a preferred attribute of joint element 3410 is that it is flexible or compliant. In other words, in some embodiments joint element 3410 is not rigid and does not impart significant stiffness to the combined substrates 165 and 165'.

Figure 34B:
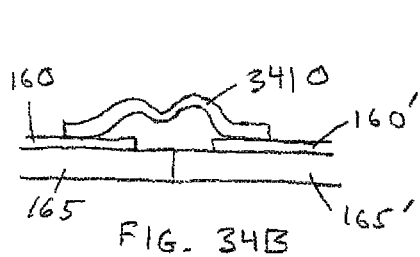
Figure 34C:
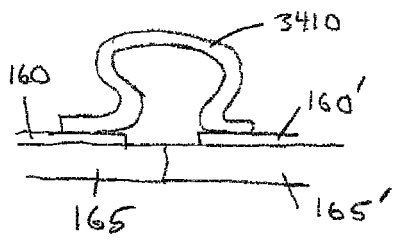

In some embodiments, the joint element 3410 may have a shape designed to provide increased flexibility or compliance, for example as shown in FIG. 34B. FIG. 34B shows an example of a joint element 3410 featuring one or more undulations to increase the flexibility of the middle region of joint element 3410 (for example, as an accordion fold). As shown, a joint element 3410 having one or more undulations has a straight-line length longer than the straight-line length between the points at which it is anchored to substrates 165, 165'. FIG. 34C shows an example of another embodiment of joint element 3410. The specific shape of joint element 3410 is not a limitation of the present invention—in some embodiments of the invention a preferred attribute is a compliant and/or flexible joint element.

Figure 34D:
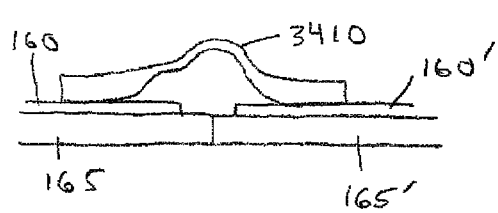

While joint element 3410 has been shown as having a substantially constant thickness and/or cross-section, this is not a limitation of the present invention, and in other embodiments the thickness and/or width of joint element 3410 may vary within joint element 3410. For example, FIG. 34D shows an embodiment in which joint element 3410 has a thickness in the middle region relatively less than that in the end regions, for example to provide relatively increased flexibility in a bending region. In some embodiments, the width of joint element 3410 may also vary along the length of joint element 3410, for example to provide relatively increased flexibility in a bending region.

Joint element 3410 may be electrically and/or mechanically coupled to conductive elements 160, 160' using a variety of means, for example crimping, solder, conductive adhesive, non-conductive adhesive, anisotropic conductive adhesive, or the like. The method of electrically and/or mechanically coupling joint element 3410 to conductive traces 160, 160' is not a limitation of the present invention.

Figure 34E:
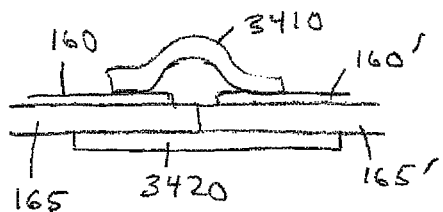
Figure 34F:
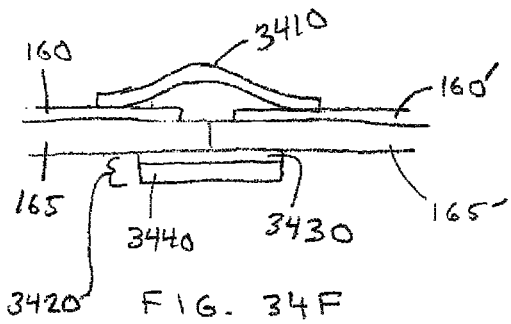

In some embodiments, joint element 3410 may provide the mechanical coupling or connection between substrates 165 and 165'; however, this is not a limitation of the present invention, and in other embodiments mechanical coupling is achieved by other means. For example, FIG. 34E shows an embodiment featuring an additional joining member 3420 that mechanically couples substrates 165, 165'. In some embodiments, joining member 3420 provides additional or substantially all of the mechanical coupling between substrates 165 and 165'. Joining member 3420 may include or consist essentially of a variety of materials, for example the same material as substrate 165 or 165', tape, or the like, for example a semicrystalline or amorphous material, e.g., PEN, PET, polycarbonate, polyethersulfone, polyester, polyimide, polyethylene, fiberglass, FR4, MCPCB, and/or paper. In some embodiments, joining member 3420 may include or consist essentially of multiple layers, e.g., a flexible material and an adhesive. For example, in some embodiments joining member 3420 may include or consist essentially of tape. In some embodiments, joining member 3420 may include or consist essentially of a transfer tape 3430 and a backing layer 3440, as shown in FIG. 34F. FIG. 34F shows an embodiment in which the length of joining member 3420 is less than that of joint element 3410. In some embodiments, a glue or adhesive may be provided between portions of substrate 165 and 165' at or proximate the interface therebetween.

FIG. 34E shows joining member 3420 as having a length greater than the length of joint element 3410; however, this is not a limitation of the present invention, and in other embodiments joining member 3420 may have a length equal to the length of joint element 3410 or less than the length of joint element 3410, as shown in FIG. 34F.

Figure 34G:
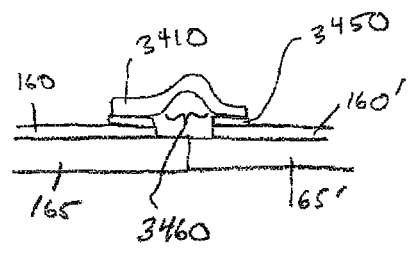

In some embodiments, joining element 3410 may be electrically coupled to conductive elements 160 and 160' using solder. FIG. 34G shows an example of one embodiment featuring substrates 165, 165', conductive elements 160, 160', joining element 3410, and solder 3450. In some embodiments, it may be desirable that solder 3450 does not extend along the length of joining element 3410 such that it forms a rigid or semi-rigid bridge between substrates 165 and 165'. In other words, in some embodiments a region 3460 in FIG. 34G between the regions of solder 3450 is free or substantially free of solder, such that in some embodiments the stiffness or rigidity of joining element 3410 is not increased by the presence of solder 3450 in region 3460.

Figure 34H:
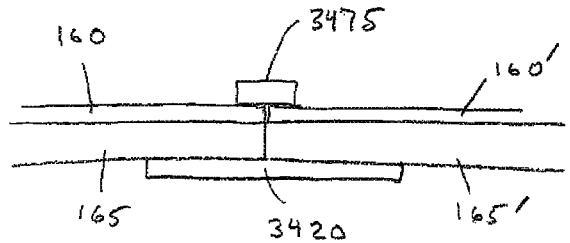

In various alternative embodiments of the invention, connection of more than one component lightsheet together while still maintaining the flexibility of the joined lightsheet may be accomplished by using a relatively small, substantially rigid electrical joint, as shown in FIG. 34H. FIG. 34H depicts substrates 165, 165' joined mechanically by joining member 3420 and conductive traces 160, 160' electrically coupled by a relatively small electrical connection member 3475. In some embodiments of the present invention, electrical connection member 3475 may include or consist essentially of a small block of conductive metal, for example aluminum, copper, gold, silver, or the like. In some embodiments, the metal block may have a length in the range of about 2 mm to about 10 mm, a width in the range of about 1 mm to about 10 mm, and a thickness in the range of about 0.1 mm to about 1 mm. In some embodiments, the conductive metal block may be attached to the power conductors using solder, electrically conductive adhesive, electrically conductive tape, or the like. In some embodiments, electrical connection member 3475 may include or consist essentially of a rigid substrate backed with electrically conductive tape, for example the rigid substrate may include or consist essentially of FR4, plastic, or the like. In some embodiments, electrical connection member 3475 may include or consist essentially of a thin conductive foil, for example aluminum, copper, gold, silver, chromium foil, or the like. In some embodiments, the conductive foil may be supported on one side by a rigid substrate such as FR4, plastic, or the like.

In this embodiment, substrates 165, 165' may be butted up against each other such that there is only a small gap (if any) between substrates 165, 165' and between conductive traces 160, 160'. For example, in some embodiments, the gap may be less than 0.5 mm or less than 0.25 mm. In some embodiments, joining member 3420 may include or consist essentially of an adhesive tape. In preferred embodiments, electrical connection member 3475 is small enough that it does not substantially change the flexibility of the lightsheet. In some embodiments of the present invention, the lightsheet may have a radius of curvature in a non joint region less than about 50 cm, or less than about 20 cm, or less than about 10 cm, or less than about 5 cm or less than about 1 cm. In some embodiments of the present invention, the light sheet may have a radius of curvature in a non joint region less than 0.5 cm. In some embodiments, the radius of curvature in the joint region may have a radius of curvature that is within ±25% of the value of the radius of curvature in a non joint region, or that is within ±10% of the value of the radius of curvature in a non joint region, or that is within ±5% of the value of the radius of curvature in a non joint region. In some embodiments, the joint region may be a region within about 3 cm of the joint or within about 1.5 cm of the joint, while a non-joint region may be spaced apart from the joint by at least 1.5 cm or at least 3 cm. In one embodiment, electrical connection member 3475 is substantially the same size or smaller than LEE 130. In some embodiments, electrical connection member 3475 has a dimension less than about 3 mm.

Figure 34I:
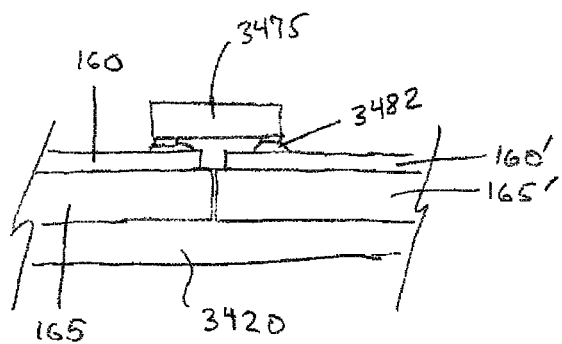
Figure 34J:
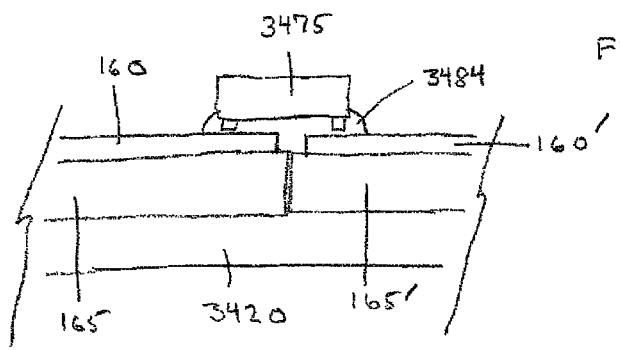

FIG. 34I depicts an expanded view of one embodiment of FIG. 34H, in which electrical connection member 3475 includes or consists essentially of a low-resistance resistor (e.g., a resistor having a maximum resistance less than about 100 milliohms, or less than about 50 milliohms or less than about 20 milliohms) or "zero-ohm resistor" (or "zero-ohm link," i.e., a low-resistance wire or jumper connection having substantially the same form factor as a resistor, and typically having a maximum resistance less than about 100 milliohms, or less than about 50 milliohms, or less than about 20 milliohms) that has been electrically coupled between traces 160, 160' using solder 3482. FIG. 34J shows an expanded view of another embodiment of FIG. 34H, in which electrical connection member 3475 includes or consists essentially of a low-resistance resistor or zero-ohm resistor that has been electrically coupled between traces 160, 160' using ACA 3484. In some embodiments, the zero-ohm resistor may include or consist essentially of a surface mount device (SMD) resistor having a length of about 3.2 mm, a width of about 2.5 mm, and a thickness of about 0.55 mm and a maximum resistance of about 50 milliohms. While the examples shown in FIGS. 34I and 34J utilize zero-ohm resistors, this is not a limitation of the present invention, and in other embodiments other components that provide the desired electrical conductivity, with the appropriate size, may also be used.

Figure 34K:
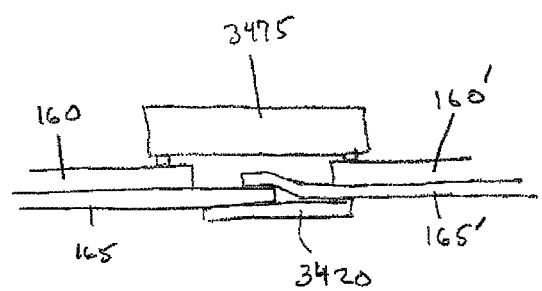

In some embodiments, one substrate 165 may overlap a second substrate 165', as shown in FIG. 34K. For example, substrates 165, 165' may have a thickness substantially equal to that of conductive traces 160, 160', both of which are relatively thinner than electrical connection member 3475. In this case there may be a small but acceptable tilt to electrical connection member 3475 as it spans the two substrates. In one example, substrates 165, 165 have a thickness of about 38 µm and conductive traces 160, 160' have a thickness of about 30 µm.

Figure 34L:
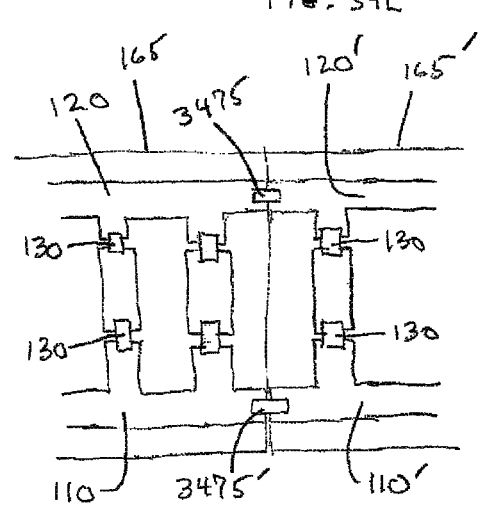
FIG. 34L is a schematic plan view of portions of lightsheets at least partially connected by joining elements in accordance with various embodiments of the invention.

FIG. 34L is a plan view of two lightsheets joined together as described herein. As shown, substrates 165, 165' are adjacent to each other, either butted up against each other or overlapped. Power conductors 110, 120 on substrate 165 are adjacent to power conductors 110', 120' on substrate 165', respectively, and power conductor 120 is electrically coupled to power conductor 120' through electrical connection member 3475, while power conductor 110 is electrically coupled to power conductor 110' through electrical connection member 3475'.

Figure 35:
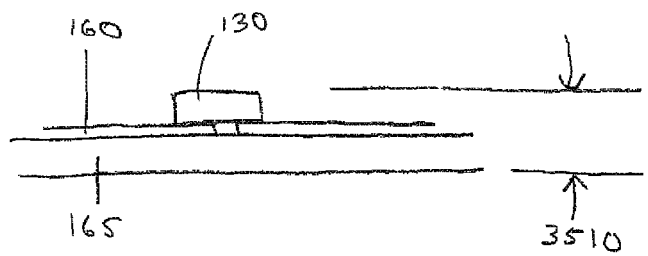
FIG. 35 is a schematic illustration of a lightsheet in accordance with various embodiments of the invention.

In some embodiments, as shown in FIG. 35, a total thickness 3510 of the lightsheet, including substrate 165, conductive traces 160, and light-emitting elements 130, is less than about 3 mm, less than about 2 mm, or even less than about 1 mm.

Figure 36:
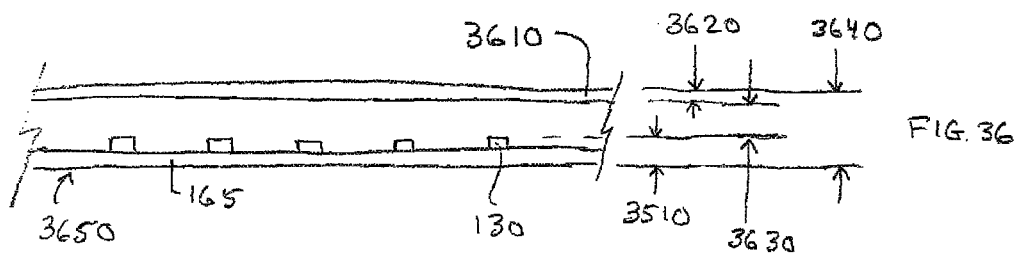
FIG. 36 is a schematic illustration of a lighting system in accordance with various embodiments of the invention.

FIG. 36 shows an embodiment of the present invention featuring a lightsheet 3650 including or consisting essentially of substrate 165 and LEEs 130 (conductive elements 160 are not shown for clarity) and an overlying optical element 3610. Lightsheet 3650 has a thickness 3510, optical element 3610 has a thickness 3620, and a gap 3630 between lightsheet 3650 and optical element 3610 contributes to an overall thickness 3640 of the system. In some embodiments, overall thickness 3640 may be less than about 40 mm, less than about 20 mm, less than about 15 mm, or even less than about 10 mm.

In general in the above discussion the arrays of semiconductor dies, light emitting elements, optics, and the like have been shown as square or rectangular arrays; however this is not a limitation of the present invention and in other embodiments these elements may be formed in other types of arrays, for example hexagonal, triangular or any arbitrary array. In some embodiments these elements may be grouped into different types of arrays on a single substrate.

The terms and expressions employed herein are used as terms and expressions of description and not of limitation, and there is no intention, in the use of such terms and expressions, of excluding any equivalents of the features shown and described or portions thereof. In addition, having described certain embodiments of the invention, it will be apparent to those of ordinary skill in the art that other embodiments incorporating the concepts disclosed herein may be used without departing from the spirit and scope of the invention. Accordingly, the described embodiments are to be considered in all respects as only illustrative and not restrictive.

What is claimed is:

1. A lighting system comprising:
    a lightsheet comprising:
        a substantially planar flexible substrate;
        disposed on the substrate, (i) first and second spaced-apart power conductors each extending in a first direction and (ii) a plurality of conductive traces;
        a plurality of light-emitting strings, each light-emitting string (i) comprising a plurality of interconnected light-emitting elements spaced along the light-emitting string, (ii) having a first end electrically coupled to the first power conductor, (iii) having a second end electrically coupled to the second power conductor, and (iv) being oriented in a second direction not parallel to the first direction, wherein the power conductors supply power to each of the light-emitting strings; and
        a plurality of control elements each (i) electrically connected to at least one light-emitting string and (ii) configured to utilize power supplied from the power conductors to control the current to the at least one light-emitting string to which it is electrically connected,
    wherein the lightsheet (a) has a thickness less than 2 mm, (b) has a weight per area of less than 1000 µm/m$^2$, and (c) is separable, via a cut spanning the first and second power conductors and not crossing a light-emitting string, into two partial lightsheets each comprising (i) one or more light-emitting strings, (ii) one or more control elements, and (iii) portions of the first and second power conductors configured to supply power to and thereby illuminate the one or more light-emitting strings of the partial lightsheet.

2. The lighting system of claim 1, wherein the weight per area of the lightsheet is less than 500 µm/m$^2$.

3. The lighting system of claim 1, wherein the weight per area of the lightsheet is less than 200 µm/m$^2$.

4. The lighting system of claim 1, wherein the weight per area of the lightsheet is less than 100 µm/m$^2$.

5. The lighting system of claim 1, wherein the weight per area of the lightsheet is less than 50 µm/m$^2$.

6. The lighting system of claim 1, wherein the thickness of the lightsheet is less than 1 mm.

7. The lighting system of claim 1, further comprising an optical element disposed above and spaced apart from the lightsheet, wherein a collective thickness of the optical element and the lightsheet is less than 40 mm.

8. The lighting system of claim 1, further comprising an optical element disposed above and spaced apart from the lightsheet, wherein a collective thickness of the optical element and the lightsheet is less than 20 mm.

9. The lighting system of claim 1, further comprising an optical element disposed above and spaced apart from the lightsheet, wherein a collective thickness of the optical element and the lightsheet is less than 10 mm.

10. The lighting system of claim 1, wherein the light-emitting elements in each of the light-emitting strings are separated by a substantially constant pitch.

11. The lighting system of claim 1, wherein at least one light-emitting element emits substantially white light.

12. The lighting system of claim 1, wherein at least one light-emitting element comprises a bare-die light-emitting diode.

13. The lighting system of claim 1, wherein at least one light-emitting element comprises a packaged light-emitting diode.

14. The lighting system of claim 1, further comprising, electrically connected to the power conductors, a power supply configured to provide a substantially constant voltage to the power conductors.

15. The lighting system of claim 1, wherein, in at least one light-emitting string, each light-emitting element is coupled to conductive traces on the substrate via a solder.

16. The lighting system of claim 15, wherein the solder comprises at least one of bismuth and indium.

17. The lighting system of claim 15, wherein the solder has a liquidus temperature less than 165° C.

18. The lighting system of claim 15, wherein the solder has a liquidus temperature less than 150° C.

19. The lighting system of claim 15, wherein the solder has a liquidus temperature less than 130° C.

20. The lighting system of claim 15, wherein the solder comprises 50% to 65% bismuth and 35% to 50% tin.

21. The lighting system of claim 20, wherein the solder comprises 0.25% to 3% silver.

22. The lighting system of claim 15, wherein the solder comprises 20% to 40% bismuth, 40% to 60% indium, and 8% to 25% tin.

23. The lighting system of claim 15, wherein the conductive traces comprise at least one of copper, brass, aluminum, silver, or gold.

24. The lighting system of claim 15, wherein (i) a thickness of the conductive traces is less than 50 µm, and (ii) the lightsheet comprises polyethylene terephthalate.

25. The lighting system of claim 1, further comprising a conductive joint electrically coupling two discrete regions of the lightsheet at a joint region, a flexibility of the lightsheet at the joint region being approximately equal to a flexibility of the lightsheet at a region spaced away from the joint region.

26. The lighting system of claim 25, wherein the conductive joint (i) comprises solder and (ii) electrically couples (a) portions of the first power conductor on each region of the lightsheet or (b) portions of the second power conductor on each region of the lightsheet.

27. The lighting system of claim 25, wherein the conductive joint is flexible.

28. The lighting system of claim 27, wherein the flexible conductive joint comprises at least one undulation therewithin.

29. A lighting system comprising:
a lightsheet comprising:
  a substantially planar flexible substrate (i) comprising polyethylene terephthalate and (ii) having a thickness less than 100 µm;
  disposed on the substrate, first and second spaced-apart power conductors each (i) extending in a first direction, (ii) comprising at least one of aluminum or copper, and (iii) having a thickness less than 50 µm;
  disposed on the substrate, a plurality of conductive traces each (i) comprising at least one of aluminum or copper, and (ii) having a thickness less than 50 µm;
  a plurality of light-emitting strings, each light-emitting string (i) comprising, spaced along the light-emitting string, a plurality of interconnected light-emitting diodes each emitting substantially white light, (ii) having a first end electrically coupled to the first power conductor, (iii) having a second end electrically coupled to the second power conductor, and (iv) being oriented in a second direction not parallel to the first direction, wherein the power conductors supply power to each of the light-emitting strings; and
  a plurality of control elements each (i) electrically connected to at least one light-emitting string and (ii) configured to utilize power supplied from the power conductors to control the current to the at least one light-emitting string to which it is electrically connected,
wherein the lightsheet (a) has a thickness less than 1.5 mm, (b) has a weight per area of less than 400 µm/m$^2$, and (c) is separable, via a cut spanning the first and second power conductors and not crossing a light-emitting string, into two partial lightsheets each comprising (i) one or more light-emitting strings, (ii) one or more control elements, and (iii) portions of the first and second power conductors configured to supply power to and thereby illuminate the one or more light-emitting strings of the partial lightsheet.

\* \* \* \* \*

UNITED STATES PATENT AND TRADEMARK OFFICE
CERTIFICATE OF CORRECTION

PATENT NO. : 8,704,448 B2  
APPLICATION NO. : 13/970027  
DATED : April 22, 2014  
INVENTOR(S) : Michael A. Tischler et al.

Page 1 of 1

It is certified that error appears in the above-identified patent and that said Letters Patent is hereby corrected as shown below:

In the Claims:

At column 52, claim number 1, line number 45, "1000 $\mu m/m^2$" should read: -- 1000 $gm/m^2$ --.

At column 52, claim number 2, line number 55, "500 $\mu m/m^2$" should read: -- 500 $gm/m^2$ --.

At column 52, claim number 3, line number 57, "200 $\mu m/m^2$" should read: -- 200 $gm/m^2$ --.

At column 52, claim number 4, line number 59, "100 $\mu m/m^2$" should read: -- 100 $gm/m^2$ --.

At column 52, claim number 5, line number 61, "50 $\mu m/m^2$" should read: -- 50 $gm/m^2$ --.

At column 54, claim number 29, line number 41, "400 $\mu m/m^2$" should read: -- 400 $gm/m^2$ --.

Signed and Sealed this  
Second Day of September, 2014

Michelle K. Lee  
*Deputy Director of the United States Patent and Trademark Office*